(12) United States Patent
Yanagi et al.

(10) Patent No.: US 8,816,426 B2
(45) Date of Patent: Aug. 26, 2014

(54) SEMICONDUCTOR STORAGE DEVICE AND MANUFACTURING METHOD THEREOF

(71) Applicant: Renesas Electronics Corporation, Kawasaki (JP)

(72) Inventors: Itaru Yanagi, Kunitachi (JP); Toshiyuki Mine, Fussa (JP); Hirotaka Hamamura, Kodaira (JP); Digh Hisamoto, Kokubunji (JP); Yasuhiro Shimamoto, Tokorozawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/845,005

(22) Filed: Mar. 17, 2013

(65) Prior Publication Data

US 2013/0234236 A1    Sep. 12, 2013

Related U.S. Application Data

(63) Continuation of application No. 11/965,391, filed on Dec. 27, 2007, now Pat. No. 8,410,543.

(30) Foreign Application Priority Data

Feb. 1, 2007    (JP) .................................. 2007-23301
Jun. 12, 2007   (JP) .................................. 2007-155472

(51) Int. Cl.
*H01L 29/792*    (2006.01)

(52) U.S. Cl.
USPC ........... 257/326; 257/407; 257/315; 257/316; 257/E29.134; 257/E29.152

(58) Field of Classification Search
CPC ..................... G11C 16/0466; H01L 21/28273; H01L 21/28282; H01L 27/105; H01L 27/115; H01L 27/11521; H01L 27/11526; H01L 27/11568; H01L 27/11573; H01L 27/42344; H01L 29/513; H01L 29/792; H01L 29/42344
USPC .......................... 257/407, E29.134, E29.152
See application file for complete search history.

(56) References Cited

U.S. PATENT DOCUMENTS 5,969,383 A    10/1999    Chang et al.
6,215,148 B1    4/2001    Eitan
(Continued)

FOREIGN PATENT DOCUMENTS

JP    2004-303918 A    10/2004

OTHER PUBLICATIONS

E. Lusky et al., "Retention Loss of Localized charged-trapping devices," IEEE 42$^{nd}$ Annual International Reliability Physics Symposium, 2004, pp. 527-530.

(Continued)

*Primary Examiner* — Matthew W Such
*Assistant Examiner* — David Spalla
(74) *Attorney, Agent, or Firm* — Miles & Stockbridge P.C.

(57) ABSTRACT

In a non-volatile memory, writing/erasing is performed by changing a total charge amount by injecting electrons and holes into a silicon nitride film, which serves as a charge accumulation layer. The gate electrode of a memory cell has a laminated structure made of a plurality of polysilicon films with different impurity concentrations. In a two-layered structure the gate electrode has a p-type polysilicon film with a low impurity concentration and a p$^+$-type polysilicon film with a high impurity concentration deposited thereon. Holes are injected into the charge accumulation layer from the gate electrode.

25 Claims, 55 Drawing Sheets

(56) References Cited

U.S. PATENT DOCUMENTS

| | | | |
|---|---|---|---|
| 6,222,251 | B1 | 4/2001 | Holloway |
| 6,477,084 | B1 | 11/2002 | Eitan |
| 6,906,390 | B2 * | 6/2005 | Nomoto et al. ............... 257/406 |
| 2003/0032242 | A1 | 2/2003 | Lee et al. |
| 2003/0042558 | A1 | 3/2003 | Noguchi et al. |
| 2004/0188753 | A1 | 9/2004 | Kawashima et al. |
| 2006/0228835 | A1 * | 10/2006 | Furukawa et al. ............ 438/149 |
| 2006/0273379 | A1 | 12/2006 | Bhalla et al. |
| 2007/0040208 | A1 * | 2/2007 | Hisamoto et al. ............ 257/314 |
| 2007/0102748 | A1 | 5/2007 | Tseng et al. |

OTHER PUBLICATIONS

H. Mizuta et al., "A New Triple-Well Resonant Tunneling Diode with Controllable Double-Negative Resistance," IEEE Transactions on Electron Devices, vol. 35, No. 11, Nov. 1988, pp. 1951-1956.

A. Agarwal et al., "Temperature Dependence of Fowler-Nordheim Current in 6H- and 4H-SiC MOS Capacitors," IEEE Electron Device Letters, vol. 18, No. 12, Dec. 1997, pp. 592-594.

Office Action issued Sep. 4, 2012 in Japanese Patent Application No. 2007-155472.

* cited by examiner

SELECTION TRANSISTOR   MEMORY TRANSISTOR

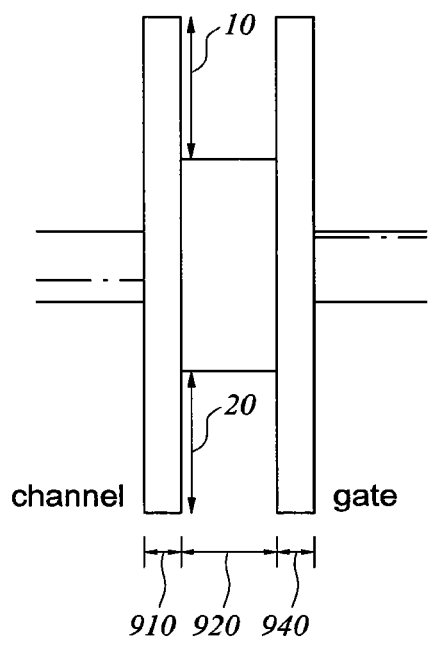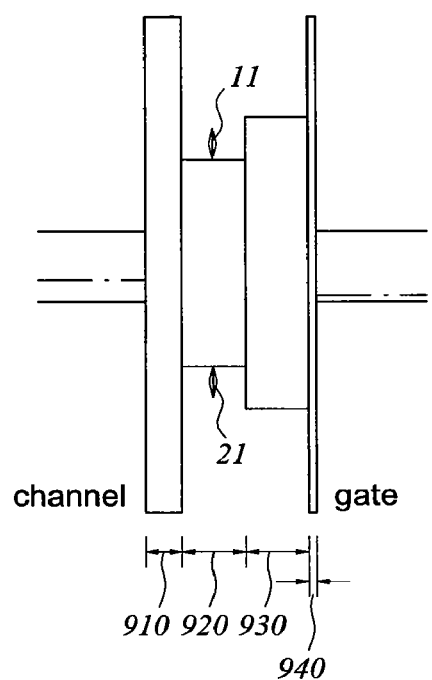

SEMICONDUCTOR STORAGE DEVICE AND MANUFACTURING METHOD THEREOF

CROSS-REFERENCE TO RELATED APPLICATION

The present application claims priority from Japanese Patent Applications No. JP 2007-023301 filed on Feb. 1, 2007, and No. JP 2007-155472 filed on Jun. 12, 2007, the contents of which are hereby incorporated by reference into this application.

TECHNICAL FIELD OF THE INVENTION

The present invention relates to a semiconductor storage device and a manufacturing method thereof and, in particular, to an effective technique applied to a semiconductor storage device including a non-volatile memory using hole injection from a gate electrode and hot electron injection from a semiconductor substrate as a carrier injection system.

BACKGROUND OF THE INVENTION

Currently, LSIs obtained by integrating semiconductor devices are used for controlling various systems to constitute infrastructures supporting society. Since an operation of a current LSI is based upon conduction of an arithmetic processing according to a program, in most cases, it is inevitable that a program is stored, so that a non-volatile memory which is one of semiconductor memories incorporated into the LSI becomes considerably important as a semiconductor device. When the LSI is used in various applications, programs are required for re-programming to handle the applications. So a rewritable non-volatile memory in which storage information is maintained even when a power source of the LSI is turned off is essential.

As a representative non-volatile memory, a so-called floating gate type memory and a memory having an insulating layer for a charge accumulation layer have been known. Especially, the latter memory where insulating films are stacked and charges are accumulated in interfaces therebetween or traps in the films is not required for formation of another electrically conductive layer that the floating gate type memory requires. Therefore, it is known that the memory can be formed in a CMOS-LSI process with a good consistency. Since both characteristics of retaining charges and rewriting can be achieved, an insulating film obtained by laminating a silicon nitride film and a silicon oxide film is widely used as the charge accumulation layer. A non-volatile memory including such a laminated insulating film is commonly known as MONOS (Metal-Oxide-Nitride-Oxide-Semiconductor) type memory.

As a representative example of the MONOS type memory, there is a two-transistor cell obtained by connecting a memory transistor and a selection transistor in series. The memory transistor performs injection/discharge of charges over a whole channel region by using a direct tunnel current and an F-N (Folwer-Nordheim) tunnel current generated by a bias applied between the channel and a gate electrode.

However, the above-mentioned MONOS type memory is required to have a sufficient charge retention characteristic while conducting injection/discharge of charges, and that causes various problems. For example, when a laminated insulating film is made thicker for securing the charge retention characteristic sufficiently for a practical use of the MONOS type memory, it becomes difficult to perform writing/erasing of data, so that a time period for writing/erasing exceeds a practical range.

On the other hand, a system in which rewriting of storage information is performed by injecting two electrically different charges (electrons and holes) as hot carriers instead of discharging charges has been proposed in U.S. Pat. No. 6,215,148 (Patent Document 1). The system is for performing a charge injection effectively even in a thick insulating film by injecting hot carriers. According to the system, electrons and holes can be alternately injected at a local place. Therefore, different charge injection states are produced at end portions of a planar type MOS transistor in a channel direction, namely, end portions of a source and a drain, so that they can be read as charge information.

A MONOS type memory using the above-mentioned hot carrier injection system adopts a device structure of a MOS transistor basically, and a gate insulating film is obtained by replacing an ordinary silicon oxide film with a three-layered insulating film made of a silicon oxide film, a silicon nitride film, and a silicon oxide film. As a method for configuring a memory array, it has been proposed that the formation of a source and a drain under a thick element isolation oxide film, and a source and a drain are formed in a line shape in an extending direction of a gate electrode to use them as wires. When focusing on one memory cell in respective memory arrays, in many cases, basic operations of the memory cell are similar, and are explained below.

A plan arrangement and a sectional structure of the above-mentioned MONOS type memory are shown in FIG. 1 and FIG. 2. In figures, a reference numeral 100 denotes a silicon substrate, 200 and 300 denote diffusion layers of a source and a drain, 910 and 940 denote silicon oxide films, 920 denotes a silicon nitride film, and 500 denotes a gate electrode made of a doped polysilicon film.

Writing operation, erasing operation, and reading operation of the above-mentioned MONOS type memory are explained with reference to FIG. 3, FIG. 4, FIG. 5, and FIG. 6.

As shown in FIG. 3, the gate electrode 500 (a word line WL) is applied with 15 V, the diffusion layer 200 (BL1) is applied with 0 V, and the diffusion layer 300 (BL2) is applied with 5 V at a writing time. Electrons accelerated by an electric field of a channel are put in a hot carrier state and are injected into a charge accumulation portion at an end portion of the diffusion layer 300 (BL2). This is known as an avalanche phenomenon and a substrate bias acceleration are used as a method for producing the hot carrier.

As shown in FIG. 4, the gate electrode 500 (word line WL) is applied with −6 V, the diffusion layer 200 (BL1) is applied with 0 V, and the diffusion layer 300 (BL2) is applied with 6 V at an erasing time. Holes are generated at the end portion of the diffusion layer 300 (BL2) by tunneling phenomenon between the bands and they are injected into the charge accumulation portion by acceleration caused by bias between the diffusion layer (BL2) and the substrate.

As shown in FIG. 5, by applying 3 V to the gate electrode 500 (word line WL), applying 1 V to the diffusion layer 200 (BL1), and applying 0 V to the diffusion layer 300 (BL2), an amount of channel current flowing in a direction of the arrow shown in FIG. 5 is read as accumulated charge information at a reading time. That is, a threshold is high when electrons have been injected at an end portion of the diffusion layer 300 (BL2) so that no channel current flows, but the threshold is low when holes have been injected at the end portion so that much channel current flows.

In the case of the above-mentioned MONOS type memory, the threshold is largely influenced by charges injected at an end portion of a diffusion layer serving as a source side at the reading time, but does not depend on a charge state of an end portion of the diffusion layer serving as a drain side so much. Therefore, one memory cell can be used as 2 bits by using the above-mentioned diffusion layer 200 and the diffusion layer 300 in an interchanging manner. FIG. 6 shows that that reading operation is performed by injecting electrons and holes into the diffusion layer 200 (BL1) and the diffusion layer 300 (BL2), respectively. Here, it is shown that the holes (shown by a white circle) and the electrons (shown by a black circle) are accumulated in the diffusion layer 200 (BL1) and in the diffusion layer 300 (BL2), respectively.

U.S. Pat. No. 5,969,383 (Patent Document 2) and U.S. Pat. No. 6,477,084 (Patent Document 3) disclose a memory cell called "split gate structure" as another example of the MONOS type memory. In the memory cell, two MOS transistors (a selection transistor and a memory transistor), basically each based upon an n-channel type MOS transistor, are coupled to each other in a state that the memory transistor is stacked in a vertical manner beside the selection transistor. An equivalent circuit of the memory cell is shown in FIG. 9. FIG. 7 and FIG. 8 are a plan view and a sectional view of the memory cell corresponding to the circuit shown in FIG. 9. In figures, reference numerals 210 and 310 denote n⁻ diffusion layers, 900 denotes a gate insulating film made of a silicon oxide film, 500 denotes a selector gate, 550 denotes a memory gate, and 960 denotes a side wall spacer made of a silicon oxide film.

Here, an operating method for the memory cell will be first explained, but a manufacturing method for the memory cell and the like will be later explained in detail by using embodiments thereof. A circuit configuration of a memory array using the memory cells is shown in FIG. 10. Respective gate electrodes (selector gate 500 and a memory gate 550) of the selection transistor and the memory transistor configure word lines indicated by SGL and MGL. The diffusion layer 300 of the selection transistor configures a bit line BL, and the diffusion layer 200 of the memory transistor configures a source line SL.

Representative writing/erasing operations of the above-mentioned memory cell are shown in FIG. 11 and FIG. 12. A gate insulating film 950 of the memory gate 550 has a MONOS structure that a silicon nitride film is interposed between two layers of silicon oxide films. A gate insulating film 900 of the selector gate 500 comprises a silicon oxide film. The diffusion layers 200 and 300 are formed by ion implantation of impurities using the selector gate 500 and the memory gate 550 as masks, respectively. As basic operations of the memory cell, there are four states of (1) writing, (2) erasing, (3) retaining, and (4) reading. However, the designations of the four states are used as typical ones, and the "writing" and the "erasing" can be called in an inversed manner. Although the operations are explained based on typical ones, it is considered that there are various different operations. Here, a memory cell configured by two n-channel type MOS transistors (a selection transistor and a memory transistor) will be described, but a memory cell configured by two p-channel type MOS transistors can also be similarly explained in principle.

(1) The writing operation is shown in FIG. 11. A positive potential is applied to the diffusion layer 200 on the memory gate 550 side and the same ground potential as that of a silicon substrate 100 is applied to the diffusion layer 300 on the selector gate 500 side. By applying a high gate overdrive voltage to the memory gate 550 with respect to the silicon substrate 100, a channel under the memory gate 550 is put in ON state. In this case, by setting the potential of the selector gate 500 to be higher than the threshold by about 0.1 V to 0.2 V, switching to ON state is conducted. At this time, since the most intense electric field occurs near a boundary between two gate electrodes (500, 550), many hot electrons are generated to be injected into a gate insulating film 950 on the memory gate 550 side. A reference numeral 800 shows generation of carries by impact ionization. The electrons and holes are shown by a white circle and a hatching black circle, respectively. This phenomenon is also known as source side injection (SSI).

A feature of a hot electron injection according to this system is that the injection is intensively performed on the end portion of the memory gate 550 on the selector gate 500 side because the electric field concentrates near the boundary between the selector gate 500 and the memory gate 550. In a floating gate type memory, a charge retention layer is made of an electrically conductive film. By contrast, in the insulating film type memory, electrons are accumulated in an insulating film, therefore, electrons are retained at an extremely small region.

(2) The erasing operation is shown in FIG. 12. By applying a negative potential to the memory gate 550 and applying a positive potential to the diffusion layer 200 on the memory gate 550 side, intense inversion occurs in an overlapping region of the memory gate 550 at the end portion of the diffusion layer 200 and the diffusion layer 200, so that tunnel phenomenon between the bands is caused, and hot holes 810 are produced. In the memory cell, the holes generated are accelerated toward the channel direction, and are attracted by bias of the memory gate 550 to be injected into the gate insulating film 950, so that the erasing operation is performed. It is shown that the holes generated produce secondary electron-hole pairs 820 in FIG. 12. These carriers are also injected into the gate insulating film 950. That is, the threshold of the memory gate 550 which has been increased due to charge of electrons is pulled down by charges of the holes injected.

(3) at the charge retaining time, the charge is retained as charge of carriers injected into the gate insulating film 950. Since movement of the carriers in the gate insulating film 950 is extremely small and slow, the charge is stably retained even if a voltage is not applied to the electrode.

(4) at the reading time, by applying a positive potential to the diffusion layer 300 on the selector gate 500 side and applying a positive potential to the selector gate 500, a channel under the selector gate 500 is turned ON. Here, by application of a proper memory gate potential (that is, an intermediate potential between the threshold in the writing state and the threshold in the erasing state) in which a difference between the thresholds of the memory gate 550 given by the writing/the erasing states can be discriminated, charge information retained is read as a current.

As described above, the feature of the carrier injection using hot carriers lies in that the injection can be performed efficiently even if an insulating film between the silicon substrate and the silicon nitride film which is the charge retention layer is thick. This is because energy of hot carriers is approximately equal to a barrier potential of the insulating film measured from a silicon band. However, injection of carriers in high energy state from the substrate side via the insulating film produces many defects on an interface between the channel of the substrate and the insulating film. So carriers are trapped in the defects at a reading time, so that failures at the reading time such as degradation or fluctuation of the threshold are caused.

Especially, since band offset of the silicon oxide film serving as the gate insulating film 900 directly existing on the channel with respect to silicon is higher to holes than to electrons, a hot hole injection requires higher energy holes than an electron energy in the hole electron injection. Therefore, when the hot hole injection is adopted, damage imparted to an interface between the channel and the insulating film becomes more severe than that in a case that the hot electron injection is adopted.

In such a hot carrier injection system such as a source side injection (SSI) and a band-to-band tunnel hot hole injection (BTBTHH injection), a carrier injection is performed at a local place, so that carriers injected into the charge accumulation layer (silicon nitride film) gradually diffuse over time, which causes fluctuation in the threshold and degradation of the charge retention characteristic.

These problems are caused by degradation of a channel interface due to an injection of holes from the substrate by using hot carriers. It is also thought that the problems are caused by a local injection of holes from a high electrical field position. Therefore, when the injection of holes is performed from the substrate, holes are required to be injected non-locally without using hot carriers while a film thickness assuring sufficient charge retention characteristic is ensured.

As a method of solving the problem, an injection of holes without using hot carriers is disclosed in 2004 International Reliability Symposium Proc. pp. 527-530 by E. Lusky et al (Non-Patent Document 1). In a conventional laminated gate insulating film structure using a silicon oxide film as a barrier layer, since a silicon oxide film formed between a silicon nitride film and a silicon substrate is thick, it is impossible to perform a tunnel injection of holes from a channel. Therefore, in Non-Patented Document 1, a laminated film made of a extremely thin silicon oxide film, an extremely thin silicon nitride film, and an extremely thin silicon oxide film is formed instead of the silicon oxide film, so that such holes can tunnel easily from the substrate side at an application of electric field.

However, since it is necessary to use the substrate side as a channel at a reading time, it is necessary to form the silicon oxide film thickly in order to maintain channel characteristic and suppress change in the threshold due to disturbance. In addition, since charges are moved through the barrier film at an injection time of holes, the holes pass through a channel interface, whereby degradation of an interface characteristic cannot be avoided. Further, it is thought that carries are trapped in the silicon nitride film in the laminated film made of the extremely thin silicon oxide film, the extremely thin silicon nitride film, and the extremely thin silicon oxide film during writing/erasing operations, so that fluctuation in the threshold due to release of trapped carriers can not be avoided.

As a non-local hole injection system which does not cause degradation of an interface, a non-local hole injection from a gate electrode is thought. However, since a valence band offset between silicon oxide and silicon is as high as 4.7 eV, it is difficult to conduct a hole injection from the gate electrode when an insulating film positioned under the gate electrode is a thick silicon oxide film.

As mentioned in Japanese Patent Application Laid-open Publication No. 2004-303918 (Patent Document 4), a system that holes are injected from a gate electrode side by applying a positive voltage to the gate electrode, in which a gate insulating film has a laminated film structure in which a silicon oxide film, a silicon nitride film, and a silicon oxynitride (SiON) film are formed successively from a substrate side, has been proposed.

A sectional view of the memory cell is shown in FIG. 16. A reference numeral 200 denotes a source, 300 denotes a drain, 901 denotes a silicon oxide film, 920 denotes a silicon nitride film, 930 denotes a silicon oxynitride film, and 500 denotes a gate electrode. A charge accumulation layer is the silicon nitride film 920. Electrons are hot-electron-injected from a substrate at a writing time, and holes are injected from the gate electrode at an erasing time. According to this system, by adopting the insulating film on the gate electrode 500 side made of silicon oxynitride (SiON) having a band gap smaller than that of silicon oxide and having a low barrier wall to holes, it is made possible to cause holes to F-N (Folwer-Nordheim)-tunnel by a small electric field at an erasing time.

Incidentally, as shown in FIG. 15, it is generally thought that an interface state between a polysilicon film configuring the gate electrode 500 and the silicon oxynitride film 930 is made excellent by interposing a thin silicon oxide film 940 with a thickness of about 1 nm between an interface of the gate electrode 500 and the silicon oxide nitride film 930. In this case, since the holes can directly tunnel from the gate electrode 500 through the thin silicon oxide film 940 with a thickness of about 1 nm, the thin silicon oxide film 940 is not a main factor for determining a transmittance at a hole injecting time. Main factors for determining an injection efficiency of the holes are a film thickness of the silicon oxynitride film 930 and a band offset to the holes thereof.

SUMMARY OF THE INVENTION

As seen from Patent Document 4, it is found that a hole injection from a gate electrode is effective when degradation of a channel interface should be suppressed in a non-local hole injection system.

In the above Patent Document 4, however, since the hole injection from the gate electrode is performed by injecting holes which are not hot carriers in a state of applying a positive voltage to the gate electrode, electrons are also injected from a substrate at an injection time of the holes from the gate electrode side. Especially, when a film thickness of an insulating film between the gate electrode and the charge accumulation layer is thick or when a barrier of the insulating film to the holes is high, an amount of electrons injected from the substrate is more than an injection amount of holes, which results in difficulty of injection of holes. Naturally, a hole injection which does not use hot carriers is inferior to that using hot carriers in injection efficiency, so that a rewriting speed of the former becomes slower than that of the latter.

In order to solve these problems and realize a hole injection from the gate electrode at a high efficiency, it is necessary to thin the insulating film between the gate electrode and the charge accumulation layer or to lower the valence band offset corresponding to the barrier to the holes in the gate electrode. However, lowering of the band offset of the insulating film and thinning the insulating film between the gate electrode and the charge accumulation layer deteriorate retention characteristics of electrons and holes trapped in the silicon nitride film.

An object of the present invention is to provide a non-volatile semiconductor storage device which can perform a non-local hole injection from a gate electrode at a high efficiency while maintaining a thickness and a band offset of an insulating film under the gate electrode to secure a sufficient charge retention characteristic.

The above and the other objects and a novel feature of the present invention will become apparent from the description of the present specification and the accompanying drawings.

Representative ones of the inventions disclosed in the present application will be briefly explained below.

(1) A semiconductor storage device according to an embodiment of the present application comprises a non-volatile memory having an insulating gate type field-effect transistor causing electric field effect to a surface of a semiconductor substrate from a gate electrode via a gate insulating film formed on a main surface of the semiconductor substrate, the gate insulating film including a first insulating film configuring a charge retention layer, a second insulating film formed between the first insulating film and the semiconductor substrate, and a third insulating film formed between the first insulating film and the gate electrode, and the non-volatile memory using, as retention charges for information storage, holes injected into the charge retention layer from the gate electrode via the third insulating film and electrons injected into the charge retention layer from the semiconductor substrate via the second insulating film at a time of applying a positive voltage to the gate electrode, wherein the gate electrode includes a first silicon layer formed to be in contact with the gate insulating film and a second silicon layer formed to be separated from the gate insulating film via the first silicon layer and doped with an impurity with a concentration higher than that of the first silicon layer.

(2) A semiconductor storage device according to another embodiment of the present application comprises a non-volatile memory having an insulating gate type field-effect transistor causing electric field effect to a surface of a semiconductor substrate from a gate electrode via a gate insulating film formed on a main surface of the semiconductor substrate, the gate insulating film including a first insulating film configuring a charge retention layer, a second insulating film formed between the first insulating film and the semiconductor substrate, and a third insulating film formed between the first insulating film and the gate electrode, and the non-volatile memory using, as retention charges for information storage, holes injected into the charge retention layer from the gate electrode via the third insulating film and electrons injected into the charge retention layer from the semiconductor substrate via the second insulating film at a time of applying a positive voltage to the gate electrode, wherein the gate electrode is configured of a Group III-V compound semiconductor film.

(3) In a manufacturing method for a semiconductor storage device, according to still another embodiment of the present application, the semiconductor device comprises a non-volatile memory having an insulating gate type field-effect transistor causing electric field effect to a surface of a semiconductor substrate from a gate electrode via a gate insulating film formed on a main surface of the semiconductor substrate, the gate insulating film including a first insulating film configuring a charge retention layer, a second insulating film formed between the first insulating film and the semiconductor substrate, and a third insulating film formed between the first insulating film and the gate electrode, and the non-volatile memory using, as retention charges for information storage, holes injected into the charge retention layer from the gate electrode via the third insulating film and electrons injected into the charge retention layer from the semiconductor substrate via the second insulating film at a time of applying a positive voltage to the gate electrode, wherein, when a level is formed on an interface between the gate electrode and the third insulating film, whereby a positive voltage is applied to the gate electrode, a barrier potential wall of the third insulating film to the holes in the gate electrode is smaller than a valence band offset occurring when the third insulating film and a silicon layer are joined to each other.

Effects obtained by the representative ones of the inventions disclosed in the present application will be briefly explained below.

A non-volatile semiconductor storage device which can perform a non-local hole injection from a gate electrode at a high efficiency while maintaining a thickness and a band offset of an insulating film under the gate electrode to secure a sufficient charge retention characteristic can be realized.

BRIEF DESCRIPTIONS OF THE DRAWINGS

FIG. 18A is a band diagram of a gate insulating film comprising a three-layered insulating film;

FIG. 18B is a band diagram of a gate insulating film comprising a four-layered insulating film according to the first embodiment;

DESCRIPTIONS OF THE PREFERRED EMBODIMENTS

Figure 1:
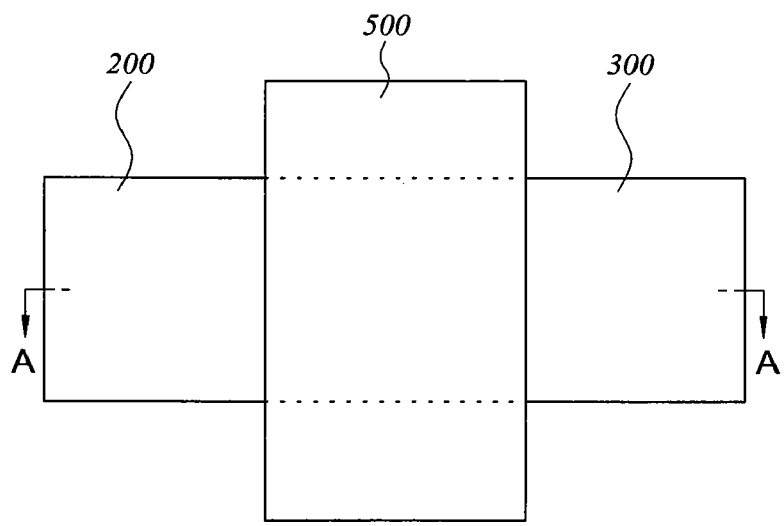
FIG. 1 is a plan view of a MONOS type memory adopting a hot carrier injection system.
Figure 2:
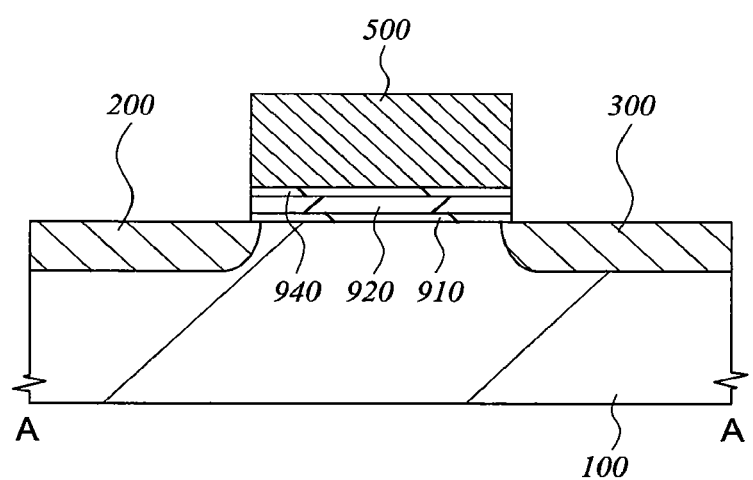
FIG. 2 is a sectional view of the MONOS type memory adopting a hot carrier injection system.
Figure 3:
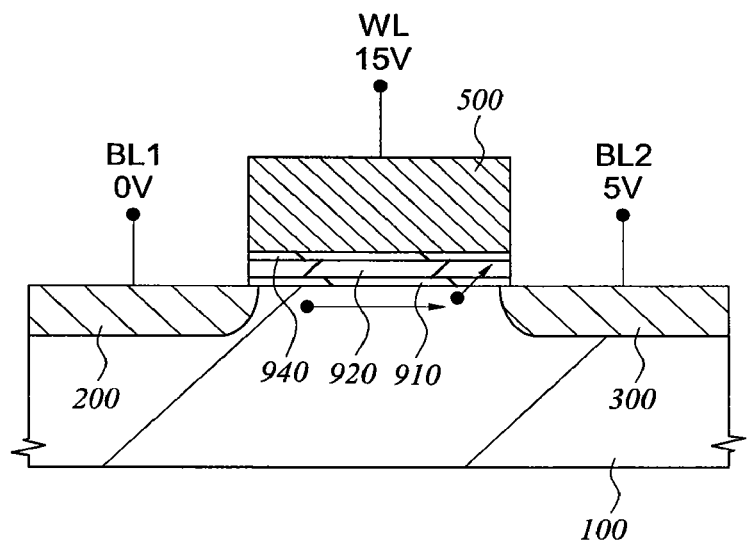
FIG. 3 is an explanatory sectional view of a writing operation of the MONOS type memory adopting a hot carrier injection system.
Figure 4:
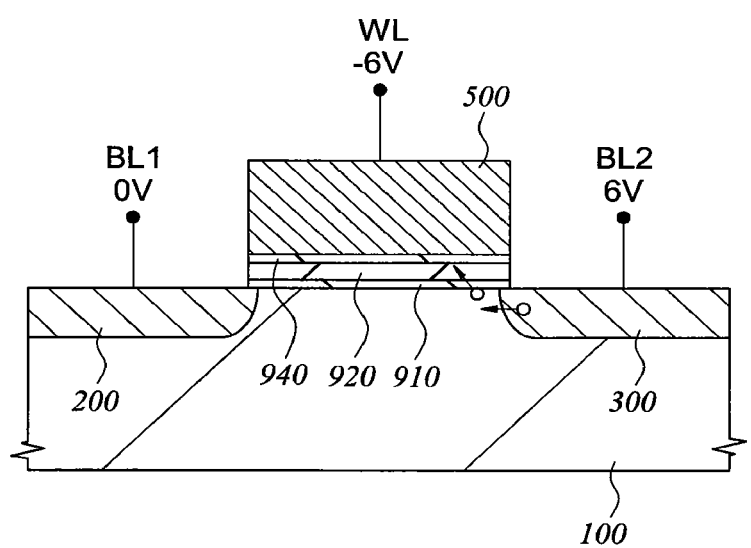
FIG. 4 is an explanatory sectional view of an erasing operation of the MONOS type memory adopting a hot carrier injection system.
Figure 5:
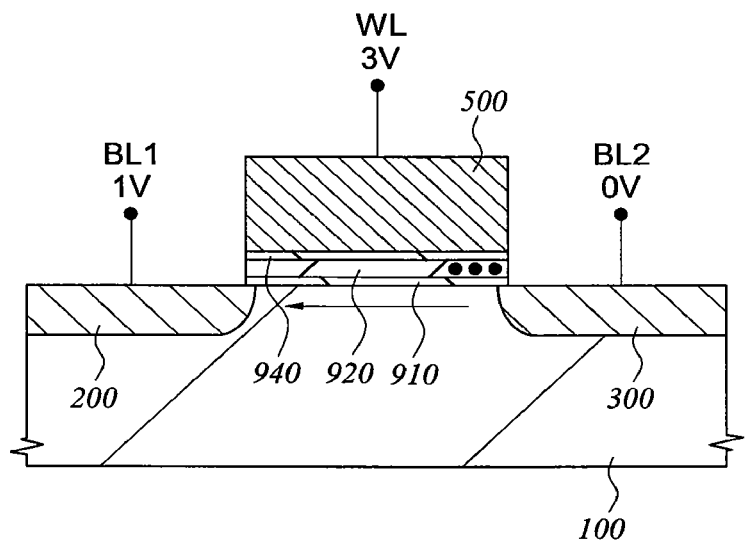
FIG. 5 is an explanatory sectional view of a reading operation of the MONOS type memory adopting a hot carrier injection system.
Figure 6:
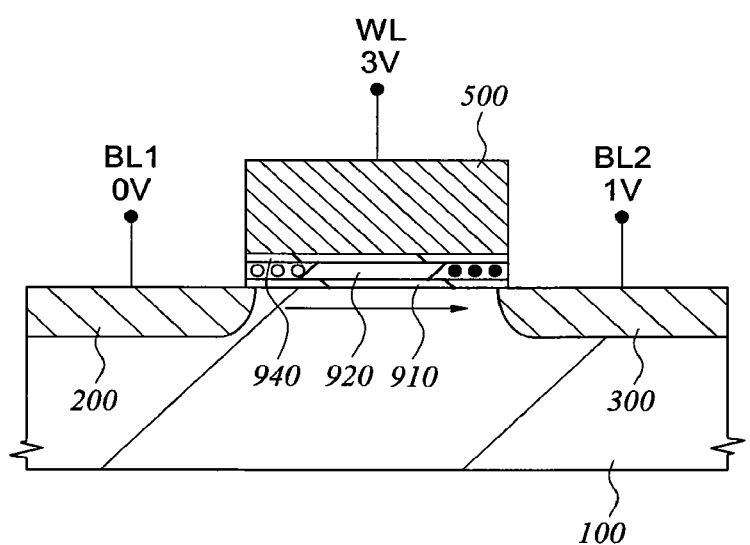
FIG. 6 is an explanatory sectional view of a reading operation of a MONOS type memory using one memory cell as two bits.

Hereinafter, Embodiments of the present invention will be explained in detail with reference to the drawings. Incidentally, same members are attached with same reference numerals in principle throughout all figures for explaining embodiments and repetitive explanation is omitted.

The drawings are illustrative, and a relationship between thicknesses and sizes in plan views, ratio of thicknesses of respective layers, and the like should be determined based upon the following explanation.

The following embodiments are for describing a device and a method for embodying the technical idea of the present invention, and the technical idea of the present invention is not for specifying materials, formations, structures, arrangements, operation voltages or the like of component parts as mentioned in the embodiments.

First Embodiment

A high efficiency hole injection from a gate electrode side which is a feature of the present invention can be understood from an one-dimensional band structure in a direction perpendicular to a substrate. Then, a memory cell having the same device structure as that of an ordinary MOS transistor will be explained as a representative example. Thereafter, an electron injection method is examined and a case that the electron injection method is applied to a memory cell structure suitable for high-speed operation is explained. For the memory cell structures, an optimal structure according to applications of a memory can be selected.

Manufacturing steps of a memory cell of the present embodiment will be explained with reference to FIG. 13 to FIG. 15, and FIG. 17. The figures correspond to a section A-A of a plan layout shown in FIG. 1, where explanations are made using a process technique corresponding to the so-called 0.13 µm generation.

Figure 13:
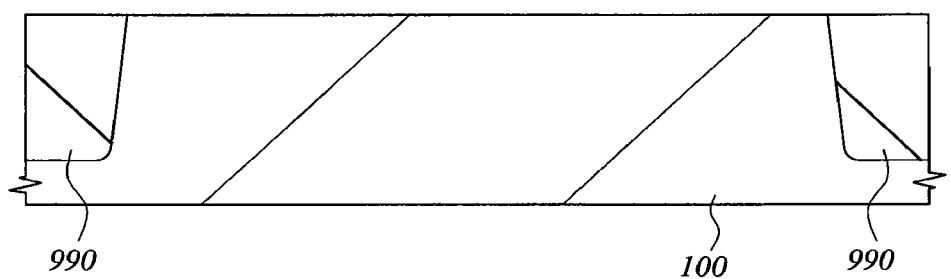
FIG. 13 is a sectional view showing a manufacturing step for a memory cell according to a first embodiment.

As shown in FIG. 13, a device isolation region 990 is formed on a main surface of a p-type silicon substrate 100 by using a known Shallow Trench Isolation (STI) process. A p-type well region (not shown) having an impurity concentration of $10^{17}$ atom/cm$^3$ on a substrate surface is formed by performing ion implantation of boron and an activation anneal process.

Figure 14:
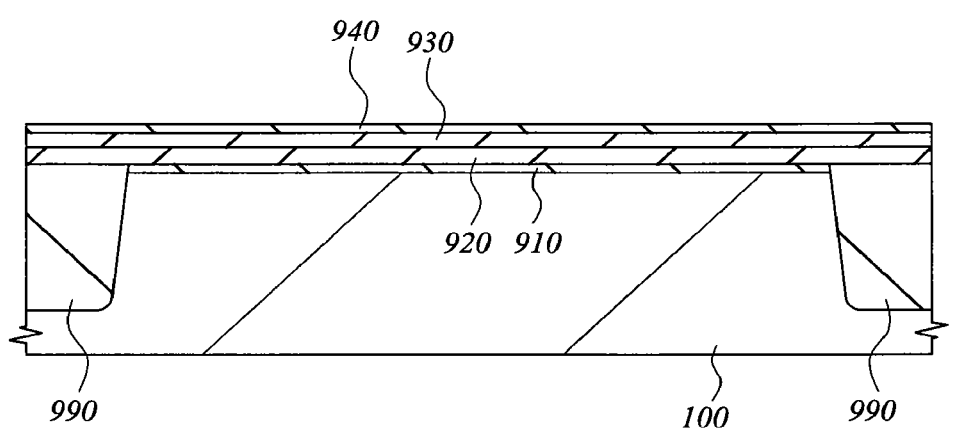
FIG. 14 is a sectional view showing a manufacturing step for a memory cell continued from FIG. 13.

Next, as shown in FIG. 14, after a silicon oxide film 910 with a film thickness of 4 nm is formed by thermally oxidizing a surface of the substrate, a silicon nitride film 920 with a film thickness of 6 nm and a silicon oxynitride film 930 with a film thickness of 5 nm are sequentially deposited on an upper portion of the silicon oxide film 910 by using CVD (chemical vapor deposition) process. $SiH_2Cl_2+NH_3$ is used as material gas for the deposition of the silicon nitride film 920 performed by the CVD process. Subsequently, the silicon oxynitride film 930 is formed by adding oxidant ($N_2O$) into the material gas and restricting a flow rate of $NH_3$. The silicon oxynitride film 930 has such a feature that its band gap is larger than that of the silicon nitride film 920. Here, a composition ratio of oxygen and nitrogen in the silicon oxynitride film 930 is set to 1:1.

Next, a thin silicon oxide film 940 with a film thickness of about 1 nm is formed on the silicon oxynitride film 930. Such an extremely thin silicon oxide film 940 can be formed by ISSG (In-Situ Steam Generation)-oxidizing a surface of the silicon oxynitride film 930. A film thickness of the silicon oxynitride film 930 is determined by considering reduction of the film thickness of the silicon oxide film 940. An insulating film with four layers configuring the gate insulating film can be obtained through the steps described above.

Figure 15:
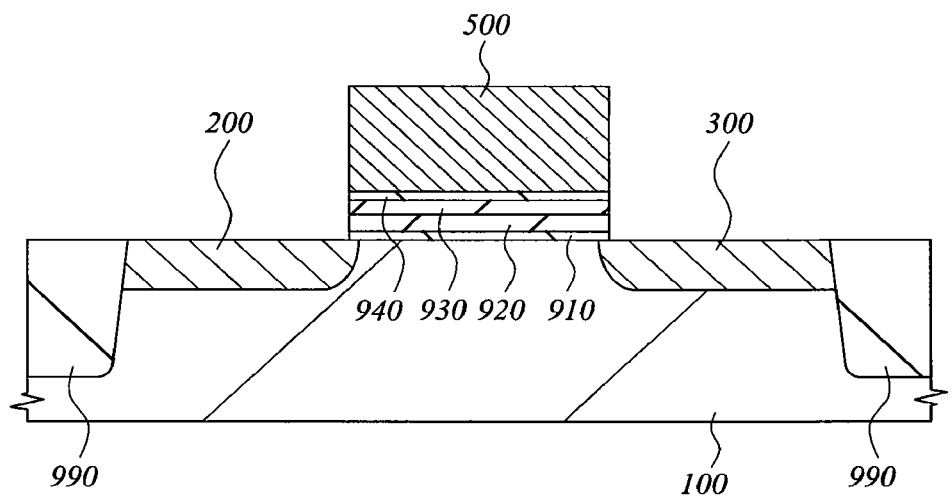
FIG. 15 is a sectional view of a MONOS type memory in which holes are injected from a gate electrode side.
Figure 16:
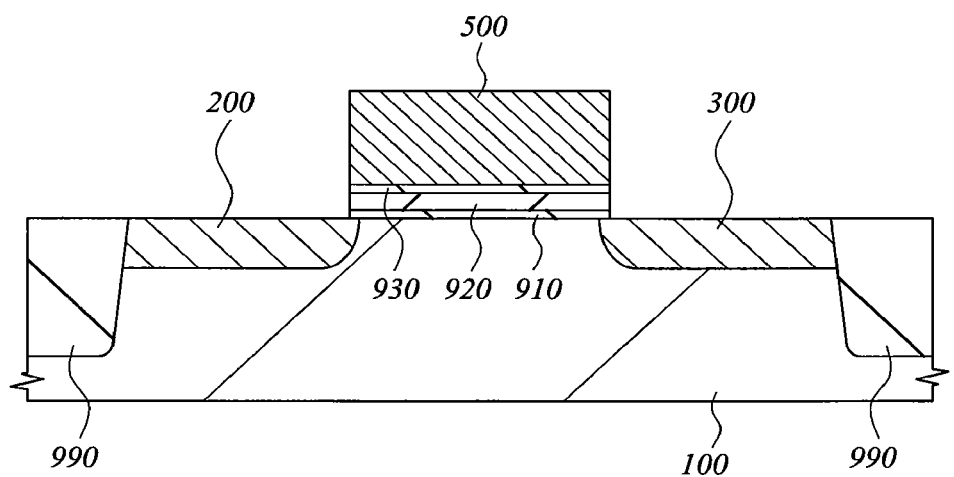
FIG. 16 is a sectional view of the MONOS type memory in which holes are injected from a gate electrode side.

Next, as shown in FIG. 15, after a doped polysilicon film is deposited on an upper portion of the silicon oxide film 940 by CVD process, a gate electrode 500 and a gate insulating film are formed by dry-etching the doped polysilicon film and the insulating film with four layers. In the memory cell according to the present embodiment, the doped polysilicon film configuring the gate electrode 500 has a laminated structure comprising a plurality of polysilicon films with different impurity concentrations in order to perform a hole injection from the gate electrode 500 at a high efficiency. Specifically, a two-layered film comprising an n-type polysilicon film with a low impurity concentration and a $p^+$-type polysilicon film with a high impurity concentration deposited on the upper portion thereof, a two-layered film comprising a p-type polysilicon film with a low impurity concentration and a $p^+$-type polysilicon film with a high impurity concentration deposited on the upper portion thereof, a two-layered film comprising a non-doped polysilicon film and a $p^+$-type polysilicon film with a high impurity concentration deposited on the upper portion thereof, or the like can be adopted. A method of forming a gate electrode 500 with such a laminated structure will be explained in detail later.

Next, after arsenic is ion-implanted into a surface of the substrate, diffusion layers 200 and 300 serving as a source and a drain of the memory cell are formed by thermally treating the substrate to activate the arsenic. The implantation energy for the arsenic here is set to 40 keV and a dose amount of the arsenic is set to $2 \times 10^{15}$ atom/cm$^2$. Thermal treatment conditions are set to 950° C. and 60 seconds.

Figure 17:
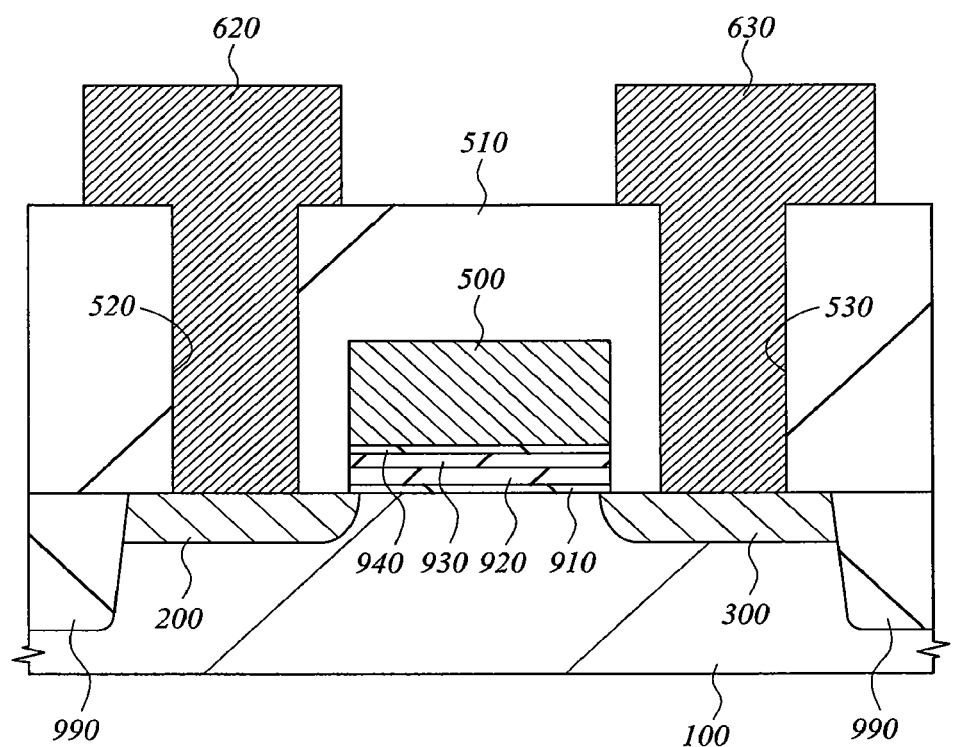
FIG. 17 is a sectional view showing a manufacturing step for the memory cell according to the first embodiment.

Next, as shown in FIG. 17, after connection holes 520 and 530 are formed in a thick interlayer insulating film 510 deposited on the substrate, a wire 620 and a wire 630 are electrically connected to the diffusion layer 200 and the diffusion layer 300 through the connection holes 520 and 530 by forming the wires 620 and 630 on the interlayer insulating film 510, respectively. Thereafter, upper portion wires are formed on upper layers of the wires 620 and 630, but the explanation of which is omitted. Incidentally, the wires 620 and 630 have been here formed on the interlayer insulating film 510, but the diffusion layers 200 and 300 may be formed in a line shape in an extending direction of the gate electrode 500 to be utilized as wires. One of the diffusion layers 200 and 300 may be shared by memory cells adjacent to each other in a channel direction.

FIG. 18B shows a band structure of a gate insulating film comprising the above-mentioned insulating film with four layers (the silicon oxide film 910, the silicon nitride film 920, the extremely thin silicon oxynitride film 930, and the silicon oxide film 940). FIG. 18A shows a band structure of a gate insulating film comprising an insulating film with three layers (the silicon oxide film 910, the silicon nitride film 920, and the silicon oxide film 940) used in the conventional MONOS type memory. In both the gate insulating films, the silicon nitride film 920 trapping charges mainly becomes a charge accumulation layer.

In the above-mentioned gate insulating film comprising the insulating film with three layers, a band offset 10 to electrons and a band offset 20 to holes between the silicon oxide film 910 or 940 and the silicon nitride film 920 are respectively mentioned as 1.1 eV and 2.9 eV (Applied Physics, Volume 70, No. 9, 2001, p. 1050). On the other hand, in the gate insulating film of the present embodiment, offset barriers between the silicon oxynitride film 930 and the charge accumulation layer (the silicon nitride film 920) are 0.5 eV to electron 11 and 0.8 eV to hole 21.

In the memory cell of the present embodiment, the reason why the gate insulating film is made to have a structure with four layers of the silicon oxide film 910, the silicon nitride film 920, the silicon oxynitride film 930, and the silicon oxide film 940 is because the silicon oxynitride film 930 has an offset barrier to holes in the gate electrode 500 lower than that of the silicon oxide film and a hole injection from the gate electrode 500 becomes easy as compared with the conventional MONOS type memory. Naturally, similar effect can be obtained when the above-mentioned gate insulating film with a four-layered structure is applied to the conventional MONOS type memory.

Writing/erasing of the memory cell is performed by injecting electrons and holes into the silicon nitride film 920 configuring the charge accumulation layer to change a total charge amount. Incidentally, naming of writing and erasing depends on a system and it does not depend on a basic operation of a memory cell. Therefore, the writing/erasing is herein explained as an injection method of electrons and holes.

Injection of electrons is performed by bringing hot electrons generated in a substrate into the silicon nitride film 920. When the conventional hot electron injection is used, a steep electric field slope is provided to a current path between the source and the drain, for example, by applying 0 V to the source, applying 5 V to the drain, and applying 10 V to the gate electrode 500, and hot carriers generated in the current path are brought into the gate electrode 500 side and are injected into the silicon nitride film 920. In the following embodiments, the electron injection means the hot electron injection from the substrate, unless otherwise instructed.

Figure 19:
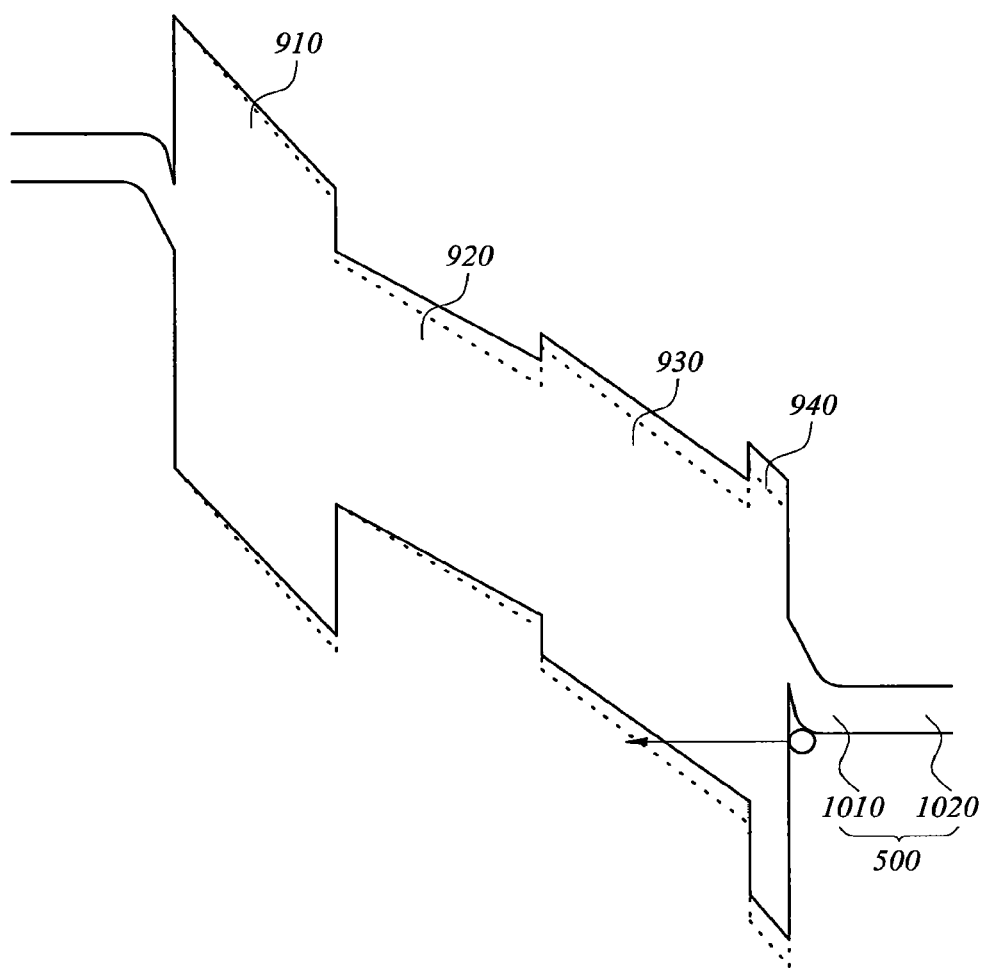
FIG. 19 is a band diagram of a gate insulating film when a positive voltage is applied to a gate electrode of the memory cell of the first embodiment.

On the other hand, when holes are injected from the gate electrode 500 into the silicon nitride film 920, a positive potential (for example, 10 V) is applied to the gate electrode 500, so that holes generated at the gate electrode 500 are caused to pass through the silicon oxynitride film 930 by F-N (Folwer-Nordheim) tunnel effect (FIG. 19). For example, it is necessary to set the voltages of both the source and the drain to 0 V so as not to generate hot electrons from the substrate at the time of the hole injection. Incidentally, in FIG. 19, a solid line shows the band diagram of the memory cell according to the present embodiment and a dotted line shows the band diagram of a conventional memory cell having a conventional single layer polysilicon gate. Explanation about FIG. 19 will be made in detail later. The silicon oxide film 940 on the silicon oxynitride film 930 is mainly for making a stable interface with the polysilicon film configuring the gate electrode 500 but a film thickness thereof is as extremely thin as about 1 nm, so that holes directly pass through the silicon oxide film 940 by the tunnel phenomenon. Therefore, the silicon oxide film 940 is not a main factor for determining the hole transmission at the injection time.

The main factor for determining the hole transmission at the injection time is the silicon oxynitride film 930. Since the silicon oxynitride film 930 has a smaller band gap than that of the silicon oxide film, the silicon oxynitride film 930 has a higher injection efficiency of holes due to the smaller gap. The injection efficiency of holes becomes higher as the film thickness of the silicon oxynitride film 930 is reduced. However, as described above, thinning of the silicon oxynitride film 930 and lowering of the band offset of the silicon oxynitride film 930 with respect to the charge accumulation layer deteriorate the charge retention characteristic. On the other hand, thickening of the silicon oxynitride film 930 and improving of the band offset deteriorate the efficiency of the hole injection from the gate electrode 500, and cause the electron injection amount from the substrate to be main injected carriers, whereby holes cannot be accumulated.

As described above, in the present embodiment, the gate electrode 500 is made of a two-layered film of an n-type polysilicon film with a low impurity concentration and a $p^+$-type polysilicon film with a high impurity concentration deposited on the upper portion thereof, or a two-layered film of a p-type polysilicon film with a low impurity concentration and a $p^+$-type polysilicon film with a high impurity concentration deposited on the upper portion thereof, or a two-layered film of a non-doped polysilicon film and a $p^+$-type polysilicon film with a high impurity concentration deposited on the upper portion thereof, or the like. Therefore, the hole injection from the gate electrode 500 is performed at a high efficiency.

A solid line in FIG. 19 shows a band diagram of a gate insulating film when a positive voltage is applied to the gate electrode 500 to inject holes from the gate electrode 500. A reference numeral 1010 denotes an n-type polysilicon film with a low impurity concentration, or a p-type polysilicon film with a low impurity concentration, or a non-doped polysilicon film, and a reference numeral 1020 denotes a $p^+$-type polysilicon film with a high impurity concentration. On the other hand, a broken line in FIG. 19 shows a band diagram when the gate electrode is made of a p-type polysilicon single layer film with an even impurity concentration.

As shown in FIG. 19, by configuring the gate electrode 500 with two polysilicon layers (1010, 1020), the polysilicon film 1010 (the n-type polysilicon film with a low impurity concentration, or the p-type polysilicon film with a low impurity concentration, or the non-doped polysilicon film) can be depleted excellently when a positive voltage is applied to the gate electrode 500 at a time of hole injection. This is the same principle that, in p-n junction, a depletion layer in a lower impurity concentration layer becomes long while one with a higher impurity concentration becomes short. Thus, by depleting the polysilicon film near the interface with the gate insulating film, quantum levels can be formed near the interface.

Figure 20:
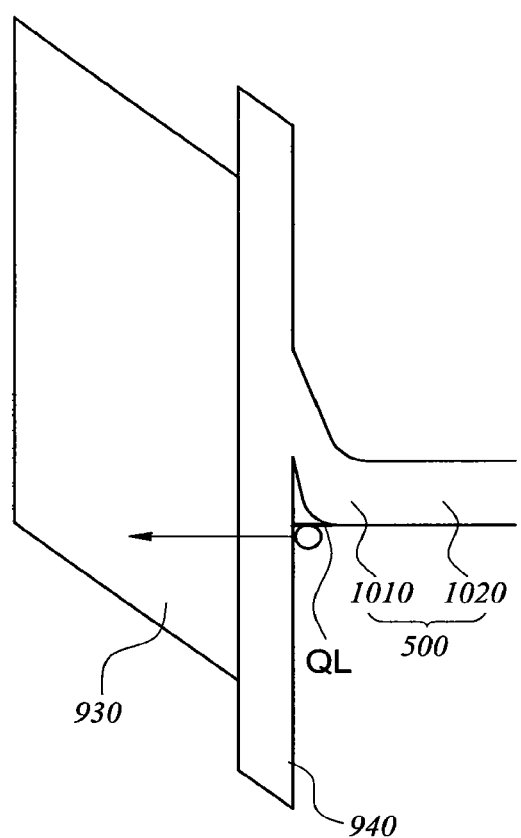
FIG. 20 is a band diagram showing an enlarged part of the gate insulating film shown in FIG. 19.

FIG. 20 shows an enlarged band diagram of the vicinity of the above-mentioned interface. A quantum level (QL) in FIG. 20 shows a ground state of a triangle-well produced at the interface. That is, the holes are raised energetically by the energy of the ground state, so the energetic heights of the silicon oxynitride film 930 and the silicon oxide film 940 appear lower by the raised energy. Therefore, the holes can be injected at a higher efficiency as compared with the gate electrode made up of a polysilicon single layer film. Though the energy of the holes in the gate electrode 500 varies depending on the film thickness of the polysilicon film 1010 and the gate voltage, it is raised by about 0.5 to 0.8 eV by formation of the quantum level (QL) due to the depletion under such a situation that the thickness of the polysilicon film 1010 is 5 nm or less and the gate electrode voltage is in a range of about 8 to 13 V.

Regarding the n-type or the p-type polysilicon film 1010 with a low impurity concentration, it is ideally desirable that the impurity concentration is lower. On the contrary, regarding the $p^+$-type polysilicon film 1020 with a high impurity concentration, since a voltage can be applied to the polysilicon film 1010 more efficiently as the impurity concentration becomes higher, the injection efficiency of holes is increased. It is desirable that the impurity concentration of the polysilicon film 1010 is $10^{17}$ atom/cm$^3$ or less, and it is desirable that the impurity concentration of the polysilicon film 1020 is $10^{19}$ atom/cm$^3$ or more.

Figure 21:
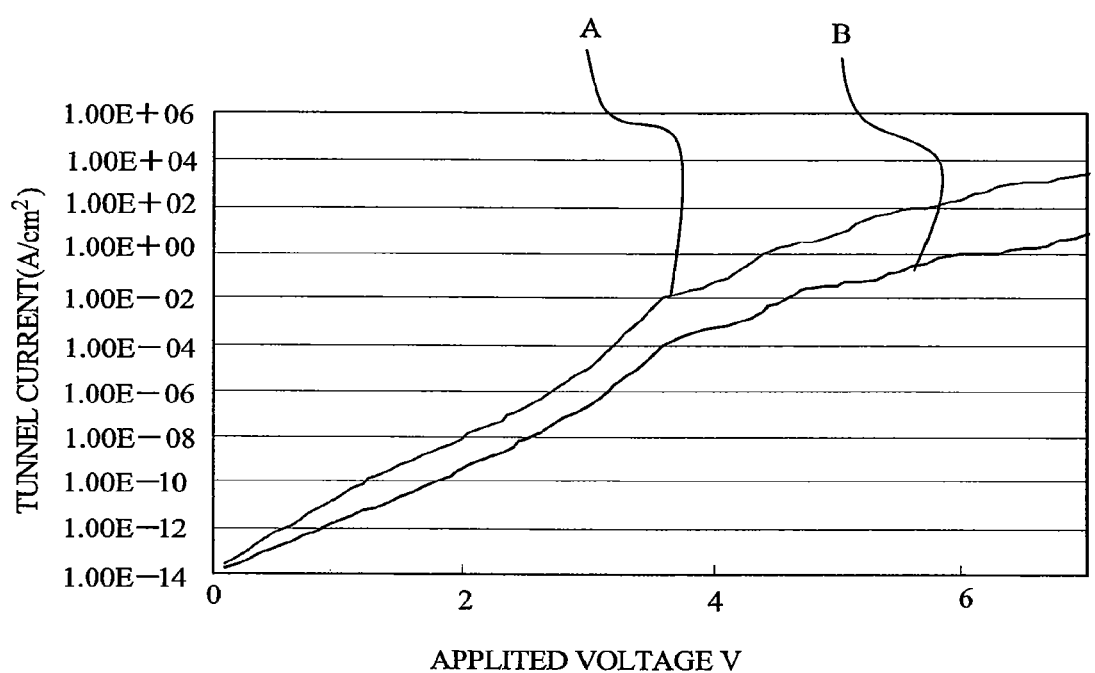
FIG. 21 is a graph showing results of simulation of hole tunnel currents flowing from the gate electrode when a positive voltage is applied to the gate electrode of the memory cell of the first embodiment.
Figure 22:
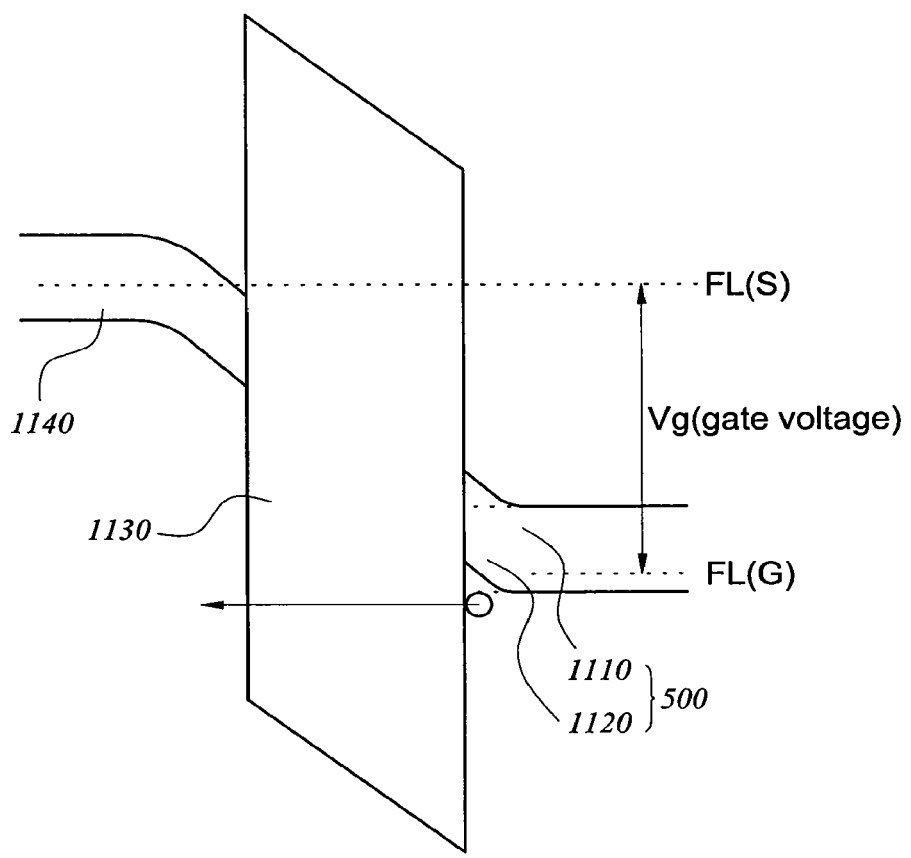
FIG. 22 is a band diagram set for calculating Curve A in FIG. 21.

FIG. 21 is a graph showing the result of a simulation of a hole tunnel current flowing from the gate electrode 500 when a positive voltage is applied to the gate electrode 500 like the band diagram shown in FIG. 22, and in addition, the formation of the quantum level (QL) is taken into consideration. The polysilicon film 1120 in FIG. 22 is a non-doped silicon film with a film thickness of 2 nm, and the polysilicon film 1110 is a $p^+$-type polysilicon film having an impurity concentration of $5 \times 10^{20}$ atom/cm$^3$ or more. It is assumed that the silicon oxynitride film 1130 has a valence band offset to silicon of 2.8 eV, a relative dielectric constant of 6.1, and a film thickness of 6 nm. A reference numeral 1140 denotes a p-type silicon substrate, FL(S) denotes a Fermi level of the silicon substrate, and FL (G) denotes Fermi level of the gate electrode, respectively. A curve "A" in FIG. 21 shows a calculation result obtained from this case.

Figure 23:
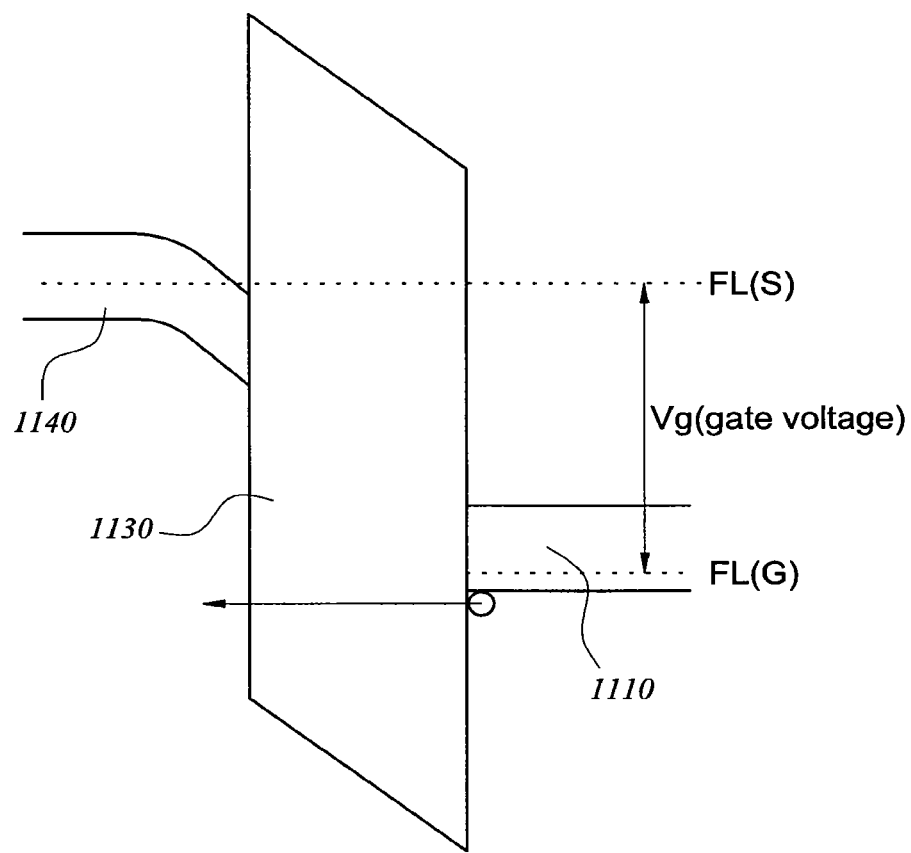
FIG. 23 is a band diagram set for calculating Curve B in FIG. 21.

On the other hand, a curve "B" in FIG. 21 shows a similar calculation result when a $p^+$-type polysilicon single layer film (1110) with a high impurity concentration as shown in FIG. 23 is used in the gate electrode. In the simulation of the tunnel current, Transfer-Matrix method (for example, HIROSHI MIZUTA, et al., IEEE TRANSACTION OF ELECTRON DEVICES, VOL 35, NO. 11, NOVEMBER 1988) well-known as a numerical computing technique was used.

From the above-mentioned simulation result, when the curve "A" and the curve "B" are compared with each other, it is understood that when a gate electrode with a two-layered polysilicon structure is adopted (curve "A"), a hole tunnel current is improved about ten times even during the application of a low voltage of about 2 V. It is also understood improvement of a tunnel current effect up to about 1000 times can be obtained according to increasing the gate voltage. This means that the hole injection time can be reduced up to about 1/10 to 1/1000. From the estimation based upon the simulation, it is found that the film thickness is 6 nm or less so that an effect of the high efficiency hole injection due to the quantum level can be obtained clearly.

Figure 24:
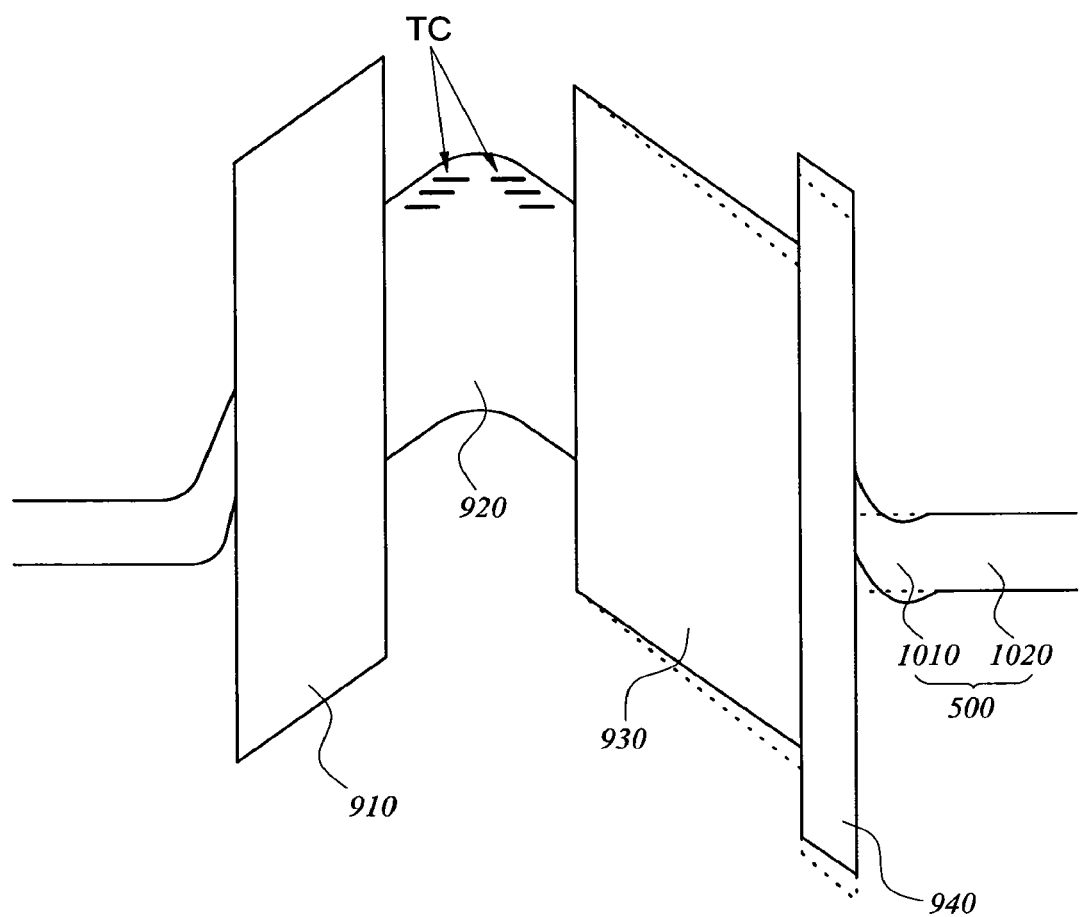
FIG. 24 is a band diagram of the gate insulating film of the memory cell of the first embodiment at a charge retention time.

The depletion in the gate electrode 500 can achieve such an effect that the carrier retention characteristic is improved. FIG. 24 shows a band diagram of a gate insulating film with a four-layered structure at a charge retention time. In FIG. 24, a solid line shows use of the above-mentioned gate electrode with the two-layered polysilicon structure, and a broken line shows use of a gate electrode with a p-type polysilicon single layer structure. As compared with the p-type polysilicon single layer structure in which the gate electrode is not depleted, in the two-layered polysilicon structure, an electric field produced by trap charges (TC) is applied to the depletion layer owing to the effect of the depletion. Therefore, electric fields applied to the silicon oxynitride film 930 and the silicon oxide film 940 are reduced, so that electrons are not easy to disappear. That is, the charge retention characteristic is improved. Such a fact can be similarly happen at the hole retention time.

Next, a manufacturing method of the gate electrode 500 having a two-layered polysilicon structure will be explained with reference to FIG. 25 to FIG. 28. This manufacturing method is one example of manufacturing methods in view of easy method of making the gate electrode 500, and it does not limit the present invention.

Figure 25:
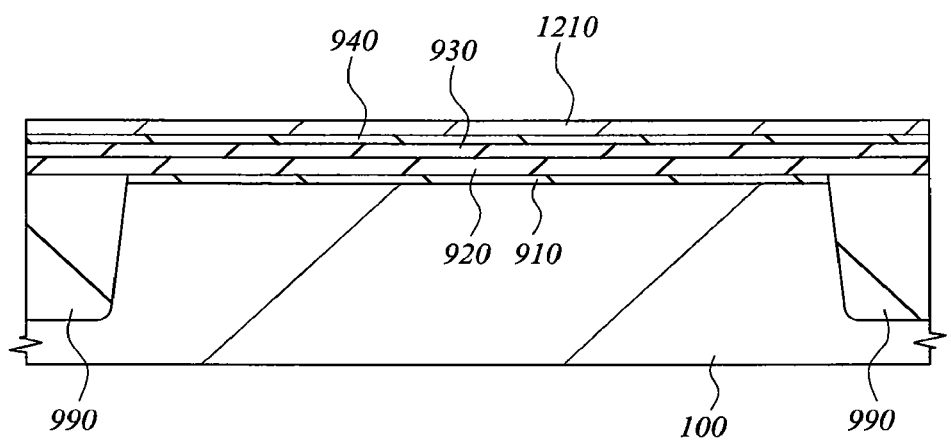
FIG. 25 is a sectional view showing a forming step for the gate electrode of the memory cell of the first embodiment.

First, after a silicon oxide film 910, a silicon nitride film 920, a silicon oxynitride film 930, and a silicon oxide film 940 are formed on a substrate by the above-mentioned methods shown in FIG. 13 and FIG. 14, a non-doped amorphous silicon film 1210 or an amorphous silicon film 1210 with a low impurity concentration is deposited on the silicon oxide film 940 to have a film thickness of 6 nm by CVD process, as shown in FIG. 25. The amorphous silicon film 1210 is made to be the polysilicon film 1010 shown in FIG. 19 at the subsequent step.

Figure 26:
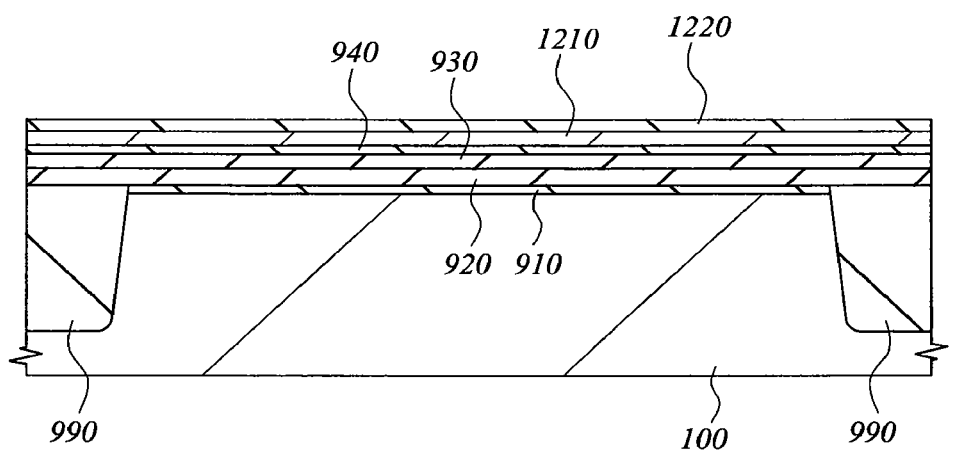
FIG. 26 is a sectional view showing a forming step of the gate electrode continued from FIG. 25.

Next, as shown in FIG. 26, a thin silicon oxide film 1220 with a film thickness of about 1 nm is formed on a surface of the amorphous silicon film 1210 by performing thermal oxidizing process for about 5 minutes in a gas atmosphere including 20% oxygen at a temperature of 400° C. to 450° C. The thin silicon oxide film 1220 has a role of a barrier layer preventing diffusion of boron and a role of producing grain aggregates of polysilicon in an interface between the gate electrode 550 and the silicon oxide film 940 to cause electric field concentration at a hole injection time. These roles will be described later.

Figure 27:
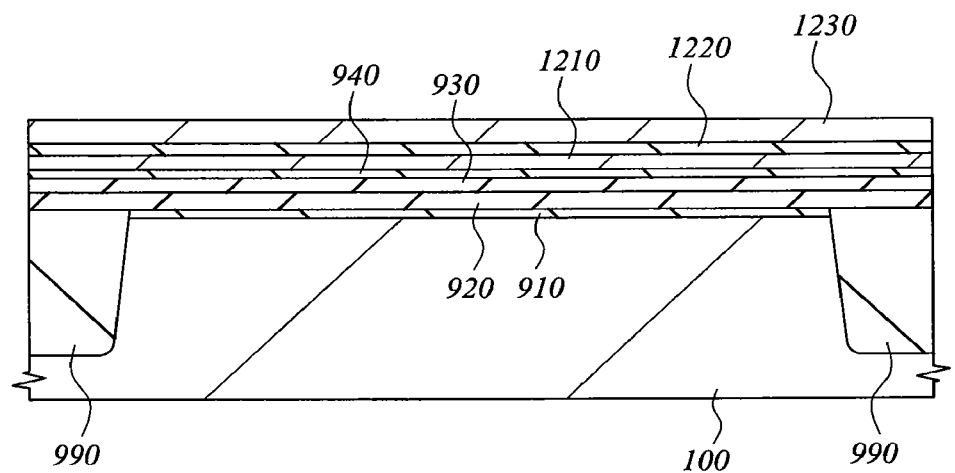
FIG. 27 is a sectional view showing a forming step of the gate electrode continued from FIG. 26.

Next, as shown in FIG. 27, after a non-doped amorphous silicon film or an amorphous silicon film having low impurity concentration with a film thickness of 6 nm is deposited on the silicon oxide film 1220 by CVD process, the amorphous silicon film is poly-crystallized to obtain a polysilicon film 1230 by performing anneal for about 30 minutes in nitrogen atmosphere at a temperature of about 900° C. When anneal is performed, a portion of the silicon oxide film 1220 enters into the interface between the amorphous silicon film 1210 and the silicon oxide film 940 so that grain aggregates (not shown) of polysilicon are formed in the interface.

Figure 28:
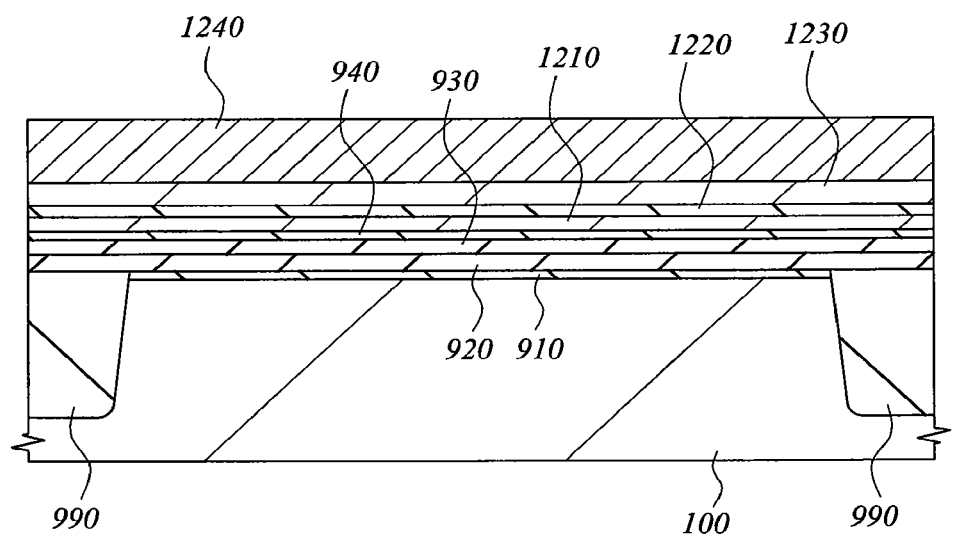
FIG. 28 is a sectional view showing a forming step of the gate electrode continued from FIG. 27.

Next, after washing with hydrofluoric acid, as shown in FIG. 28, a p-type polysilicon film 1240 with a low impurity concentration is deposited on the polysilicon film 1230 by CVD process, and anneal is then performed in order to activate impurities (boron) in the p-type polysilicon film 1240. The film thickness of the polysilicon film 1240 is set to about 200 nm.

When the above-mentioned anneal for activation is performed, boron in the p-type polysilicon film is diffused. However, the thin silicon oxide film 1220 is interposed between the p-type polysilicon film 1240 and the underlying amorphous silicon film 1210, therefore, boron in the p-type polysilicon film 1240 is hardly diffused in the amorphous silicon film 1210. Incidentally, when the above-mentioned anneal for activation is performed by using a laser anneal process, a diffusion distance of boron can be controlled more accurately. In this case, a step of forming the silicon oxide film 1220 on a surface of the amorphous silicon film 1210 can be omitted.

Though a diagrammatic representation is omitted, the gate electrode 500 comprising multiple layers made of polysilicon films with different impurity concentrations can be obtained by dry-etching the p-type polysilicon film 1240, the polysilicon film 1230, the silicon oxide film 1220, the amorphous silicon film 1210, and a lower layer as the laminated insulation film (the silicon oxide film 940, the oxynitride silicon film 930, the silicon nitride film 920, and the silicon oxide film 910). Since the film thickness of the silicon oxide film 1220 interposed between polysilicon films is extremely thin (about 1 nm) and holes can tunnel through the silicon film 1220 directly, the silicon oxide film 1220 hardly blocks an injection of the holes from the gate electrode 500.

Incidentally, instead of the above-mentioned step, a step described below can be adopted. That is, after an n-type amorphous silicon film with a high impurity concentration is deposited on the silicon oxide film 940, a p-type polysilicon film 1240 is deposited on the n-type amorphous silicon film. Thereafter, anneal for activating boron in the p-type polysilicon film 1240 is performed. In this case, since a portion of boron in the p-type polysilicon film 1240 diffuses in the underlying n-type amorphous silicon film to neutralize impurities (phosphorus) in the n-type amorphous silicon film, a gate electrode 500 with a two-layered structure comprising a non-doped polysilicon film or a polysilicon film with a low impurity concentration and a p-type polysilicon film 1240 can be obtained.

Also, instead of the above-mentioned silicon oxide film 1220, a silicon nitride film with a film thickness of about 1 nm may be used. The silicon nitride film can be formed by thermally treating the amorphous film 1210 in an ammonia atmosphere at a temperature of about 700° C. In this case, since no grain aggregate of polysilicon is formed in an interface between the amorphous silicon film 1210 and the silicon oxide film 940, the effect in which the grain aggregates cause electric field concentration can not be obtained. However, since the silicon nitride film has a potential barrier to holes in gate electrode lower than the silicon oxide film, the holes directly tunnel easily, so that the holes can be injected at a higher efficiency.

Also, instead of the silicon oxide film 1220, a metal thin film having such a property that diffusion of boron is made difficult may be used. As a representative metal thin film material, TiN can be adopted. The present invention is not limited to this material, and an optimal material may be selected considering consistency with other processes.

Since the above-mentioned manufacturing method of the gate electrode 500 is not required for introduction of novel materials, such a merit can be obtained that the manufacturing method has a high matching property with conventional semiconductor manufacturing processes. In addition, since the memory cell according to the present embodiment does not utilize hot holes at a time of a hole injection, there is such a merit that the insulating film under the gate electrode 500 is not degraded. Further, since the gate electrode material is polysilicon like the conventional art, such a merit can be obtained that no defect is produced at a joint surface with the insulating film positioned under the gate electrode 500 so that a stable operation is obtained.

In the memory cell according to the present embodiment, an effect of lowering the barrier to holes due to the quantum level formation is in a range of about 0.5 to 0.8 eV, which is slightly smaller than that in a memory cell according to an embodiment described later. However, the example explained above considers only the ground state and, for example, when a voltage applied to the gate electrode 500 is raised to make further upper levels, the effect of lowering the barrier can get the raised level energy, so that a hole injection at a further high efficiency is made possible.

Second Embodiment

It is apparent from the above-mentioned first embodiment that a high efficiency hole injection from the gate electrode can be realized by lowering the potential barrier of the insulating film under the gate viewed from holes in polysilicon gate. In the present embodiment, lowering of the potential barrier with respect to holes in the gate is realized by using semiconductor materials with a wide gap for the gate electrode instead of by forming the quantum levels.

Figure 29:
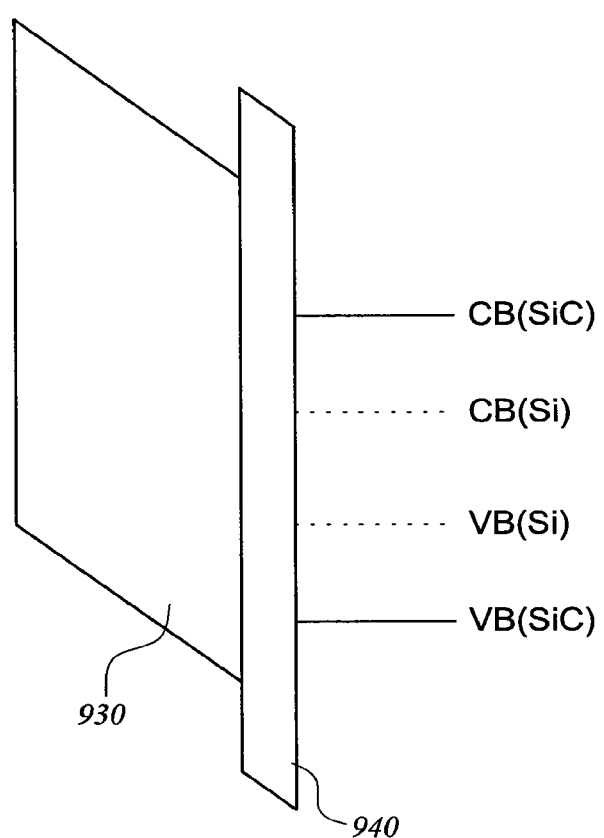
FIG. 29 is a band diagram of the vicinity of a gate electrode when a positive voltage is applied to a gate electrode of a memory cell of a second embodiment.

FIG. 29 shows a band diagram near a gate electrode when the gate electrode of a memory cell comprises a silicon carbide (SiC) film and a predetermined gate electrode voltage is applied thereto. A solid line CB (SiC) shown in a gate electrode part in figure denotes a conduction band of SiC, and a solid line VB (SiC) denotes a valence band of SiC, respectively. A dotted line CB (Si) denotes a conduction band of silicon and a dotted line VB (Si) denotes a valence band of silicon, respectively.

As described in IEEE Electron Device Letters, Vol. 18, No. 12, December 1997 (A. Agarwal et al.), in band offsets between silicon oxide and SiC, a valence band offset is 3.05 eV in SiC of 4H-SiC, and a valence band offset is 3.2 eV in SiC of 6H-SiC. This means that a barrier of the silicon oxide film to holes in the gate electrode is lowered by about 1.5 to 1.6 eV as compared with a case that silicon is used for the gate electrode, when assuming that the valence band offset between silicon and the silicon oxide is about 4.7 eV. In this embodiment, this effect of lowering the barrier is larger than that of lowering the barrier by the formation of the quantum level (QL) according to the first embodiment. Therefore, a probability that the holes in the gate electrode tunnel through the silicon oxide film 940 and the silicon oxynitride film 930 is higher than that in the gate electrode with the two-layered structure shown in the first embodiment, so that a hole injection is made possible with a further high efficiency.

As the semiconductor material with a wide gap used for the gate electrode, in addition to SiC, Group-III-V compound semiconductor such as AlN, InN, GaN, InGaN, GaAs, AlGaAs or ZnO can be used.

Third Embodiment

The high efficiency hole injection from the gate electrode can also be realized by producing hot holes on the gate electrode. It can be said that this method lowers a barrier of the insulating film to holes in the gate electrode like the first and second embodiments.

Figure 30:
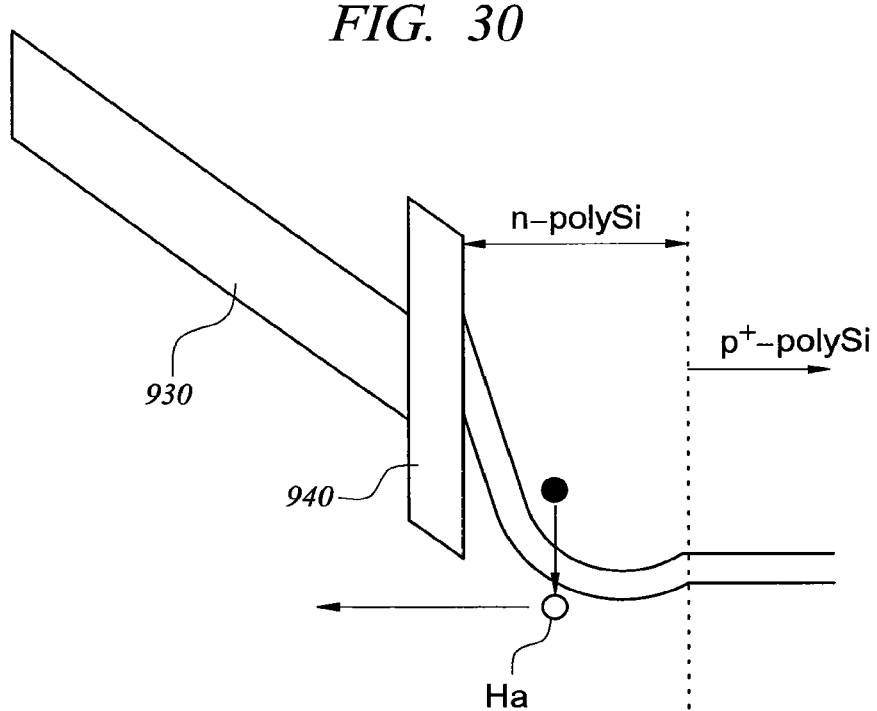
FIG. 30 is a band diagram of the vicinity of a gate electrode when a positive voltage is applied to a gate electrode of a memory cell of a third embodiment.

In the present embodiment, as shown in a band diagram in FIG. 30, the gate electrode comprises a two-layered film made of an n-type polysilicon film and $n^+$ type (or $p^+$-type) polysilicon film with a high impurity concentration to generate avalanche hot holes. FIG. 30 is a band diagram near the gate electrode just after applying a gate voltage. Also, FIG. 30 shows production of the avalanche hot holes (Ha).

In order to produce the avalanche hot holes, it is necessary to accelerate carriers by deep depletion such as shown in FIG. 30, so that it is necessary to make an impurity concentration in the n-type polysilicon film near the gate electrode lower than $10^{18}$ atom/cm$^3$. When the impurity concentration in the n-type polysilicon film is higher than $10^{18}$ atom/cm$^3$, Zener Tunnel (inter-band tunnel) phenomenon in which electrons move from a valance band to a conduction band occurs just after applying a gate voltage. As a result, holes produced on the valence band form an inversion layer, so a deep depletion required for the avalanche hot holes cannot occur. It is desirable that the impurity concentration in the $n^+$ type (or $p^+$-type) polysilicon film on the upper portion of the n-type polysilicon film is $10^{19}$ atom/cm$^3$ or more because a depletion can be made deeper by a higher impurity concentration.

Incidentally, it is necessary to set the film thickness of the above-mentioned n-type polysilicon film considering an acceleration distance of carriers required for generation of avalanche hot holes. Since the acceleration distance of carriers is increased as the film thickness is increased, a hole injection at a high efficiency can be expected. However, a voltage applied to the gate electrode is also increased correspondingly, and a voltage to be applied at a reading time is also increased similarly. Accordingly, the film thickness of the n-type polysilicon film must be set considering the gate voltage capable of being applied to a memory to be used. The gate electrode of the present embodiment can be manufactured by the method shown in the first embodiment.

Since the memory cell according to the present embodiment adopts the carrier injection system utilizing the hot holes, the holes can be injected from the gate electrode at a higher efficiency than that in the memory cells of the other embodiments. The silicon oxide film 940 and the silicon oxynitride film 930 tend to be degraded by using the hot holes, but since a hot hole junction from the substrate does not occur, a channel interface is not damaged and transistor characteristics such as a reading characteristic are not degraded.

In order to suppress degradation of the insulating film due to utilization of the hot holes, it is effective to perform NO anneal to an interface between the gate electrode and the gate insulating film. It is also effective that, after the interface between the gate electrode and the gate insulating film is nitrided with plasma, anneal is performed in nitrogen atmosphere. Incidentally, an electric field produced by carriers accumulated in the silicon nitride film 920 is well applied to a part (the n-type polysilicon film) of the gate electrode because the gate insulating film existing under the gate electrode is made to have the four-layered structure explained in the first embodiment. Therefore, the carrier retention characteristic is improved due to the same reason as described in the first embodiment.

Fourth Embodiment

In a memory cell according to the present embodiment, a hole injection at high efficiency is realized by producing levels in an interface between a gate electrode and an underlying silicon oxide film 940, and by making holes to tunnel through the silicon oxide film 940 via the levels.

Figure 31:
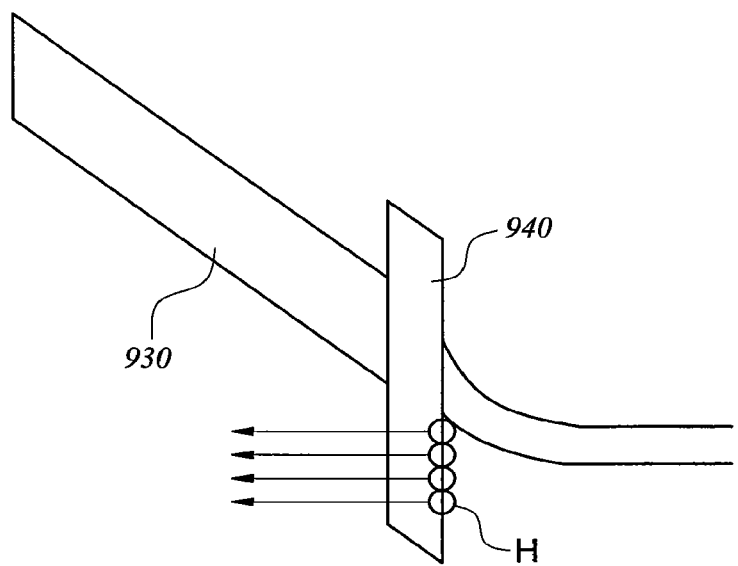
FIG. 31 is a band diagram of the vicinity of a gate electrode when a positive voltage is applied to a gate electrode of a memory cell of a fourth embodiment.

FIG. 31 is a band diagram at a time of an application of a gate voltage in the memory cell according to the present embodiment. By producing the levels in the interface between the gate electrode and the silicon oxide film 940, holes (H) are trapped in the levels. Therefore, the holes (H) tunnel through the silicon oxide film 940 without dropping in a bottom of the valence band of a polysilicon film (gate electrode) at a time of depletion of the gate electrode. It is said again that the barrier of the insulating film is lowered with respect to the holes in the gate electrode.

In order to produce levels in the interface between the gate electrode and the silicon oxide film 940, a surface of the silicon oxide film 940 is thinly nitrided by heat or nitrided with plasma to form trap levels of silicon nitride. Alternatively, there is such a method that the interface between the gate electrode and the silicon oxide film 940 is damaged by plasma irradiation to form the levels. Further, it is also thought that the levels are formed by ion-implanting fluorine into the interface or inserting a metal thin film for traps in the silicon oxide film 940. A feature of the memory cell according to the present embodiment lies in that a manufacturing method thereof is simple and the memory cell is easy to manufacture.

Fifth Embodiment

The memory cells according to the first to fourth embodiments have the gate insulating film between the substrate and the gate electrode, and the gate insulating film comprises four layer films of a silicon oxide film 910/a silicon nitride film 920/a silicon oxynitride film 930/a thin silicon oxide film 940 disposed in this order from the substrate side. On the other hand, even when the gate insulating film comprises a three-layered structure (1) of a silicon oxide film/a silicon nitride film/a silicon oxynitride film disposed in this order from the substrate side or it comprises a three-layered film (2) of a silicon oxide film/a silicon nitride film/a silicon oxide film disposed in this order from the substrate side, a high efficiency hole injection from the gate electrode can be realized.

When the above-mentioned three-layered film (1) is adopted, since the silicon oxide film 940 is not present, a hole injection is made possible with higher efficiency, as compared with the case that the four-layered film according to the first to fourth embodiments is adopted. Further, when the three-layered film (2) is adopted, since the silicon oxide has a larger band gap than that of the silicon oxynitride, a retention characteristic of carriers accumulated in the silicon nitride film is improved as compared with the case that the four-layered film according to the first to fourth embodiments is adopted.

Sixth Embodiment

In the first to fifth embodiments, the MONOS type memories have been explained. In addition, in a so-called floating gate type memory where the charge accumulation layer is made of a polysilicon film, a high efficiency hole injection from a gate electrode to a floating gate can be realized by applying any one of the gate electrode structures of the first to fourth embodiments.

Figure 32:
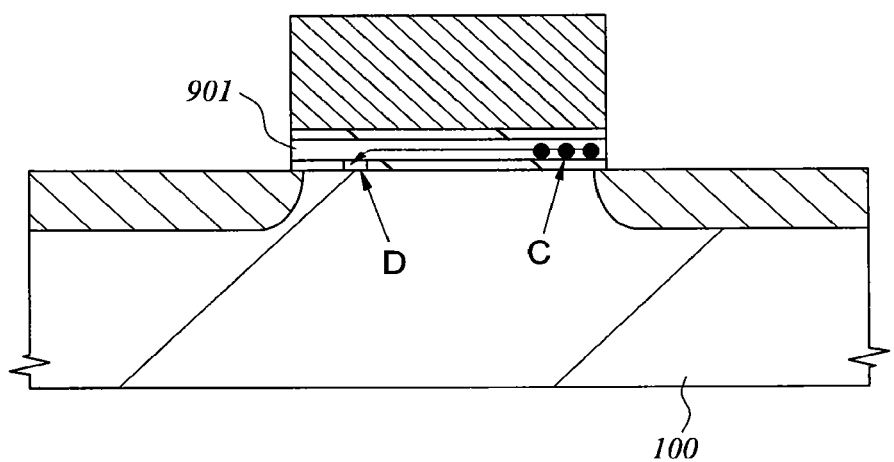
FIG. 32 is an explanatory schematic sectional view of a charge retention state of a charge accumulation layer made of a polysilicon film.

A memory cell including a charge accumulation layer made of a polysilicon film becomes sensitive to defects in insulating films on a substrate side and a gate electrode side in which the polysilicon film is interposed therebetween. This is because the polysilicon film is an electrically conductive film and when a defect (D) occurs at a particular site in a gate insulating film 901, for example, as shown in FIG. 32, charges (C) accumulated in the polysilicon film (the charge accumulation layer) reach the defect easily, so that charges (C) leak therefrom. On the other hand, when a film which is non-conductive like the silicon nitride film and has a discrete trap property is used, the charges (C) need the energy to move through sites in the discrete traps in order to reach the defect, so that the charges do not leak easily.

Accordingly, when the charge accumulation layer is formed of a polysilicon film, the insulating films on the substrate side and the gate electrode side in which the polysilicon film is interposed therebetween must be made thick, and a gate voltage required for a hole injection and an electron injection is increased correspondingly. However, such a problem that electrons are locally present in a part of the charge accumulation layer, which occurs when the charge accumulation layer is made of a silicon nitride film and a local injection with hot carriers is performed, can be avoided.

Seventh Embodiment

In the first to sixth embodiments, the memory cells that holes are injected from the gate electrode have been explained. However, a high efficiency injection can be realized similarly even in a memory cell in which a negative voltage is applied to a gate electrode and electrons are injected from the gate electrode.

When this system is adopted, since not only electrons but also holes can be injected from the gate electrode, writing/erasing operations can be performed without deteriorating a channel interface at all. Therefore, degradation of transistor characteristics can be prevented at a reading time.

Eighth Embodiment

Figure 7:
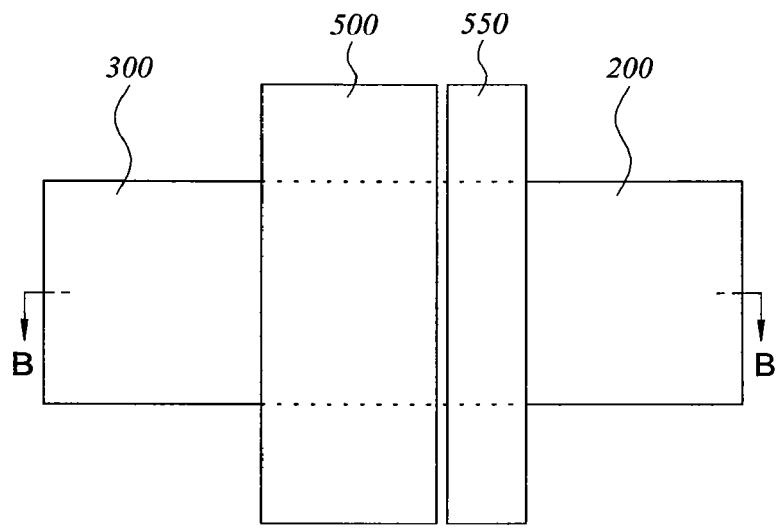
FIG. 7 is a plan view of a MONOS type memory having a split gate.
Figure 8:
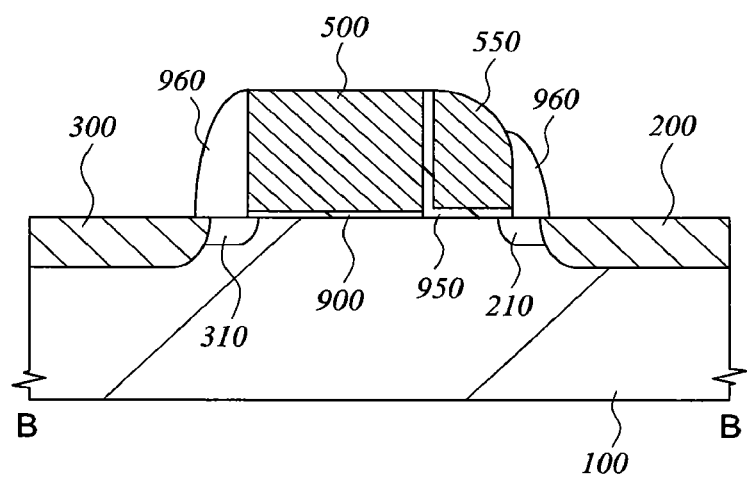
FIG. 8 is a sectional view of the MONOS type memory having a split gate.
Figure 9:
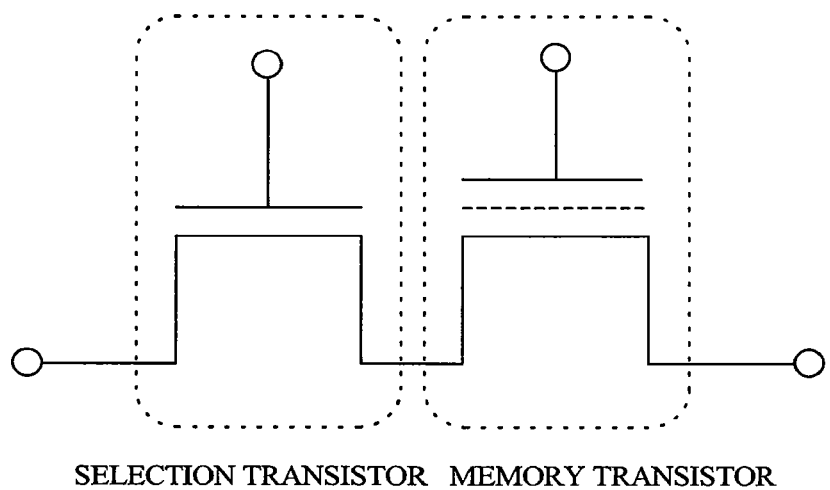
FIG. 9 is an equivalent circuit diagram of the MONOS type memory having a split gate.
Figure 10:
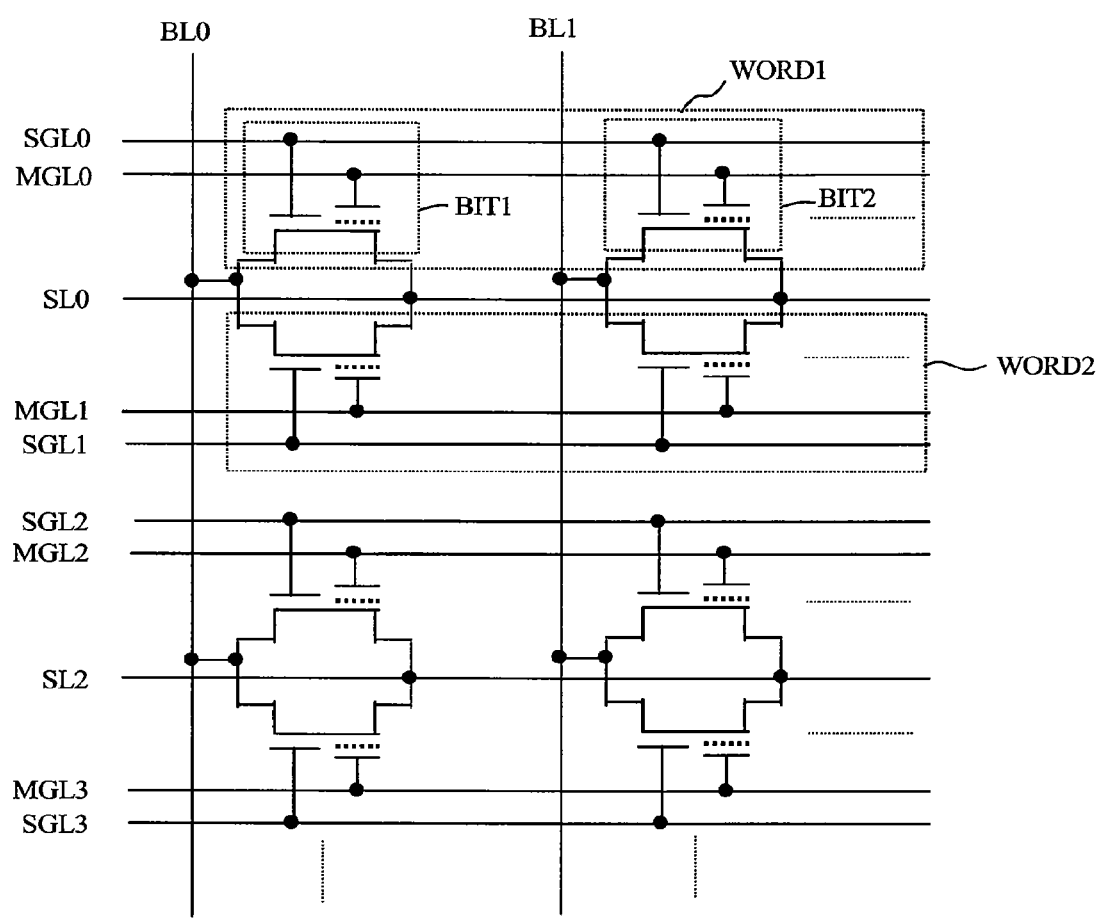
FIG. 10 is a circuit diagram of a memory array using the MONOS type memories having a split gate.
Figure 11:
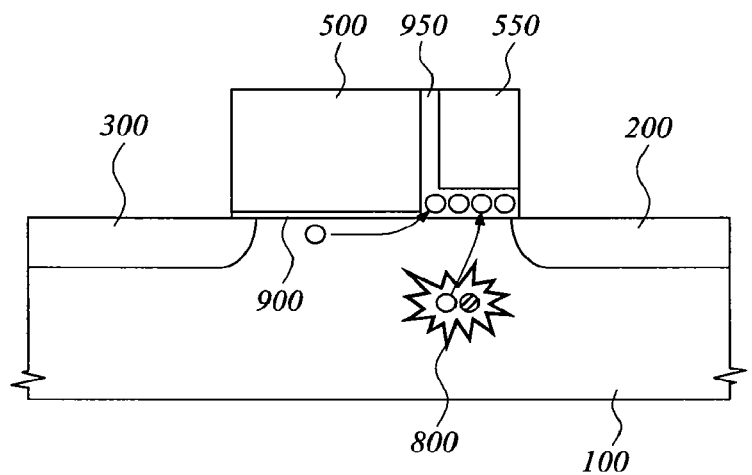
FIG. 11 is an explanatory view of a writing operation of the MONOS type memory having a split gate.
Figure 12:
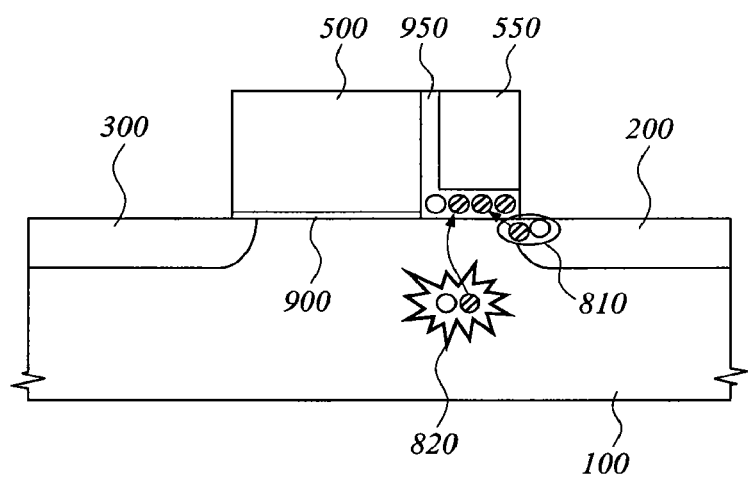
FIG. 12 is an explanatory view of an erasing operation of the MONOS type memory having a split gate.

The present invention can be applied to a MONOS type memory having a split gate structure such as explained in FIG. 7 to FIG. 9. That is, by applying the gate electrode structure of any one of the first to fourth embodiments to the memory gate 550 of the MONOS type memory having the split gate structure shown in FIG. 7 to FIG. 9, it is made possible to inject holes from the memory gate 550 into the charge accumulation layer at a high efficiency. Also, since the gate insulating film 950 of the memory gate 550 is made to have the same four-layered structure as that of the gate insulating film of the first embodiment, injection efficiency of the holes can be further increased.

Figure 33:
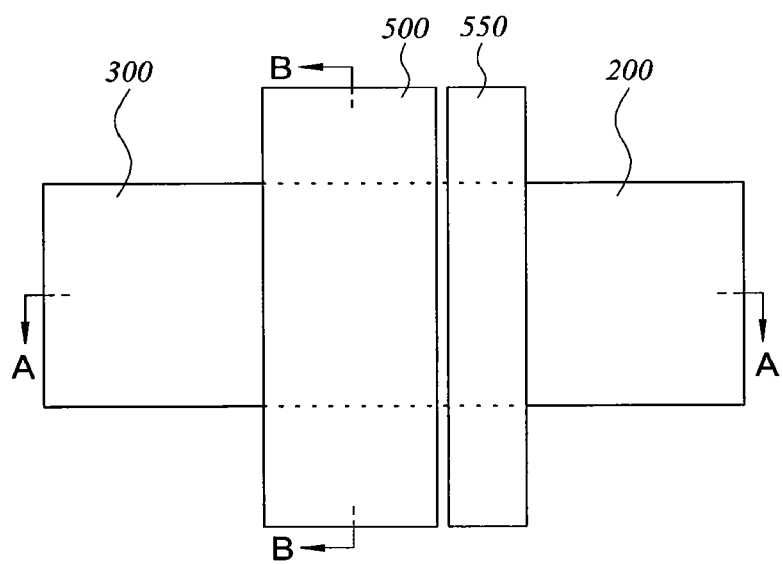
FIG. 33 is a plan view showing a memory cell of an eighth embodiment.
Figure 34:
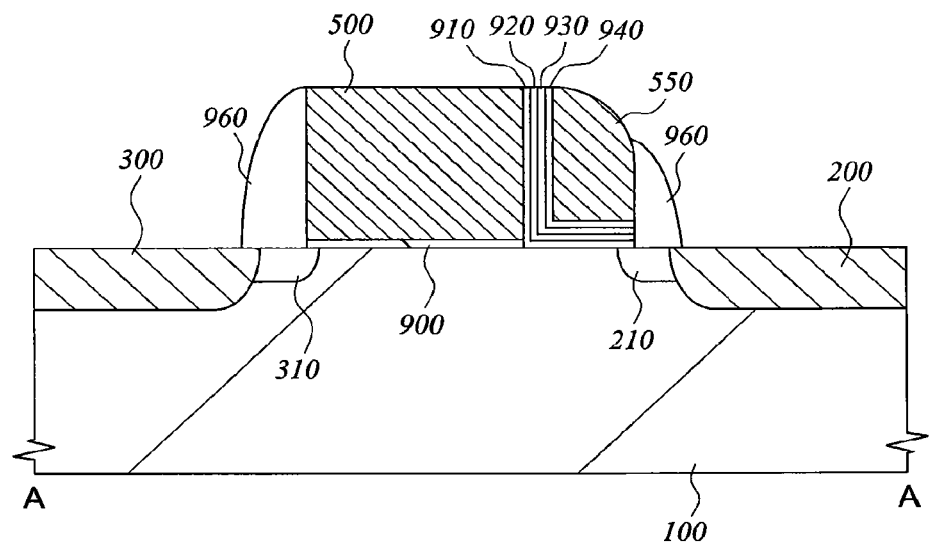
FIG. 34 is a sectional view showing the memory cell of the eighth embodiment.

FIG. 33 is a plan view showing a memory cell according to the present embodiment and FIG. 34 is a sectional view taken along a line A-A in FIG. 33. Since a carrier injection system in the memory cell of the present invention is to inject holes from the gate electrode and to inject hot electrons from the substrate, the erasing operation is different from the above-mentioned operation in an operation of the memory cell. That is, for example, when the erasing operation is executed, a positive potential of 10 V is applied to the memory gate 550, and 0 V is applied to a diffusion layer (source) 200, a diffusion layer (drain) 300, a selector gate 500, and a silicon substrate 100, respectively. The holes are injected into a charge accumulation layer (a silicon nitride film 920) from the memory gate 550. Here, by applying the gate electrode structure of the present invention shown in the first to fourth embodiments to the memory gate 550, a high efficiency injection of holes is made possible. The same operation as the above-mentioned operations can be performed in writing and reading. Since a hole injection at a high efficiency is made possible at the erasing time, a threshold can be made low. Therefore, in the memory cell according to the present embodiment where memory cells are selected by the selection transistor, since the memory gate 550 can be read at 0 V, operations at low voltages and high speeds can be realized. In addition, since a bias is not applied to the memory gate 550 at any time other than the writing and erasing time, the embodiment is effective for charge retention.

Next, a method of manufacturing a memory cell of the present embodiment will be explained with reference to FIG. 35 to FIG. 44. Left side figures on FIG. 35 to FIG. 44 are sectional views taken along a line A-A in FIG. 33, and right side figures thereon are sectional views taken along line a B-B in FIG. 33. Here, explanations are made using a process technique corresponding to so called 0.13 μm generation.

Figure 35:
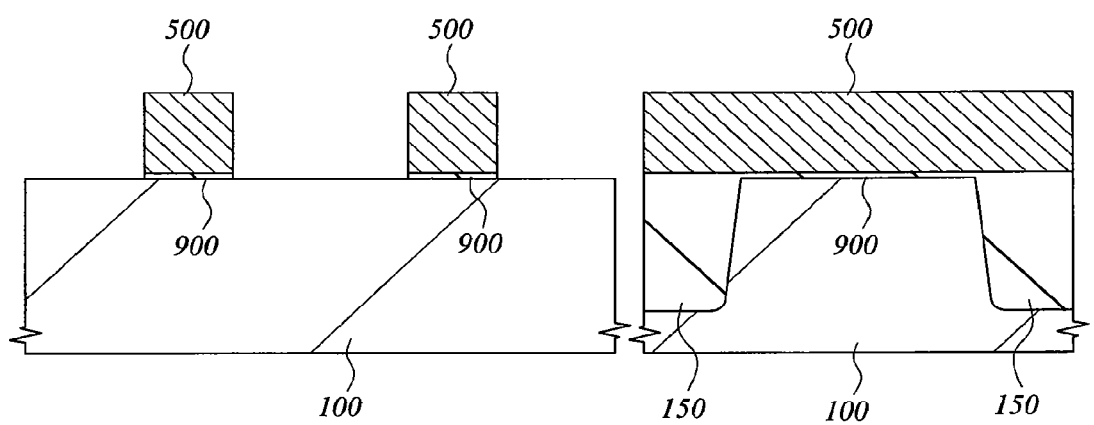
FIG. 35 is a sectional view showing a manufacturing method for the memory cell of the eighth embodiment.

As shown in FIG. 35, a device isolation region 150 is first formed on a main surface of a p-type silicon substrate using a conventional Shallow Trench Isolation (STI) process. Also, a p-type well region (not shown) is formed on a substrate surface by performing ion implantation of boron and an anneal process for activation. Next, after a gate insulating film 900 comprising a silicon oxide film with a film thickness of 2.5 nm is formed by thermally oxidizing the substrate surface, a polysilicon film with a film thickness of about 200 nm is deposited on the gate insulating film 900 using CVD process. A selection gate 500 is then formed by dry-etching the polysilicon film. Note that, since the gate insulating film 900 under the selection gate 500 is extremely thin, it is not shown in the following figures (FIG. 36 to FIG. 44).

Figure 36:
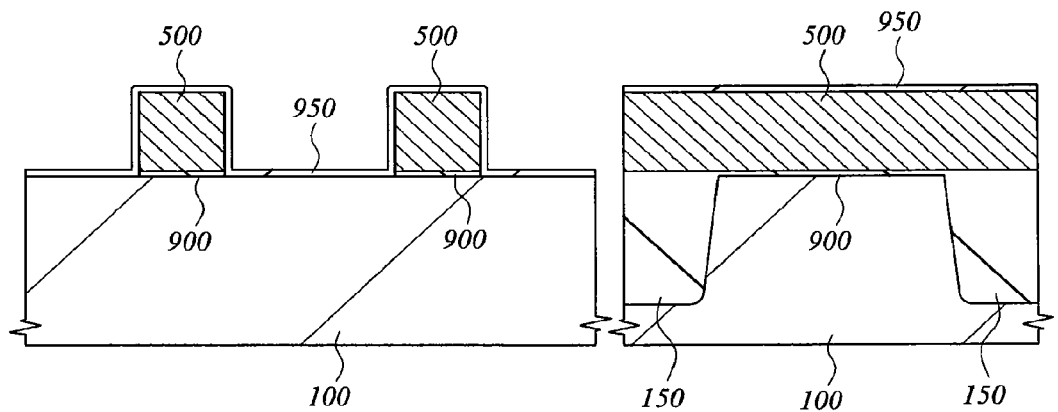
FIG. 36 is a sectional view showing a manufacturing method for the memory cell continued from FIG. 35.

Next, as shown in FIG. 36, a gate insulating film 950 is formed on the substrate. The gate insulating film 950 comprises a four-layered film of the silicon oxide film 910, the silicon nitride film 920, the silicon oxynitride film 930, and the silicon oxide film 940 described in the above-mentioned first embodiment. A manufacturing method thereof is the same as described in the above-mentioned first embodiment.

Figure 37:
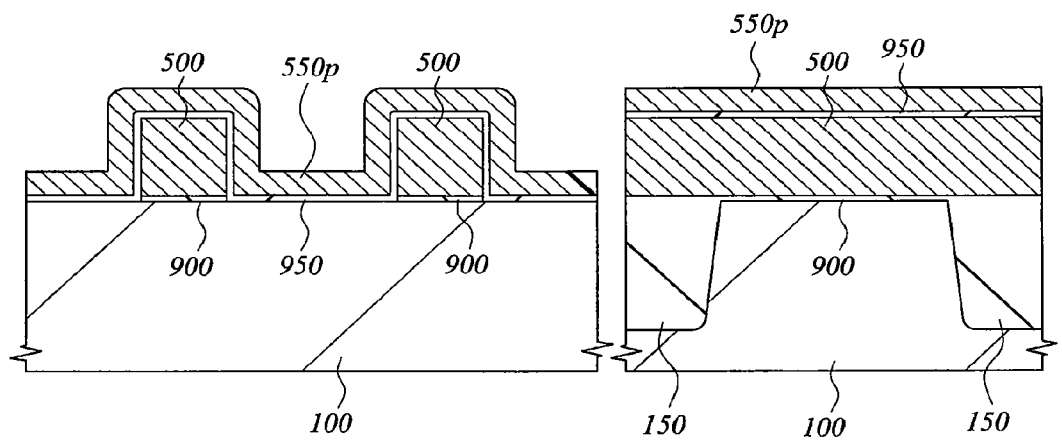
FIG. 37 is a sectional view showing a manufacturing method for the memory cell continued from FIG. 36.
Figure 38:
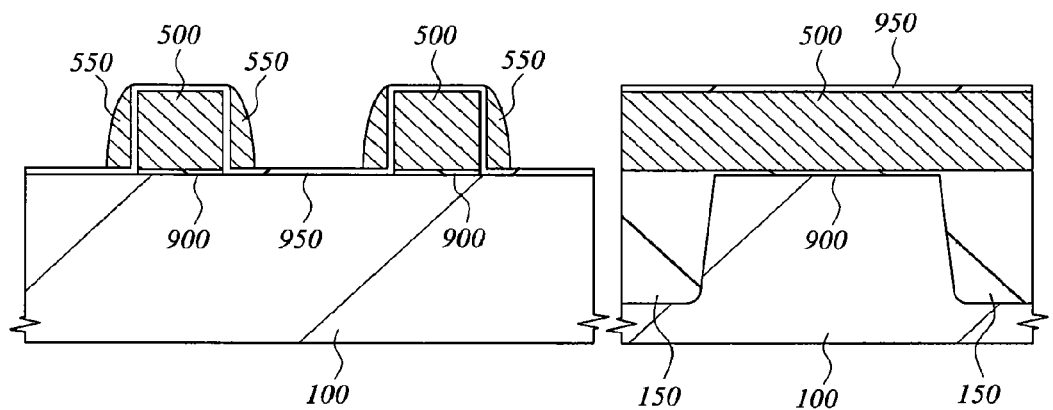
FIG. 38 is a sectional view showing a manufacturing method for the memory cell continued from FIG. 37.

Next, as shown in FIG. 37, after a p-type polysilicon film 550p with a film thickness of 70 nm is deposited on the gate insulating film 950 by CVD process, as shown in FIG. 38, a spacer-like memory gate 550 is formed on a side wall of the selection gate 500 by performing anisotropic etching on the p-type polysilicon film 550p. Here, the p-type polysilicon film 550p comprises a two-layered film of a p-type polysilicon film with a low impurity concentration and a p$^+$-type polysilicon film with a high impurity concentration deposited on the upper portion thereof, as explained in the first embodiment. The memory gate 550 can be formed by using gate electrode materials as explained in the second to fourth embodiments, instead of the p-type polysilicon film 550p.

Figure 39:
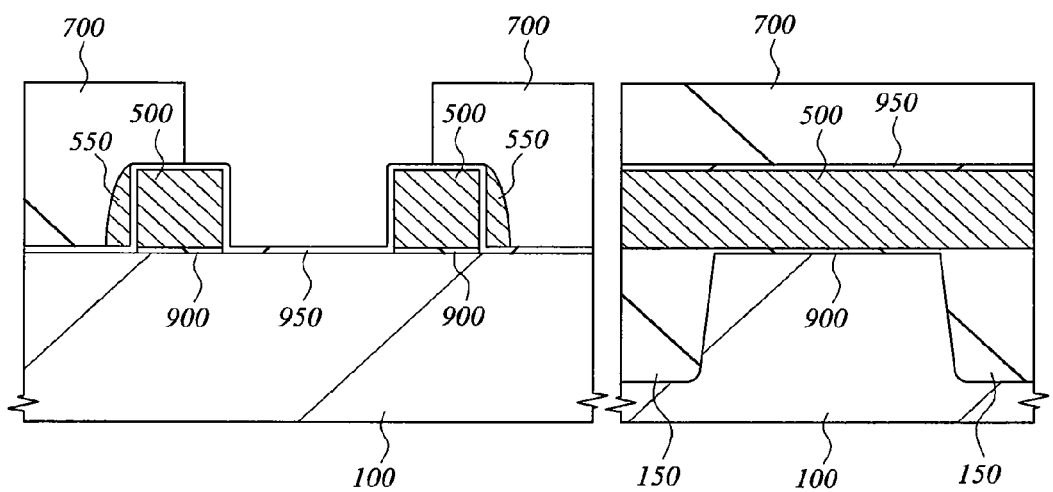
FIG. 39 is a sectional view showing a manufacturing method for the memory cell continued from FIG. 38.

Next, as shown in FIG. 39, the memory gate 550 on one side of the selection gate 500 is removed by performing dry etching using a photoresist film 700 as a mask so that the memory gate 550 is left only on another side wall.

Figure 40:
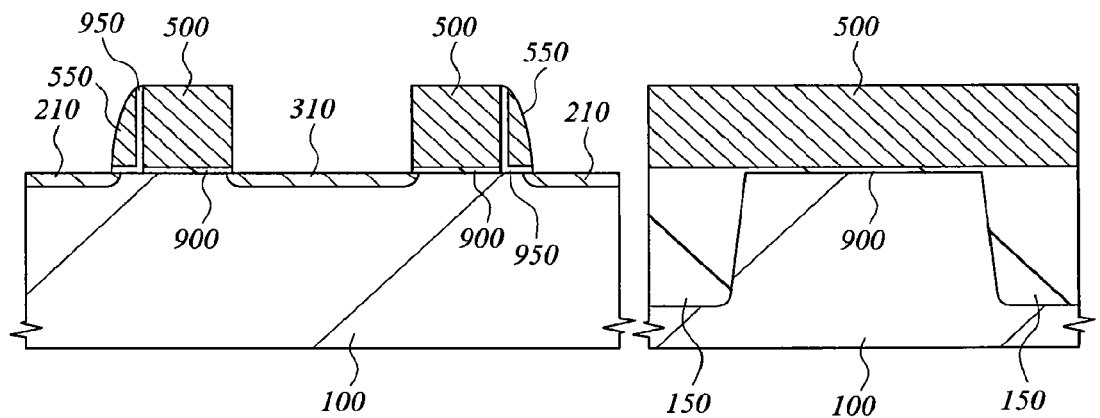
FIG. 40 is a sectional view showing a manufacturing method for the memory cell continued from FIG. 39.

Next, as shown in FIG. 40, a gate insulating film 950 is left on the one side wall of the selection gate 500 and under the memory gate 550 by dry etching the gate insulating film 950. Subsequently, after arsenic is ion-implanted into the surface of the substrate, n$^-$ diffusion layers 210 and 310 are formed by thermally treating the substrate to activate the arsenic. Here, the implant energy of the arsenic is set to 10 keV and a dose amount thereof is set to $1 \times 10^{15}$ atom/cm$^2$. The n$^-$ diffusion layers 210 and 310 are formed to make the memory cell have an LDD (lightly doped drain) structure.

Figure 41:
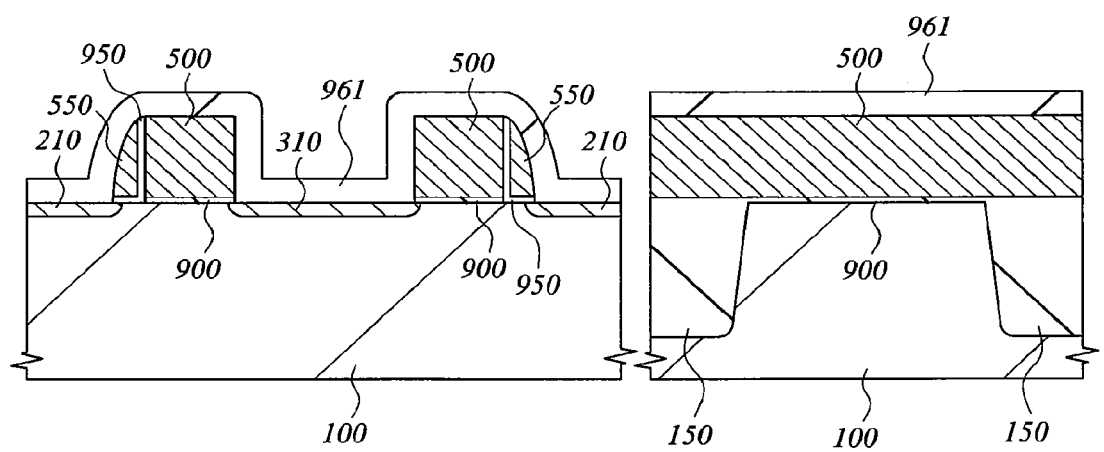
FIG. 41 is a sectional view showing a manufacturing method for the memory cell continued from FIG. 40.
Figure 42:
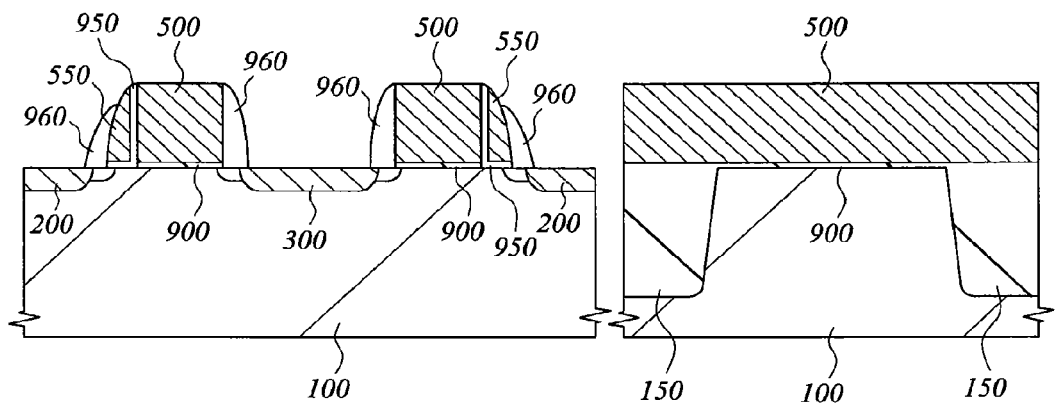
FIG. 42 is a sectional view showing a manufacturing method for the memory cell continued from FIG. 41.

Next, as shown in FIG. 41, after a silicon oxide film 961 with a film thickness of 100 nm is deposited on the substrate by CVD process, as shown in FIG. 42, side wall spacers 960 are formed on a side wall of the selection gate 500 and a side wall of the memory gate by performing anisotropic etching to the silicon oxide film 961. Subsequently, after arsenic is ion-implanted into the surface of the substrate, diffusion layers 200 and 300 serving as a source and a drain for the memory cell are formed by thermally treating the substrate to activate the arsenic. Here, the implant energy of the arsenic is set to 40 keV and the dose amount thereof is set to $2 \times 10^{15}$ atom/cm$^2$. The thermal treatment condition is set to 950° C. and 60 seconds.

Figure 43:
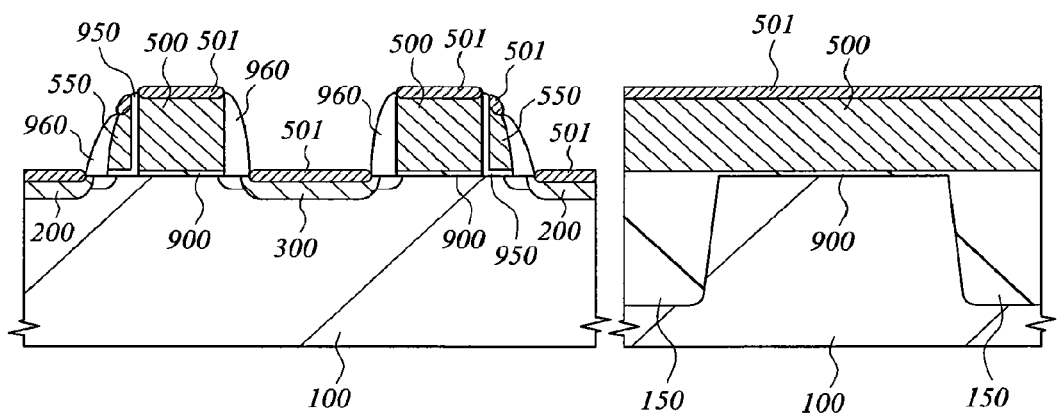
FIG. 43 is a sectional view showing a manufacturing method for the memory cell continued from FIG. 42.

Next, as shown in FIG. 43, silicide layers 501 are formed on respective surfaces of the selection gate 500, the memory gate 550, and the diffusion layers 200 and 300 by a conventional salicide process. The silicide layer 501 is made of Co silicide, for example.

Figure 44:
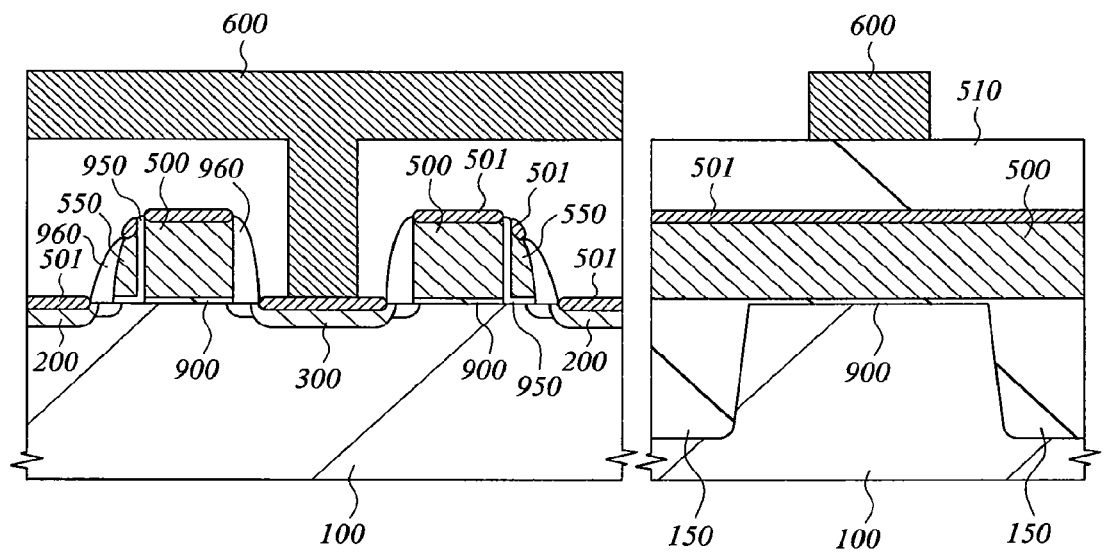
FIG. 44 is a sectional view showing a manufacturing method for the memory cell continued from FIG. 43.

Next, as shown in FIG. 44, after a thick interlayer insulating film 510 is deposited on the substrate, a wire 600 is formed on the interlayer insulating film 510 by a conventional wiring process. A MONOS type memory with a split gate structure in which holes can be injected from the gate electrode side at a high efficiency can be completed through the above-mentioned steps.

Figure 45:
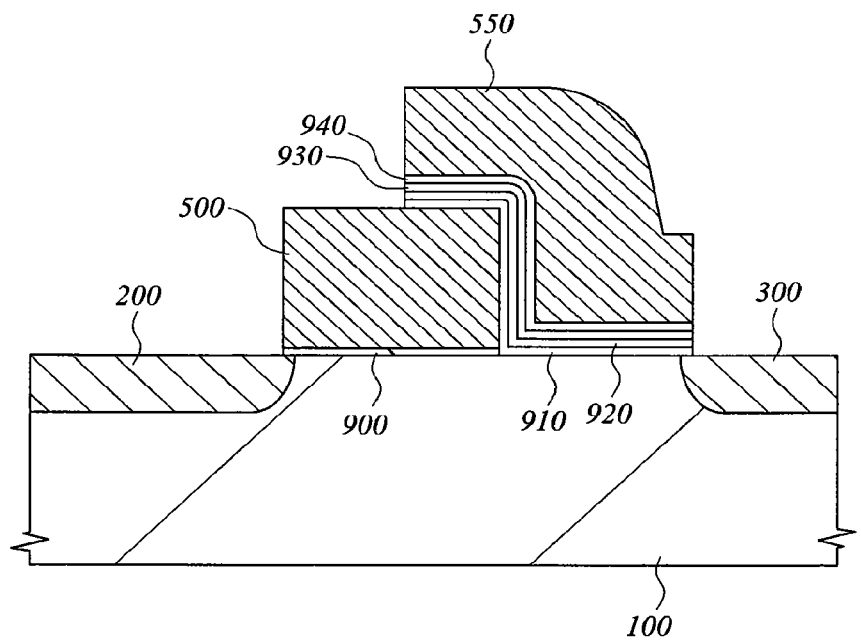
FIG. 45 is a sectional view showing another manufacturing method for a memory cell of the eighth embodiment.

Incidentally, in the above explanation, the memory gate 550 is formed by self-alignment to the selection gate 500. However, after an electrically conductive film is deposited so as to cover an upper portion of the selection gate 500, a memory gate 550 can be formed by dry etching the electrically conductive film using the photoresist film as a mask, as shown in FIG. 45. The electrically conductive film comprising the memory gate 550 is made of gate electrode materials as explained in the first to fourth embodiments.

Ninth Embodiment

In order to form an ideal laminated gate electrode comprising a non-doped polysilicon film and a p-type polysilicon film, the laser anneal which can well suppress diffusion of boron at a time of activating the boron is preferably used, as described in the first embodiment. This is because rapid heating/cooling can be made possible, as compared with a conventional rapid thermal anneal (RTA).

Figure 46:
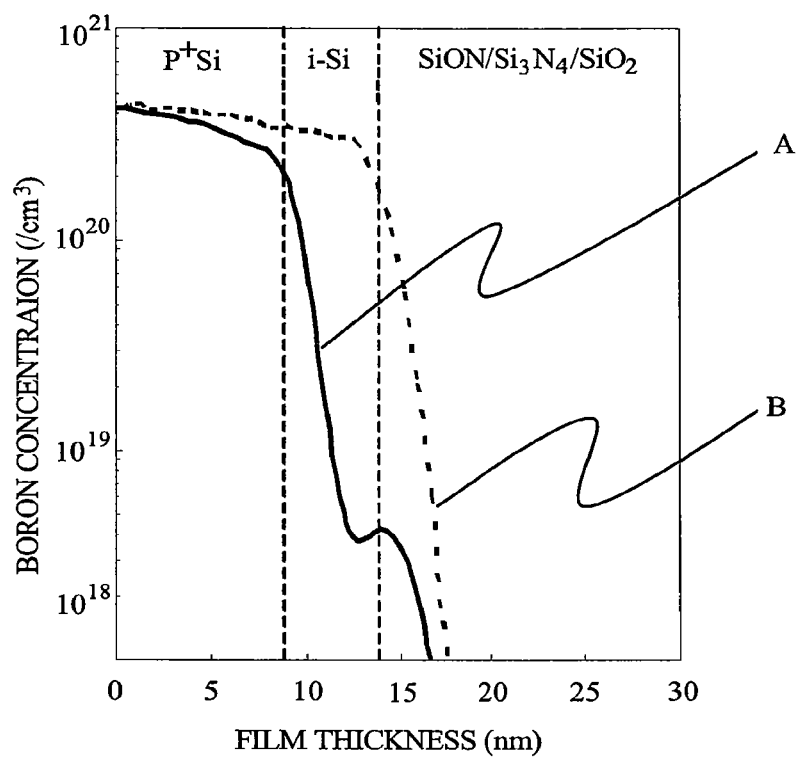
FIG. 46 is a graph showing boron concentration distributions when a laminated film made of a non-doped polysilicon film and a p-type polysilicon film is activated by laser anneal.

A boron concentration distribution when a laminated film made of a non-doped polysilicon film and a p-type polysilicon film is practically activated by laser anneal is shown in FIG. 46. Curve "A" in FIG. 46 is a boron concentration profile by SIMS analysis when a laser anneal for activating the boron is performed to a gate electrode. Here, the gate electrode is formed by laminating a non-doped polysilicon film (i-Si) with a film thickness of 6 nm and a boron-doped polycrystalline silicon film (p$^+$-Si) with a film thickness of 200 nm on an insulating film in which a silicon oxide film (film thickness=4 nm), a silicon nitride film (film thickness=5 nm), and a silicon oxynitride film (film thickness=5 nm) are stacked in this order from a silicon substrate. The activation of the boron is performed by the laser anneal at a temperature of 1200° C. for 800 µsec, after performing thermal treatment at a temperature of 900° C. for 30 minutes in N$_2$ atmosphere. A result (Curve B), by SIMS analysis, of a gate electrode comprising a p-type polysilicon single layer film is also shown as a comparative profile in FIG. 46.

It is understood from FIG. 46 that the boron concentration rapidly decreases between the non-doped polysilicon film and the boron-doped polycrystalline silicon film in the laminated gate electrode. Especially, the non-doped polysilicon film (i-Si) has a region of about 4 nm width whose boron concentration is one or more orders of magnitude lower compared to an average boron concentration of the boron-doped polycrystalline silicon film. Since this region can effectively bend a band at a time of applying a gate voltage, the region may be substantially regarded as a non-doped polysilicon film.

Meanwhile, an electrical thickness of the non-doped polysilicon film is 3.9 nm calculated by C-V measurement using the relative dielectric constant (=11.9) of silicon. As these results, diffusion of the boron is suppressed to about 2 nm, and it is understood that the effective thickness regarded as non-doped polysilicon is a thickness of a part of the non-doped polysilicon film which has a boron concentration of one or more orders of magnitude lower than that of the boron-doped polycrystalline silicon film. Therefore, a layer called as "non-doped polysilicon film" in the present invention indicates a region whose boron concentration is one digit lower than an average of the boron concentrations of the boron-doped polycrystalline silicon film, unless otherwise instructed. Also, the film thickness of the non-doped polysilicon film is considered as a film thickness of an Si layer electrically measured by C-V measurement.

It is desirable that, even after the laser anneal is performed, the boron diffusion is suppressed as small as possible at later steps, so it is preferable to use laser anneal for activation of impurities when the diffusion layers (source and drain) are formed. Ideally, it is desirable to activate the gate electrode and the diffusion layers at once by laser anneal.

Figure 47A:
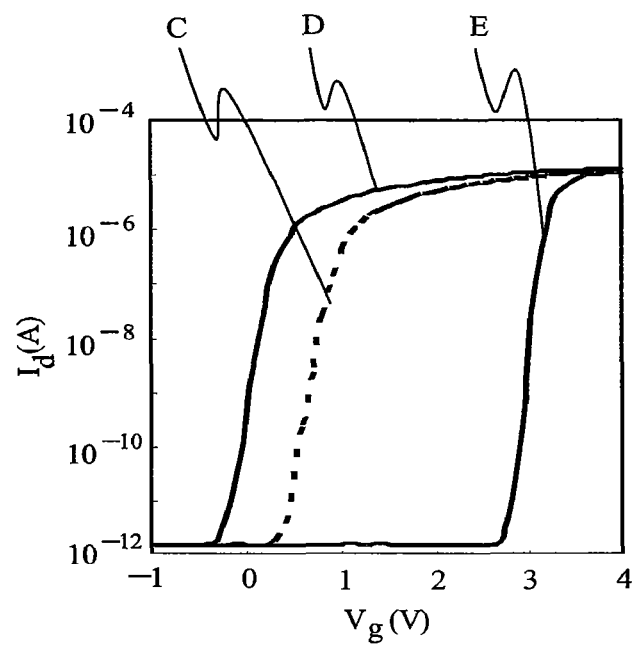
FIG. 47A is a graph showing Vg-Id characteristics of a transistor of a laminated gate MONOS in an initial stage, and in completion of writing and erasing.
Figure 47B:
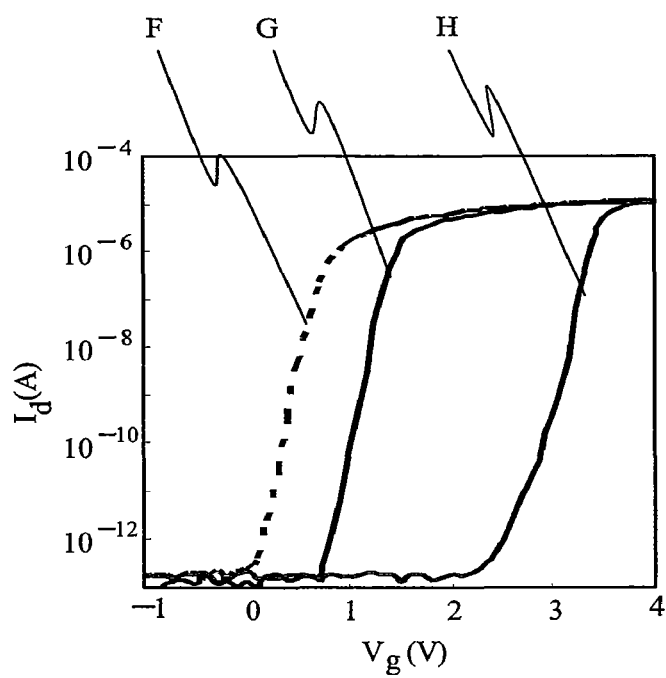
FIG. 47B is a graph showing Vg-Id characteristics of a transistor of a single layer gate MONOS in an initial stage, and in completion of writing and erasing.

FIGS. 47A and 47B are graphs showing writing/erasing characteristics of MONOS having a gate electrode comprising a p-type polysilicon single layer film and MONOS having a laminated gate electrode which is formed under the above conditions. Curves "C", "D", and "E" in FIG. 47A are Vg-Id characteristics of a transistor in an initial stage of the laminated gate MONOS, and after writing and erasing operations, respectively. Curves "F", "G", and "H" in FIG. 47B are Vg-Id characteristics of a transistor in an initial stage of the single layer gate MONOS, after writing thereof, and after erasing thereof, respectively.

Figure 48:
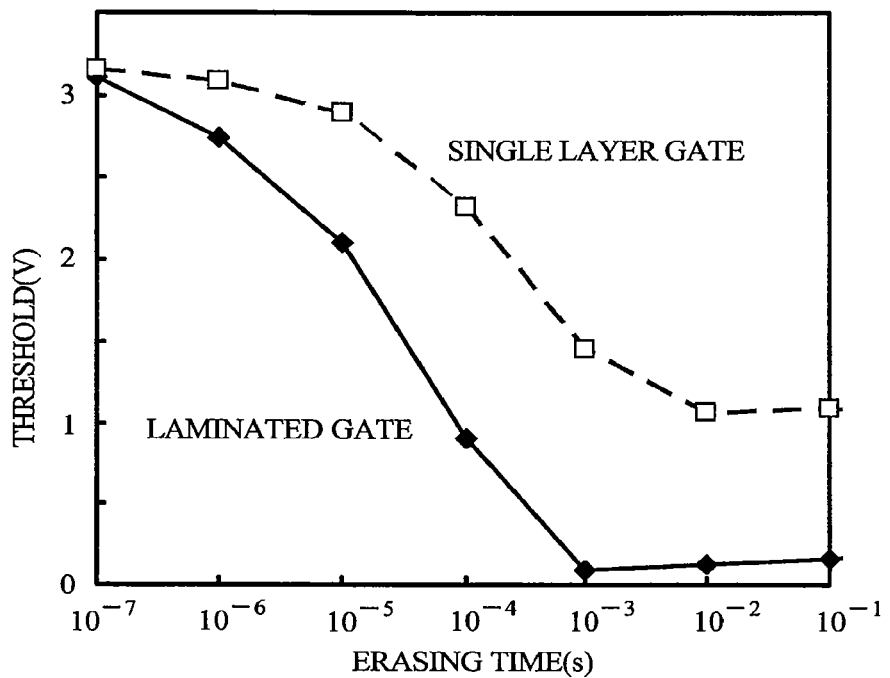
FIG. 48 is a graph showing time dependence of threshold fluctuation from a write state to an erase state when a positive voltage is applied to a gate electrode in MONOS.

FIG. 48 is a graph showing a time dependency of a change in threshold during a time period from a write state to an erase state when applying a positive voltage to the gate electrode in the MONOS. A solid line shows a change in threshold of MONOS having a laminated gate electrode, and a broken line shows a change in threshold of MONOS having a single layer gate electrode.

Figure 49:
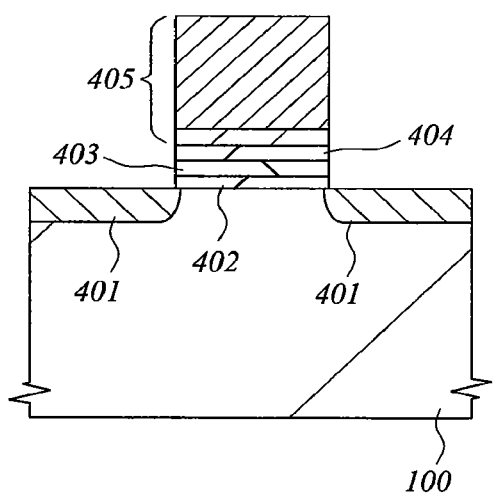
FIG. 49 is a sectional view of MONOS having a laminated layer gate electrode.

FIG. 49 is a sectional view of MONOS having a laminated layer gate electrode. In FIG. 49, a reference numeral 100 denotes a silicon substrate, 401 denotes an n-type diffusion layer (a source or a drain), 402 denotes a silicon oxide film with a film thickness of 4 nm, 403 denotes a silicon nitride film with a film thickness of 5 nm, and 404 denotes a silicon oxynitride film with a film thickness of 5 nm. A reference numeral 405 denotes a laminated gate electrode manufactured by the above-mentioned manufacturing method and condition for a sample of the SIMS analysis. This laminated gate electrode is treated for activation by laser anneal together with diffusion layers at the same time.

From FIG. 48 and FIG. 49, it is understood that an amount of injected holes of the laminated gate MONOS at an erasing time is more than that of the single layer gate MONOS and a rate of erasing of the former is faster than that of the latter by about 100 times. Thus, formation of the laminated layer gate electrode conducted by laser anneal is very useful in the implementation of the present invention. It is also effective to exclude processes requiring high temperatures as much as possible after activation of a gate electrode by laser anneal.

Thus, in the present embodiment and following embodiments, a process for activating a laminated gate electrode of a memory cell by using laser anneal and examples of a manufacturing method in consideration of how to match with the process are shown.

A manufacturing method explained in the present embodiment is to form a one-transistor (NROM) type memory cell having a laminated layer gate electrode comprising a non-doped polysilicon film and a p-type polysilicon film and a CMOS peripheral circuit on the same silicon substrate. In the following respective figures, left side thereof is sectional view of memory cell region, and right side thereof is sectional view of peripheral circuit region.

Figure 50:
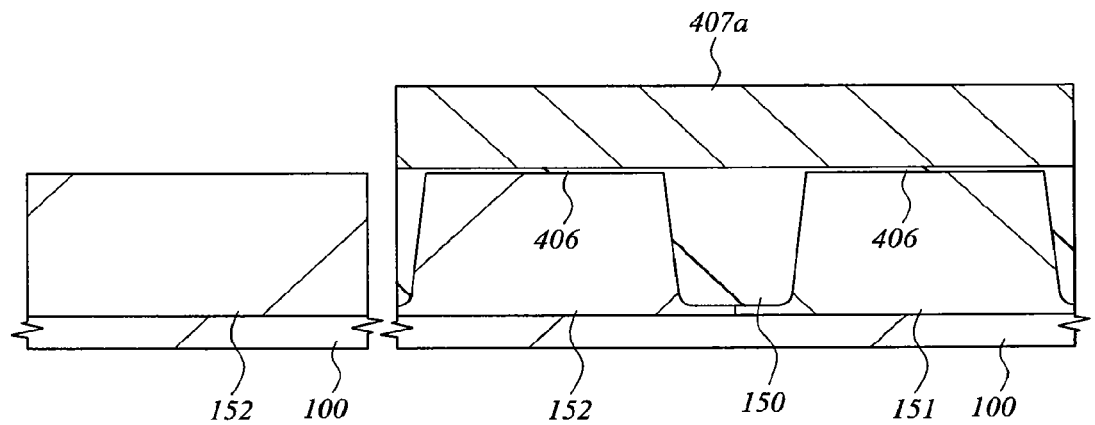
FIG. 50 is a sectional view showing a manufacturing method for a memory cell and a peripheral circuit of a ninth embodiment.

As shown in FIG. 50, a gate oxide film 406 of a CMOS transistor is first formed on a surface of a silicon substrate 100 in which a device isolation region 150, an n-type well 151, and a p-type well 152 are formed by a well-known method. That is, the gate oxide film 406 is formed by thermally oxidizing the surface of the silicon substrate 100 to have a film thickness of about 3 nm. Subsequently, after a non-doped polysilicon film 407a with a film thickness of about 150 nm is deposited on the gate oxide film 406 by CVD process, the non-doped polysilicon film 407a and the gate oxide film 406 on a memory cell region are removed by dry etching, wet etching, or wet cleaning.

Figure 51:
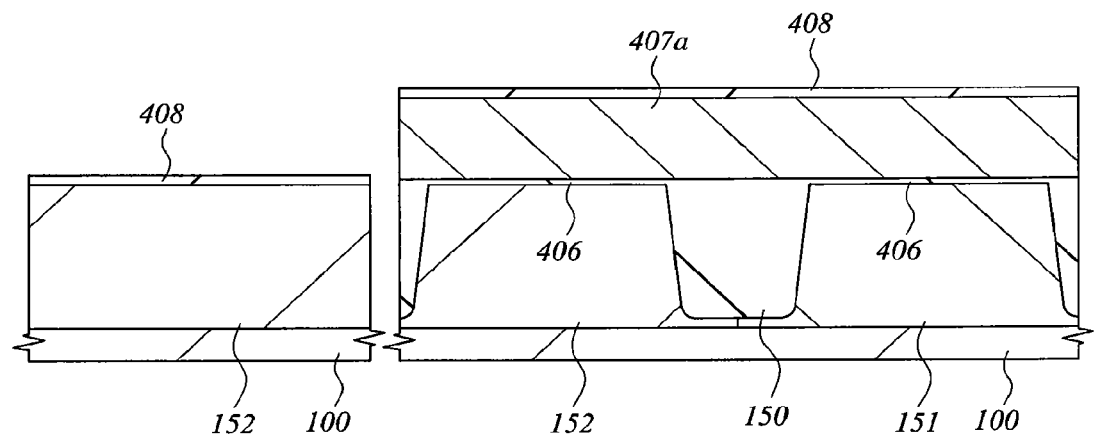
FIG. 51 is a sectional view showing a manufacturing method for the memory cell and the peripheral circuit continued from FIG. 50.

Next, as shown in FIG. 51, a gate insulating film 408 of a memory cell having a charge accumulation portion and a barrier film is deposited. For example, the gate insulating film 408 may be a silicon oxide film, a silicon nitride film, a silicon oxynitride film, or a laminated film made thereof. Also, the charge accumulation layer may be a high-k trap film, a polysilicon floating gate, or other configurations having a charge accumulation layer. Here, for example, a laminated film comprising a silicon oxide film with a film thickness of 4 nm, a silicon oxide film with a film thickness of 5 nm, and a silicon oxynitride film with a film thickness of 5 nm is deposited by CVD process.

Figure 52:
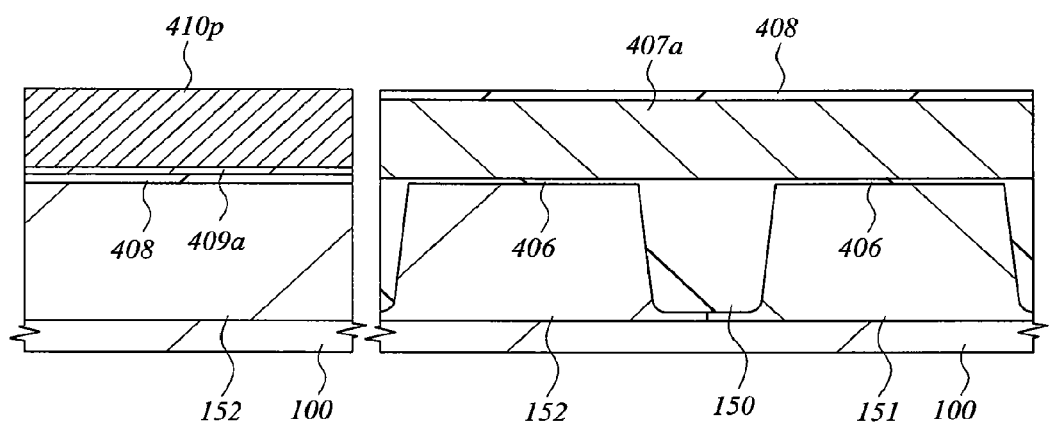
FIG. 52 is a sectional view showing a manufacturing method for the memory cell and the peripheral circuit continued from FIG. 51.

Next, as shown in FIG. 52, after a non-doped amorphous silicon film 409a or an amorphous silicon film 409a with a low impurity concentration is deposited on the gate insulating film 408 by CVD process, thermal treatment is performed at a temperature of 900° C. for about 30 minutes in $N_2$ atmosphere. The thermal treatment is performed for changing amorphous silicon into polysilicon, and therefore, boron is more effectively prevented from diffusing into the amorphous silicon film 409a at a later laser anneal. It is desirable that the impurity concentration in the amorphous silicon film 409a is one digit lower than that in a p-type polysilicon film deposited on the amorphous silicon film 409a. It is also desirable that the film thickness of the amorphous silicon film 409a is 6 nm or less. Even if the thickness is 6 nm or more, an effect can be obtained to some extent, but when the thickness is excessively thick, depletion of the gate electrode is grown at a reading time, so that a read characteristic is degraded.

Next, after a p-type polysilicon film 410p with a film thickness of about 150 nm is deposited on the amorphous silicon film 409a, the p-type polysilicon film 410p and the amorphous silicon film 409a on the peripheral circuit region are removed by dry etching, wet etching, or wet cleaning.

Figure 53:
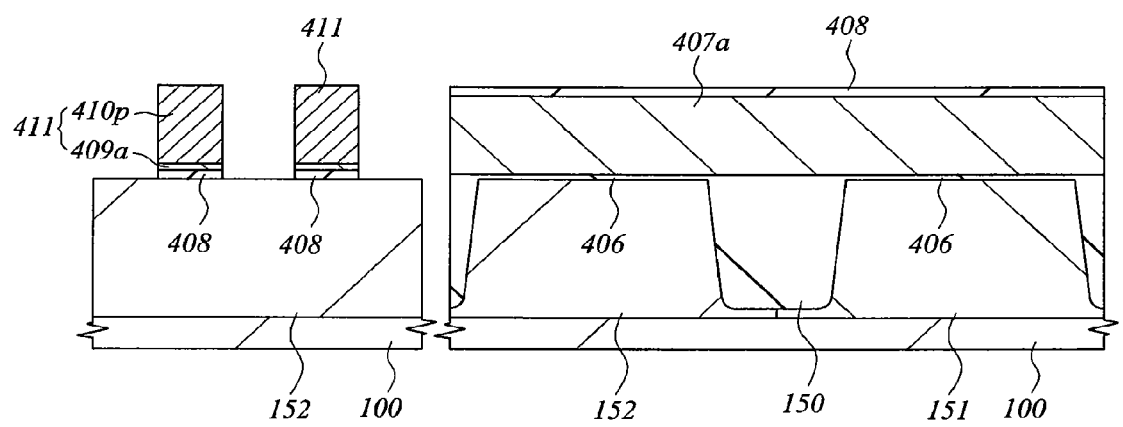
FIG. 53 is a sectional view showing a manufacturing method for the memory cell and the peripheral circuit continued from FIG. 52.

Next, as shown in FIG. 53, a gate electrode 411 of the memory cell comprising a laminated layer made of the amorphous silicon film 409a and the p-type polysilicon film 410p is formed by patterning the p-type polysilicon film 410p, the amorphous silicon film 409a, and the gate insulating film 408 on the memory cell region by dry etching.

Figure 54:
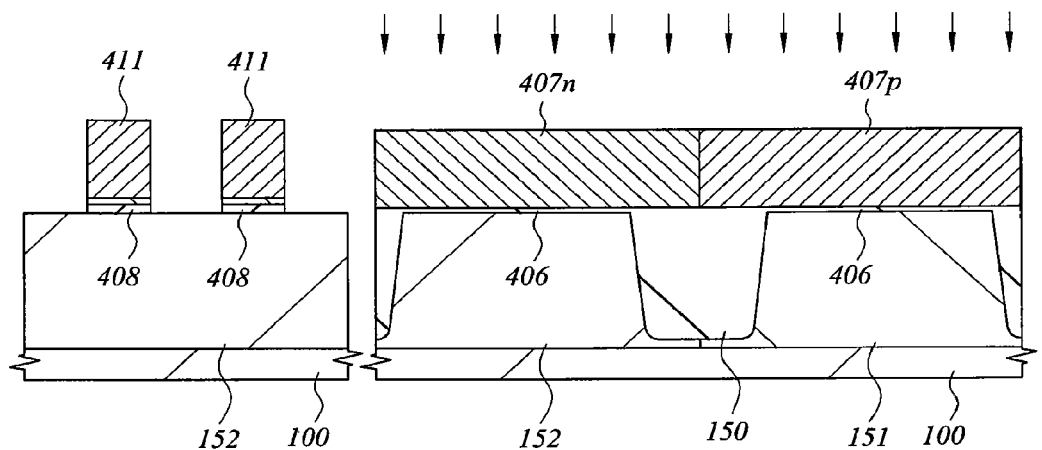
FIG. 54 is a sectional view showing a manufacturing method for the memory cell and the peripheral circuit continued from FIG. 53.

Next, the gate insulating film 408 deposited on the non-doped polysilicon film 407a on the peripheral circuit region is removed. Thereafter, as shown in FIG. 54, the non-doped polysilicon film 407a on an n-MOS transistor formation region is changed, by ion-implanting phosphorus therein, to an n-type polysilicon 407n, and also the non-doped polysilicon film 407a on a p-MOS transistor formation region is changed, by ion-implanting boron therein, to a p-type polysilicon film 407p. The implantation energy of phosphorus is set to about 10 Kev and the dose amount is set to about $6\times10^{15}/cm^2$. Also, the implantation energy of boron is set to about 5 Kev and the dose amount is set to about $4\times10^{15}/cm^2$.

Figure 55:
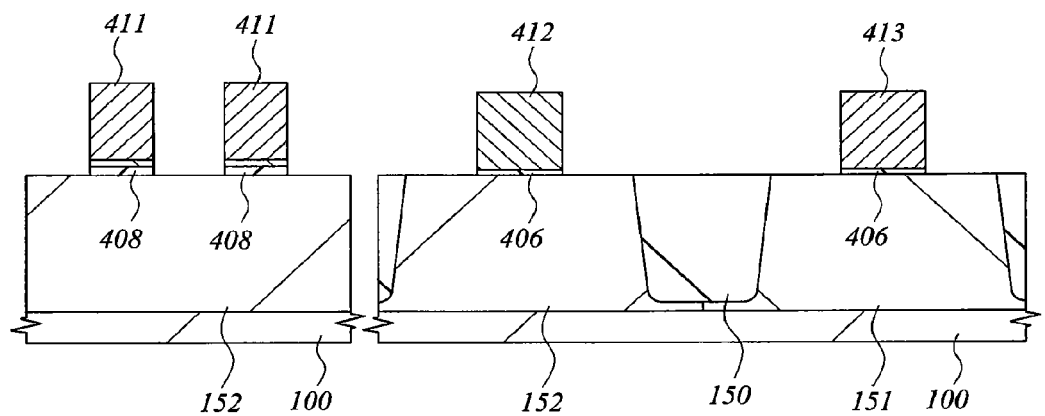
FIG. 55 is a sectional view showing a manufacturing method for the memory cell and the peripheral circuit continued from FIG. 54.

Next, as shown in FIG. 55, a gate electrode 412 of the n-MOS transistor and a gate electrode 413 of the p-MOS transistor are formed by patterning the n-type polysilicon film 407n, the p-type polysilicon film 407p, and the gate oxide film 406 by using dry etching.

Next, in order to form each of diffusion layers (source and drain) of the memory cell, the n-MOS transistor, and the p-MOS transistor, arsenic is ion-implanted into a p-type well 152 on the memory cell region and also a p-type well 152 on the peripheral circuit region, and boron is ion-implanted into the n-type well 151 on the peripheral circuit region, and after that, these impurities are activated, for example, by laser anneal at a temperature of 1200° C. for 800 μsec. At the same time, activation of impurities implanted into the gate electrodes 411, 412, and 413 is also performed.

Since the CMOS peripheral circuit is required to operate at a high speed, it is necessary to form silicide layers on surfaces of diffusion layers (source and drain) later. However, since the activation by laser anneal causes only a small diffusion of impurities, only shallow diffusion layers are formed. If a silicide layer is formed on a surface of the shallow diffusion layer, it causes a junction leakage in a MOS transistor. Therefore, a diffusion layer in a peripheral circuit region is made deeper by implanting impurities therein in multi-stage manner, and then activation is performed by laser anneal so as to form a deeper diffusion layer even by using laser anneal for activation.

For example, when arsenic is ion-implanted, a diffusion layer with a depth of about 40 to 50 nm can be formed after activation by performing three stage implantations of (1) implantation energy=5 KeV and dose amount=$1\times10^{15}/cm^2$, (2) implantation energy=15 KeV and dose amount=$2\times10^{15}/cm^2$, and (3) implantation energy=30 KeV and dose amount=$1\times10^{15}/cm^2$. Accordingly, when the thickness of the silicide layer is set to 20 nm or less, the silicide does not penetrate the diffusion layer, so that a normal transistor operation is made possible. Thus, it is desirable that the CMOS peripheral circuit has a diffusion layer deeper than that of the memory cell and a high impurity concentration of the diffusion layer. However, in order to simplify the process, the diffusion layer of the p-type well 152 of the memory cell region may be formed deeply by implanting arsenic in a multi-stage manner, or a silicide layer may also be formed on a surface of the diffusion layer of the memory cell.

Incidentally, when arsenic is ion-implanted into the p-type well 152 of the memory cell, arsenic is also ion-implanted in a surface of the gate electrode 411 (a p-type polysilicon film 410*p*), so that a p-n junction is formed in the gate electrode 411 of the memory cell when the concentration of arsenic becomes high. Accordingly, it is desirable that the concentration of arsenic to be ion-implanted into the p-type well 152 of the memory cell region is made lower than that of arsenic to be ion-implanted into the p-type well 152 on the peripheral circuit region. Alternatively, such a process can be adopted that, after the p-type polysilicon film 410*p* is deposited at the step shown in FIG. 52, a silicon oxide film is deposited on a surface of the p-type polysilicon film 410*p*, and the silicon oxide film is removed after ion-implantation for formation of diffusion layer is performed.

Figure 56:
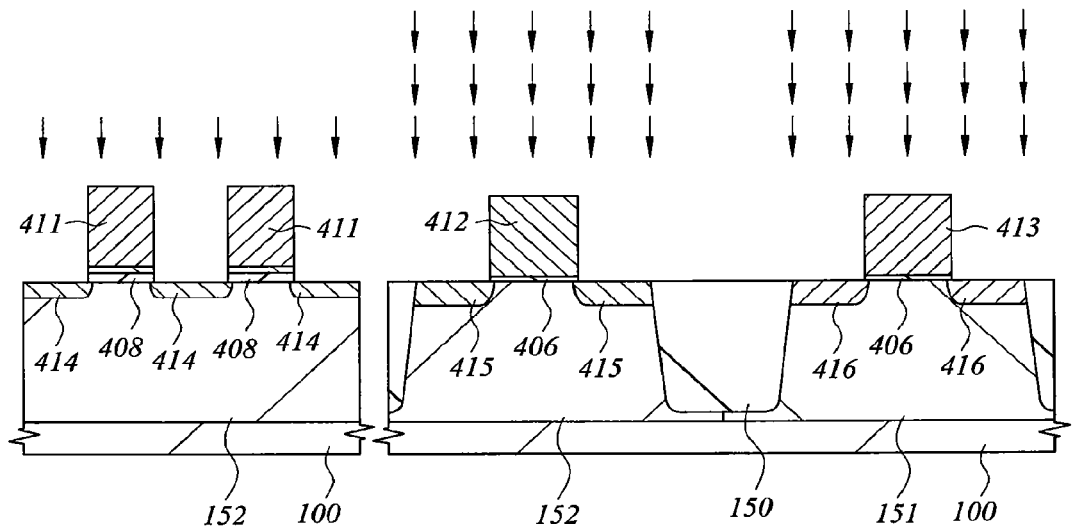
FIG. 56 is a sectional view showing a manufacturing method for the memory cell and the peripheral circuit continued from FIG. 55.

As shown in FIG. 56, through the preceding steps, the n-type diffusion layers 414 (source and drain) of the memory cell are formed in the p-type well 152 of the memory cell region. In addition, the n-type diffusion layers 415 (source and drain) of the n-MOS transistor are formed in the p-type well 152 on the peripheral circuit region and the p-type diffusion layers 416 (source and drain) of the p-type transistor are formed in the n-type well 151.

Figure 57:
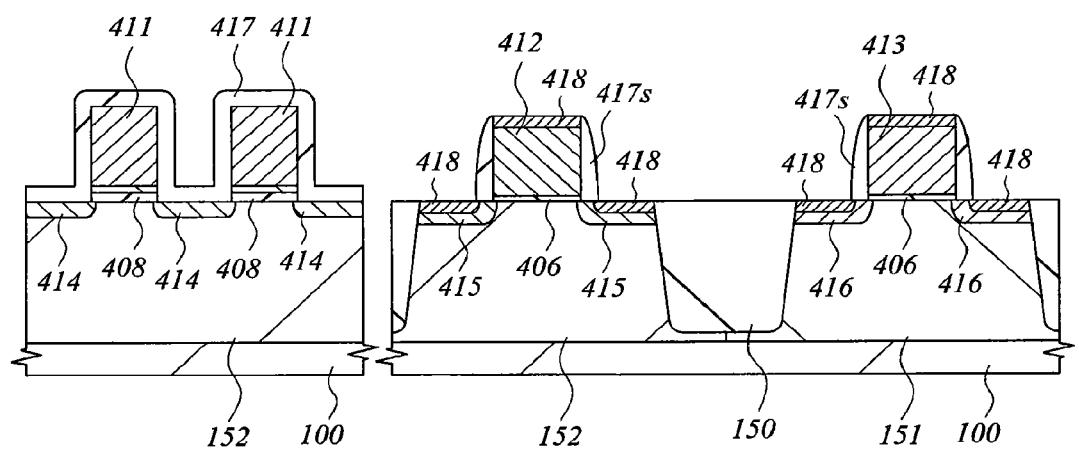
FIG. 57 is a sectional view showing a manufacturing method for the memory cell and the peripheral circuit continued from FIG. 56.

Next, as shown in FIG. 57, a silicon oxide film 417 with a film thickness of about 50 to 100 nm is deposited and side wall spacers 417*s* are then formed on side walls of the gate electrodes 412 and 413 by dry-etching the silicon oxide film 417 on the peripheral circuit region. Thereafter, silicide layers 418 made of Co silicide are formed on respective surfaces of the gate electrodes 412 and 413, the n-type diffusion layer 415, and the p-type diffusion layer 416 of the CMOS peripheral circuit. Incidentally, as described above, silicide layers 418 may be formed on respective surfaces of the gate electrode 411 and the n-type diffusion layer 414 of the memory cell.

Thus, the n-type diffusion layer 415 and the p-type diffusion layer 416 of the CMOS peripheral circuit are formed deeper than the n-type diffusion layer 414 of the memory cell, whereby the silicide layer 418 can be prevented from penetrating them. Therefore, a memory cell realizing a hole injection from a gate at a high efficiency and a CMOS peripheral circuit realizing a high-speed operation can be manufactured on the same silicon substrate 100.

Tenth Embodiment

In the ninth embodiment, the deep diffusion layer is formed by multi-stage implantation of impurities so that the silicide layer does not penetrate the diffusion layer. In the present embodiment, a CMOS peripheral circuit having a deep diffusion layer is formed by a process in which an ion-implantation for a diffusion layer is performed before a laminated gate electrode of a memory cell is formed, and a gate electrode of the memory cell is formed after activation of the diffusion layer is performed by RTA.

Figure 58:
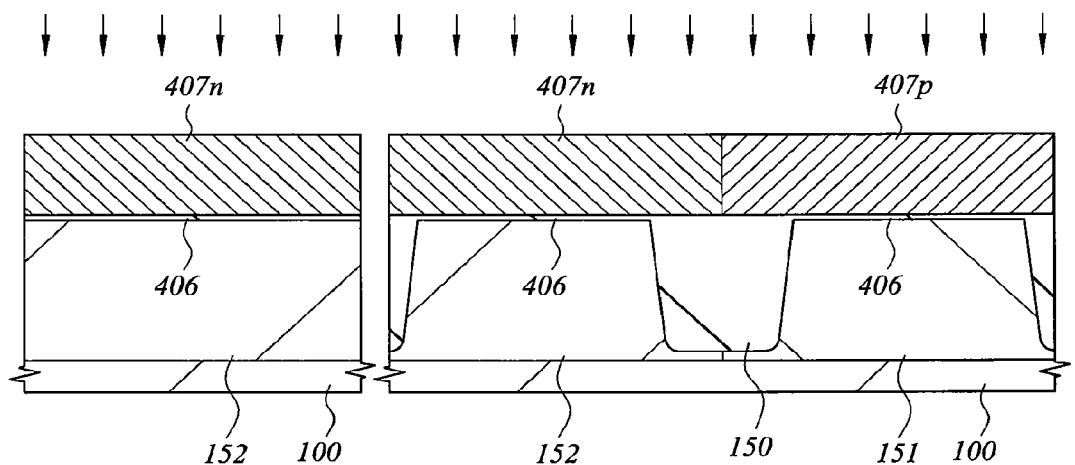
FIG. 58 is a sectional view showing a manufacturing method for memory cell and a peripheral circuit of a tenth embodiment.

As shown in FIG. 58, a gate oxide film 406 for a CMOS transistor is first formed on a surface of a silicon substrate 100 in which a device isolation region 150, an n-type well 151, and a p-type well 152 are formed. The film thickness of the gate oxide film 406 is set to about 3 nm. Subsequently, after a non-doped polysilicon film (not shown) with a film thickness of about 150 nm is deposited on the gate oxide film 406 by CVD process, phosphorus is ion-implanted into the non-doped polysilicon film on a memory cell region and the non-doped polysilicon film on an n-MOS transistor formation region to form n-type polysilicon films 407*n*, and boron is ion-implanted into the non-doped polysilicon film on a p-MOS formation region to form a p-type polysilicon film 407*p*. The implantation energy of phosphorus is set to about 10 KeV and the dose amount thereof is set to about $6\times10^{15}/cm^2$. The implantation energy of boron is set to about 5 KeV and the dose amount thereof is set to about $4\times10^{15}/cm^2$.

Figure 59:
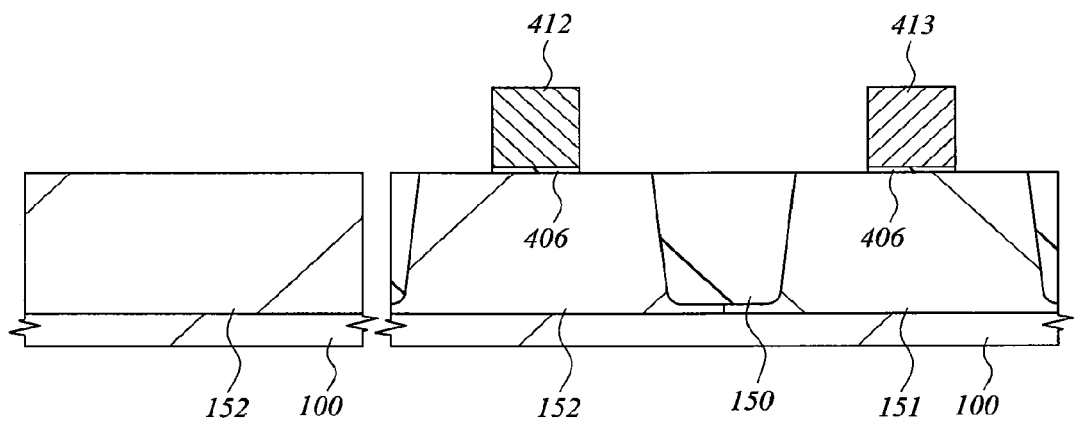
FIG. 59 is a sectional view showing a manufacturing method for the memory cell and the peripheral circuit continued from FIG. 58.

Next, after the non-doped polysilicon film and the gate oxide film 406 on the memory cell region are removed, a gate electrode 412 of an n-MOS transistor and a gate electrode 413 of a p-MOS transistor are formed by patterning the n-type polysilicon films 407*n*, the p-type polysilicon film 407*p*, and the gate oxide film 406, as shown in FIG. 59.

Figure 60:
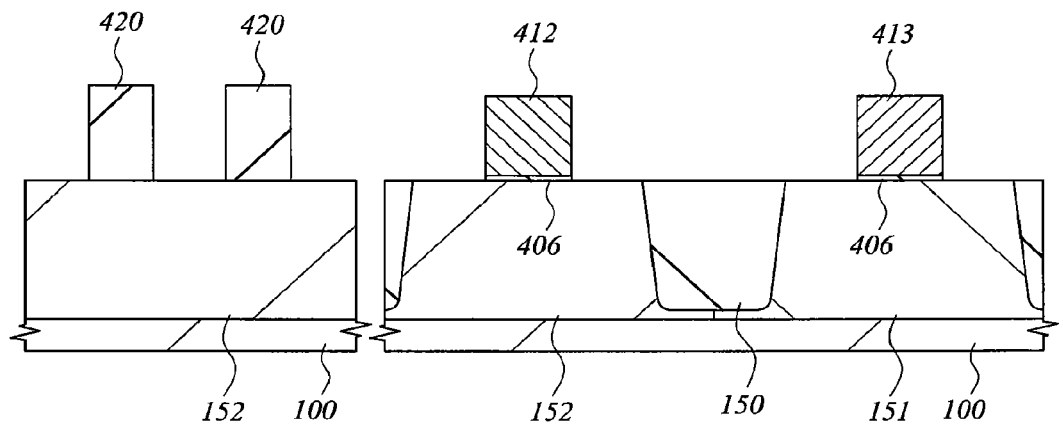
FIG. 60 is a sectional view showing a manufacturing method for the memory cell and the peripheral circuit continued from FIG. 59.
Figure 61:
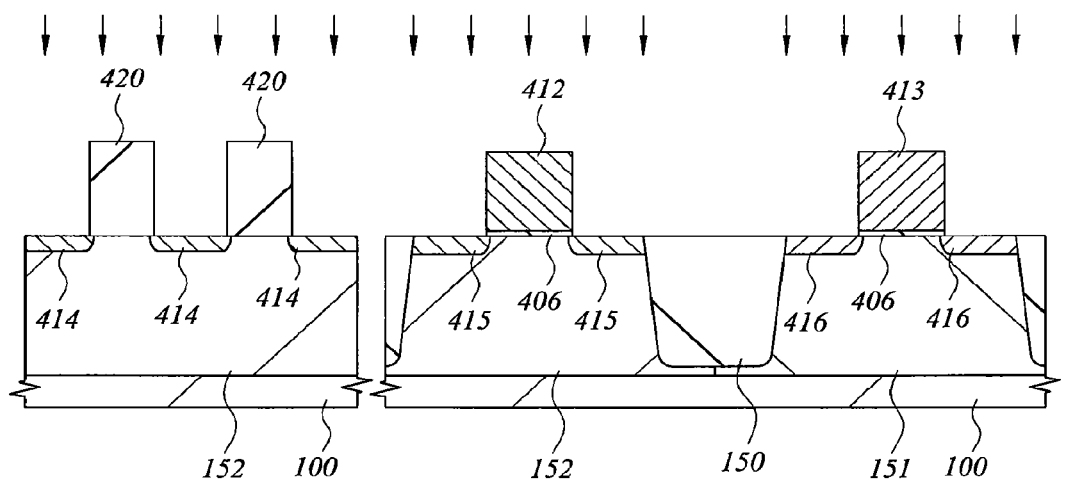
FIG. 61 is a sectional view showing a manufacturing method for the memory cell and the peripheral circuit continued from FIG. 60.

Next, as shown in FIG. 60, after a photoresist film 420 having the same shape as the gate electrode is formed in a region where a gate electrode of the memory cell is formed at a later step, as shown in FIG. 61, ion-implantation of impurities is performed in order to form respective diffusion layers (source and drain) of the memory cell, the n-MOS transistor, and the p-MOS transistor. At this time, arsenic is ion-implanted into the p-type well 152 on the memory cell region under the conditions of the implantation energy=25 KeV and the dose amount=$1\times10^{15}/cm^2$. Arsenic is ion-implanted into the p-type well 152 on the peripheral circuit region under the conditions of the implantation energy=40 KeV and the dose amount=$4\times10^{15}/cm^2$, and boron is ion-implanted into the n-type well 151 under the conditions of the implantation energy=10 KeV and the dose amount=$2\times10^{15}/cm^2$. At this time, a wider impurity profile in a depth direction of the silicon substrate 100 may be formed in order to form a deeper diffusion layer by performing the ion-implantation in the multi-stage manner. Especially, it is desirable that a CMOS transistor requiring a silicide layer for realizing a high-speed operation has a deeper diffusion layer and a higher impurity concentration than those of the diffusion layer of the memory cell.

Next, activation treatment of the above-mentioned impurities is performed by RTA, whereby n-type diffusion layers 414 (source and drain) of the memory cell are formed in the p-type well 152 on the memory cell region. Also, the n-type diffusion layers 415 (source and drain) of the n-MOS transistor are formed in the p-type well 152 on the peripheral circuit region, and p-type diffusion layers 416 (source and drain) of the p-MOS transistor are formed in the n-type well 151.

Figure 62:
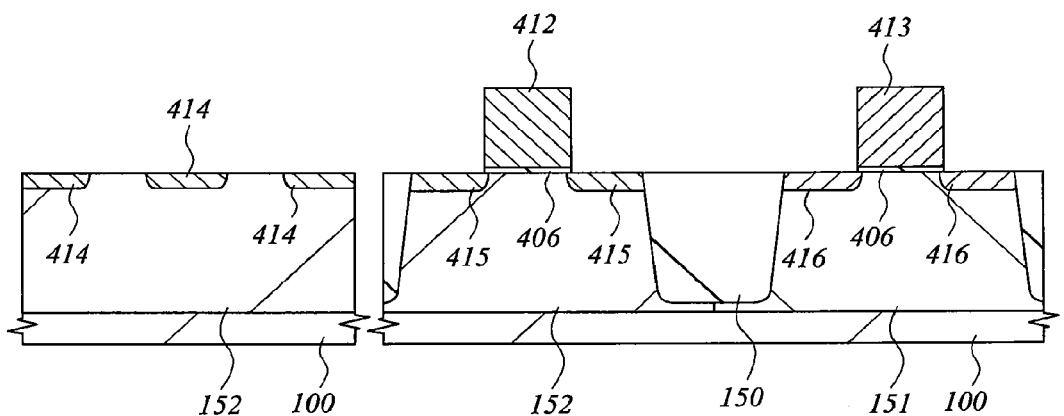
FIG. 62 is a sectional view showing a manufacturing method for the memory cell and the peripheral circuit continued from FIG. 61.
Figure 63:
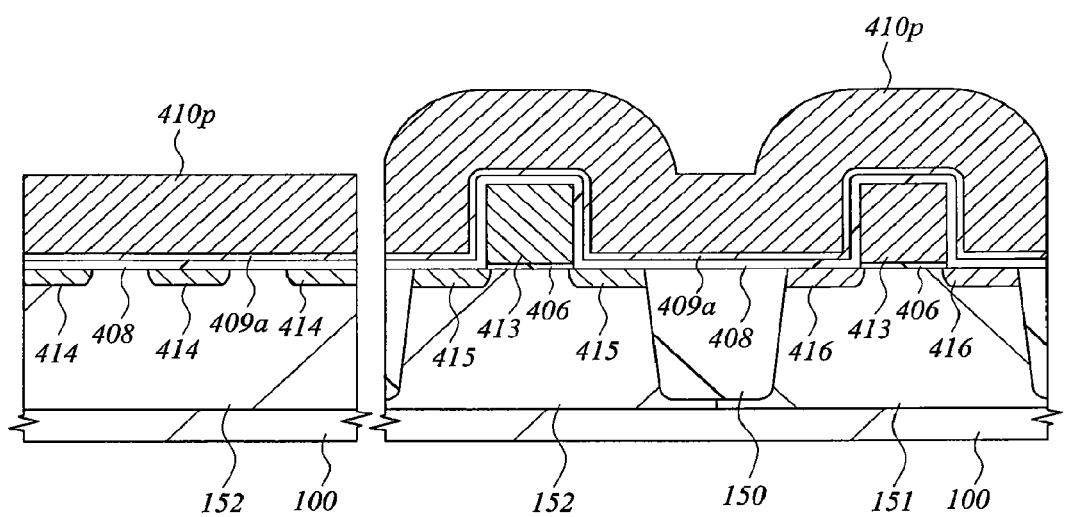
FIG. 63 is a sectional view showing a manufacturing method for the memory cell and the peripheral circuit continued from FIG. 62.

Next, as shown in FIG. 62, after the photoresist film 420 on the memory region is removed, a gate insulating film 408 of the memory cell having a charge accumulation portion and a barrier film is deposited as shown in FIG. 63. The gate insulating film 408 may be, for example, a silicon oxide film, a silicon nitride film, a silicon oxynitride film, or a laminated film made thereof. The charge accumulation film may be a high-k trap film or a polysilicon floating gate, or other configurations having a charge accumulation layer. Here, for example, a laminated film comprising a silicon oxide film with a film thickness of 4 nm, a silicon oxide film with a film thickness of 5 nm, and a silicon oxynitride film with a film thickness of 5 nm is deposited by CVD process.

Next, a non-doped amorphous silicon film 409a or an amorphous silicon film 409a with a low impurity concentration is deposited on the gate insulating film 408. Thermal treatment is then performed at a temperature of 900° C. for about 30 minutes in $N_2$ atmosphere. Thereafter, a p-type polysilicon film 410p with a film thickness of about 150 nm is deposited on the amorphous silicon film 409a. It is desirable that the impurity concentration of the amorphous silicon film 409a is one or more orders of magnitude lower than that of the p-type polysilicon film 410p like the ninth embodiment. It is also desirable that the film thickness of the amorphous silicon film 409a is 6 nm or less.

Figure 64:
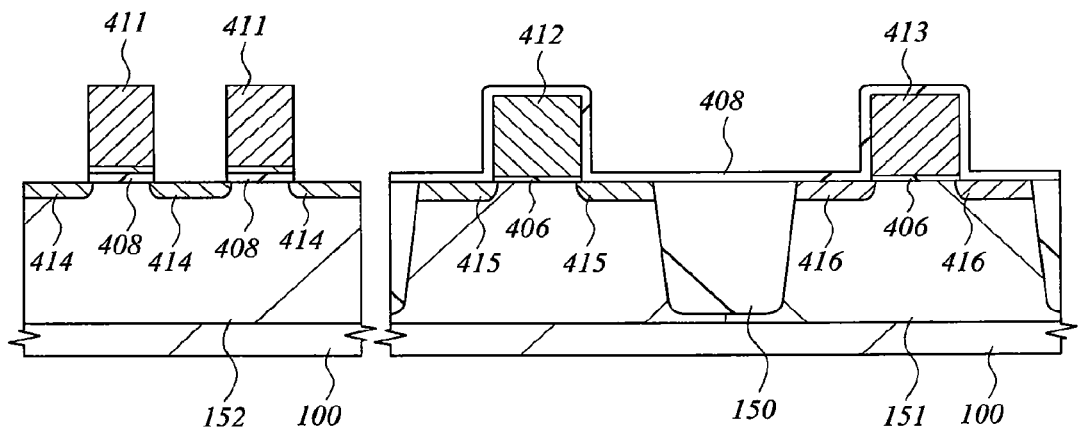
FIG. 64 is a sectional view showing a manufacturing method for the memory cell and the peripheral circuit continued from FIG. 63.

Next, as shown in FIG. 64, after the p-type polysilicon film 410p and the amorphous silicon film 409a on the peripheral circuit region are removed, a gate electrode 411 of the memory cell comprising a laminated film made of the amorphous silicon film 409a and the p-type polysilicon film 410p is formed by patterning the p-type polysilicon film 410p, the amorphous silicon film 409a, and the gate insulating film 408 on the memory cell region by dry etching.

Figure 65:
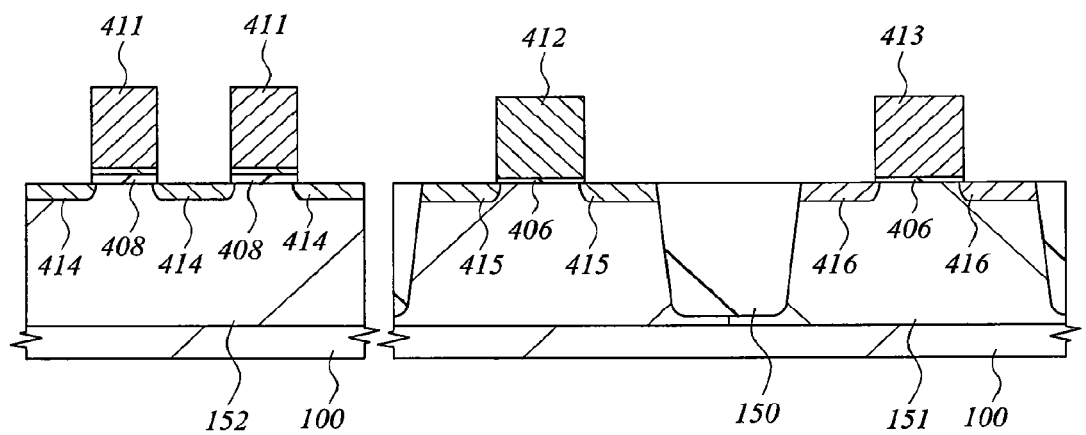
FIG. 65 is a sectional view showing a manufacturing method for the memory cell and the peripheral circuit continued from FIG. 64.
Figure 66:
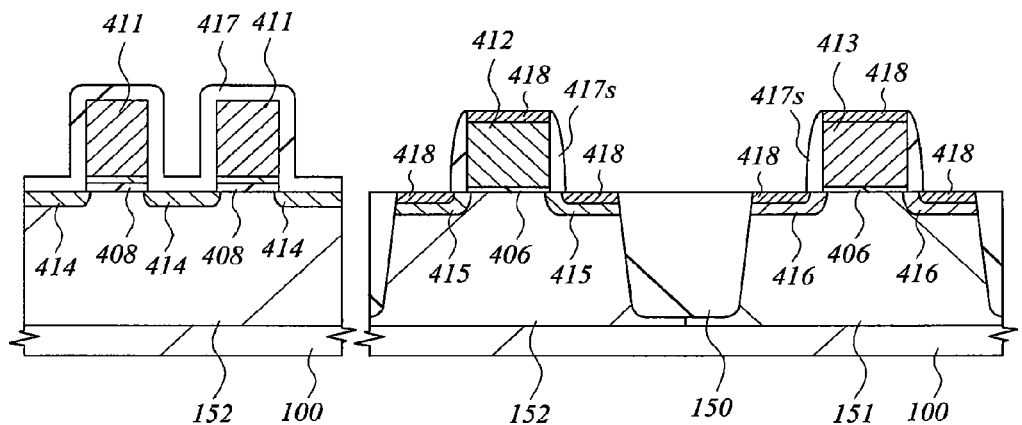
FIG. 66 is a sectional view showing a manufacturing method for the memory cell and the peripheral circuit continued from FIG. 65.

Next, as shown in FIG. 65, after the gate insulating film 408 on the peripheral circuit region is removed, as shown in FIG. 66, a silicon oxide film 417 is deposited by the same method as used in the ninth embodiment. After side wall spacers 417s are formed on side walls of the gate electrodes 412 and 413 by dry-etching the silicon oxide film 417 on the peripheral circuit region, silicide layers 418 are formed on respective surfaces of the gate electrodes 412 and 413, the n-type diffusion layer 415, and the p-type diffusion layer 416 on the CMOS peripheral circuit.

Thus, by forming the n-type diffusion layer 415 and the p-type diffusion layer 416 on the CMOS peripheral circuit to be deeper than the n-type diffusion layer 414 of the memory cell, the silicide layer 418 can be prevented from penetrating so that a memory cell realizing a hole injection from a gate at a high efficiency and a CMOS peripheral circuit realizing a high-speed operation can be manufactured on the same silicon substrate 100.

According to the present embodiment, since the diffusion layer 414 is formed before the gate electrode 411 of the memory cell is formed, even if the impurity concentration in the diffusion layer 414 is made higher, no p-n junction is formed in the gate electrode 411.

Eleventh Embodiment

In the present embodiment, a manufacturing method of forming a split gate type memory cell and a CMOS peripheral circuit as shown in the eighth embodiment on the same silicon substrate will be explained.

Figure 67:
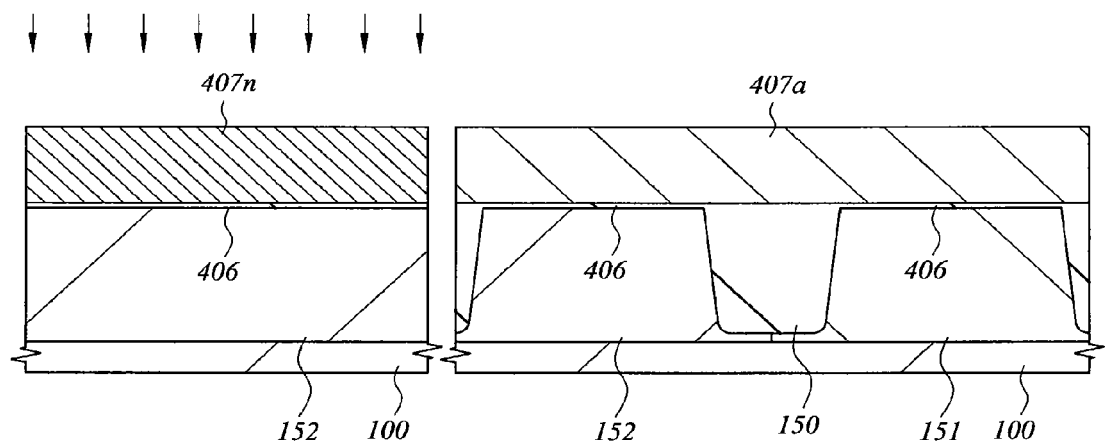
FIG. 67 is a sectional view showing a manufacturing method for a memory cell and a peripheral circuit of an eleventh embodiment.

As shown in FIG. 67, first, after a gate oxide film 406 with a film thickness of about 3 nm is formed on a surface of a silicon substrate 100 in which a device isolation region 150, an n-type well 151, and a p-type well 152 are formed, a non-doped polysilicon film 407a with a film thickness of about 150 nm is then deposited on the gate oxide film 406. Thereafter, phosphorus is ion-implanted into the non-doped polysilicon film 407a on the memory cell region to form an n-type polysilicon film 407n. The implantation energy of phosphorus is set to about 10 KeV and the dose amount thereof is set to about $6\times10^{15}/cm^2$.

Figure 68:
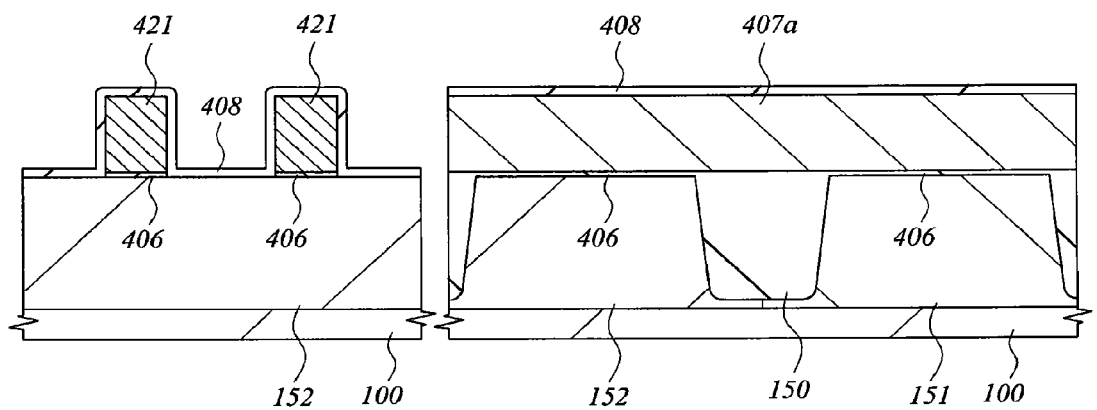
FIG. 68 is a sectional view showing a manufacturing method for the memory cell and the peripheral circuit continued from FIG. 67.

Next, as shown in FIG. 68, after a selection gate 421 is formed by patterning the n-type polysilicon film 407n and the gate oxide film 406 on the memory cell region, a gate insulating film 408 of the memory cell having a charge accumulation portion and a barrier film is deposited. The gate insulating film 408 is, for example, a laminated film comprising a silicon oxide film with a film thickness of 4 nm, a silicon oxide film with a film thickness of 5 nm, and a silicon oxynitride film with a film thickness of 5 nm. However, it may be made of other materials such as shown in the ninth and tenth embodiments.

Figure 69:
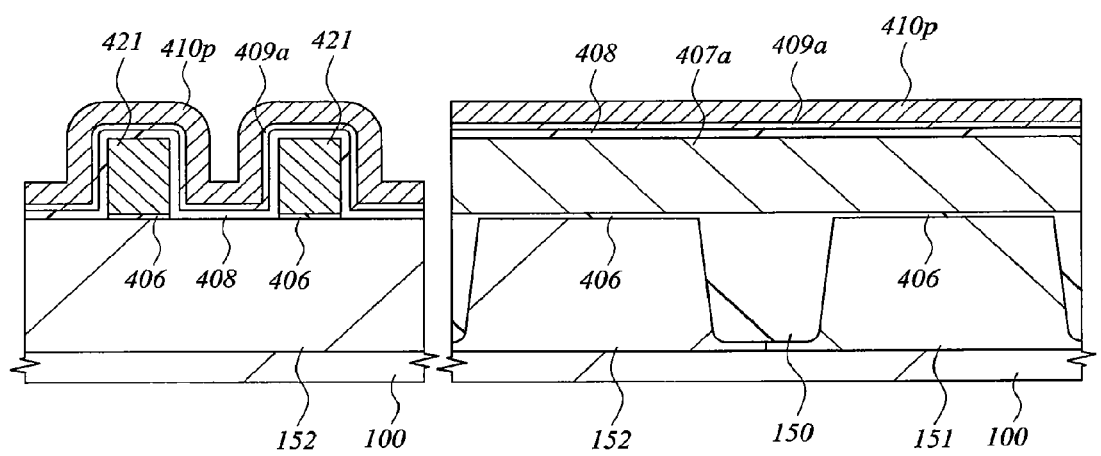
FIG. 69 is a sectional view showing a manufacturing method for the memory cell and the peripheral circuit continued from FIG. 68.

Next, as shown in FIG. 69, after a non-doped amorphous silicon film 409a or an amorphous silicon film 409a with a low impurity concentration is deposited on the gate insulating film 408 and thermal treatment is then performed at a temperature of 900° C. for about 30 minutes in $N_2$ atmosphere, a p-type polysilicon film 410p with a film thickness of about 150 nm is deposited on the amorphous silicon film 409a. It is desirable that the impurity concentration of the amorphous silicon film 409a is one digit lower than that of the p-type polysilicon film 410p like the ninth embodiment. It is also desirable that the film thickness of the amorphous silicon film 409a is 6 nm or less.

Figure 70:
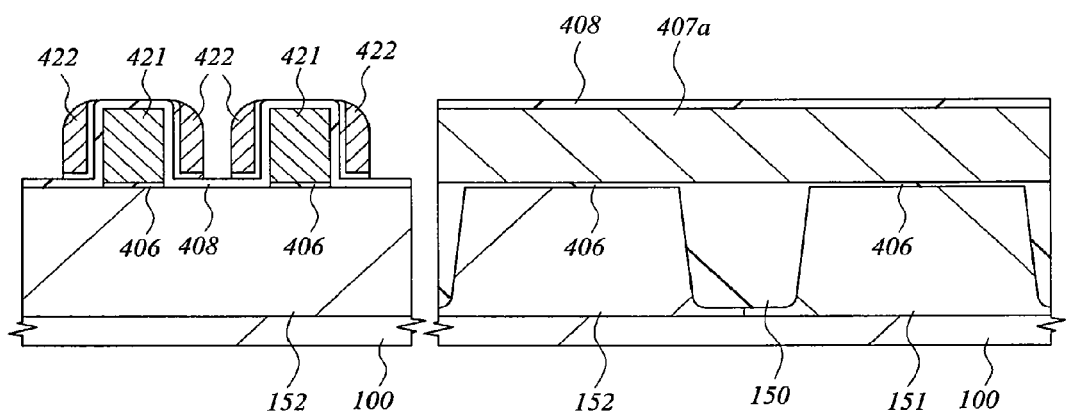
FIG. 70 is a sectional view showing a manufacturing method for the memory cell and the peripheral circuit continued from FIG. 69.

Next, as shown in FIG. 70, spacer-like memory gates 422 comprising a laminated layer film made of the amorphous silicon film 409a and the p-type polysilicon film 410p are formed by patterning the p-type polysilicon film 410p and the amorphous silicon film 409a on the memory cell region by dry etching.

Figure 71:
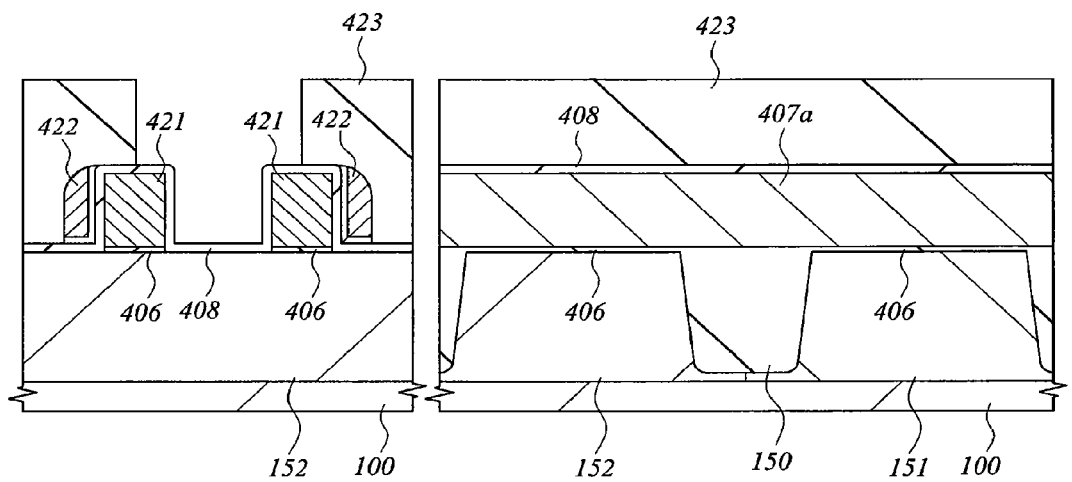
FIG. 71 is a sectional view showing a manufacturing method for the memory cell and the peripheral circuit continued from FIG. 70.

Next, as shown in FIG. 71, one of the memory gates 422 formed on both sides of the selection gate 421 is removed by dry-etching using a photoresist film 423 as a mask.

Figure 72:
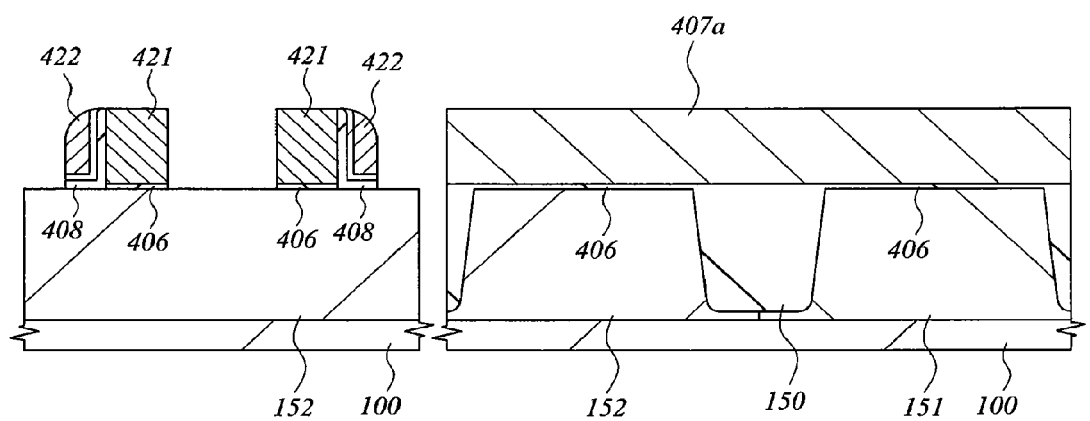
FIG. 72 is a sectional view showing a manufacturing method for the memory cell and the peripheral circuit continued from FIG. 71.

Next, as shown in FIG. 72, while the gate insulating film 408 is left on one of side walls of the selection gate 421 and under the memory gate 422, the gate insulating films 408 on the other regions are removed by etching.

Figure 73:
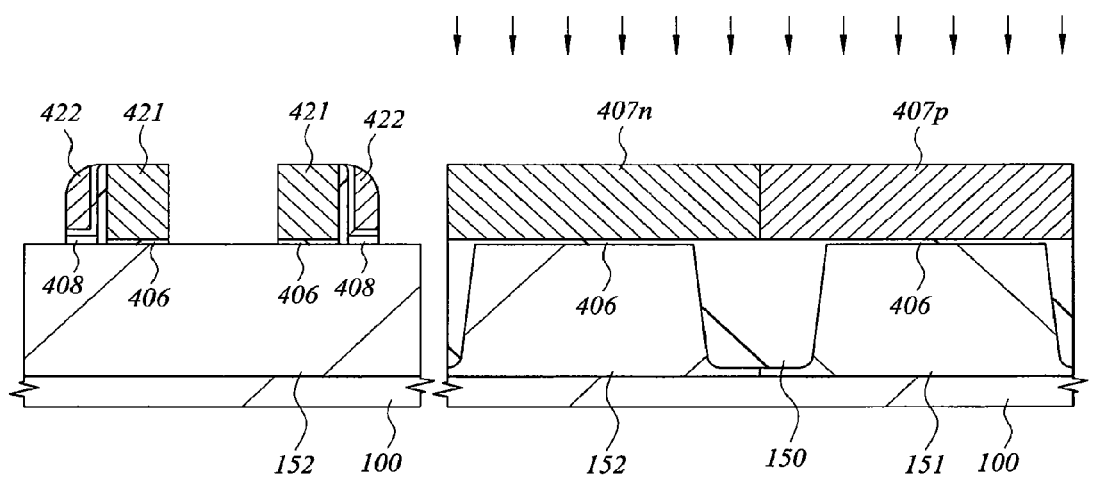
FIG. 73 is a sectional view showing a manufacturing method for the memory cell and the peripheral circuit continued from FIG. 72.

Next, as shown in FIG. 73, phosphorus is ion-implanted into the non-doped polysilicon film 407a on the n-MOS transistor formation region to form an n-type polysilicon film 407n. Also, born is ion-implanted into the non-doped polysilicon film 407a on the p-MOS formation region to form a p-type polysilicon film 407p. The implantation energy of phosphorus is set to about 10 KeV and the dose amount thereof is set to about $6\times10^{15}/cm^2$. The implantation energy of boron is set to about 5 KeV and the dose amount thereof is set to about $4\times10^{15}/cm^2$.

Figure 74:
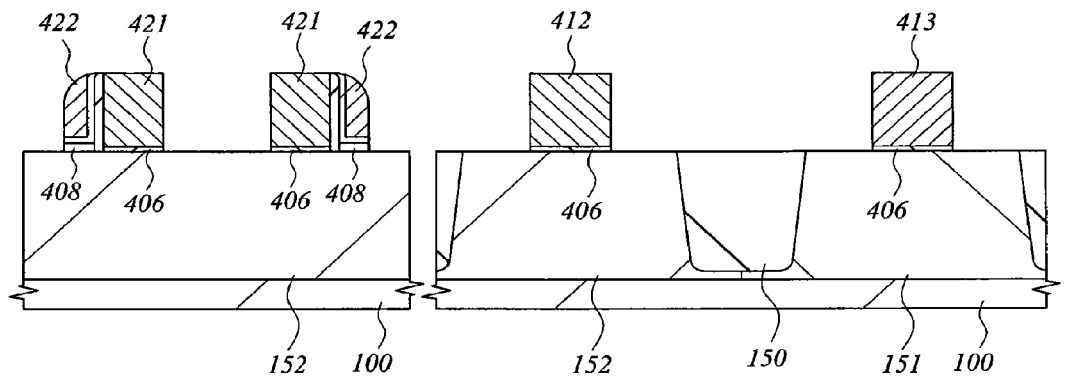
FIG. 74 is a sectional view showing a manufacturing method for the memory cell and the peripheral circuit continued from FIG. 73.

Next, as shown in FIG. 74, a gate electrode 412 of the n-MOS transistor and a gate electrode 413 of the p-MOS transistor are formed by patterning the n-type polysilicon film 407n, the p-type polysilicon film 407p, and the gate oxide film 406 by dry-etching.

Figure 75:
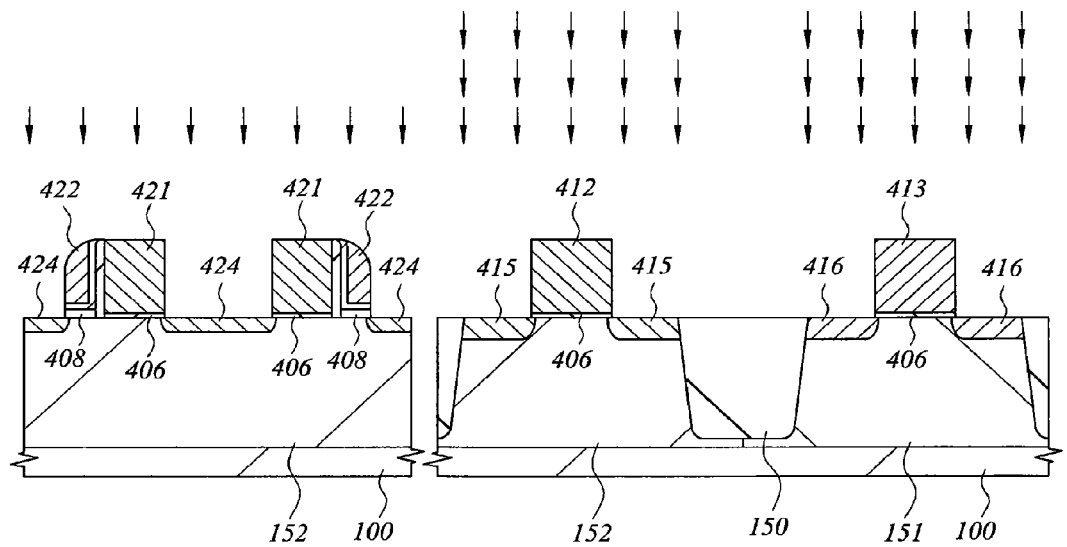
FIG. 75 is a sectional view showing a manufacturing method for the memory cell and the peripheral circuit continued from FIG. 74.

Next, as shown in FIG. 75, arsenic is ion-implanted into a p-type well 152 on the memory cell region and a p-type well 152 on the peripheral circuit region and boron is ion-implanted into an n-type well 151 on the peripheral circuit region in order to form respective diffusion layers (source and drain) of the memory cell, the n-MOS transistor, and the p-MOS transistor. Thereafter, these impurities are activated, for example, by laser anneal at a temperature of 1200° C. for 800 μsec like the ninth embodiment. At the same time, activation of impurities implanted into the gate electrodes 421, 412, and 413 is also performed.

Since the CMOS peripheral circuit is required to operate at a high speed, it is necessary to form silicide layers on surfaces of diffusion layers (source and drain) later. However, the activation by laser anneal causes only a small diffusion of impurities, so that only shallow diffusion layers are formed. If a silicide layer is formed on a surface of the shallow diffusion layer, it causes junction leakage in a MOS transistor. Therefore, the diffusion layer in a peripheral circuit region is made deeper by implanting impurities therein in multi-stage manner, and then activation is performed by laser anneal so as to form a deeper diffusion layer even by using laser anneal for activation.

For example, when arsenic is ion-implanted, the diffusion layer with a depth of about 40 to 50 nm can be formed after activation by performing three stage implantation of (1) the implantation energy=5 KeV and dose amount=$1\times10^{15}$/cm$^2$, (2) the implantation energy=15 KeV and the dose amount=$2\times 10^{15}$/cm$^2$, and (3) the implantation energy=30 KeV and the dose amount=$1\times10^{15}$/cm$^2$. Accordingly, when the thickness of the silicide layer is set to 20 nm or less, the silicide does not penetrate the diffusion layer, so that a normal transistor operation is made possible. Thus, it is desirable that the CMOS peripheral circuit has a diffusion layer deeper than that of the memory cell and has a higher impurity concentration of the diffusion layer. However, in order to simplify the process, the diffusion layer of the p-type well 152 of the memory cell region may be formed deeply by implanting arsenic in a multi-stage manner, or a silicide layer may also be formed on a surface of the diffusion layer of the memory cell.

Incidentally, when arsenic is ion-implanted in the p-type well 152 of the memory cell, arsenic is also ion-implanted in a surface of the gate electrode 421 (p-type polysilicon film 410p), so that a pn junction is formed in the gate electrode 421 of the memory cell when the concentration of arsenic becomes high. Accordingly, it is desirable that the concentration of arsenic to be ion-implanted into the p-type well 152 of the memory cell region is made lower than that of arsenic to be ion-implanted into the p-type well 152 on the peripheral circuit region.

Through the preceding steps, the n-type diffusion layers 424 (source and drain) of the memory cell are formed in the p-type well 152 of the memory cell region. In addition, the n-type diffusion layers 415 (source and drain) of the n-MOS transistor are formed in the p-type well 152 on the peripheral circuit region and the p-type diffusion layers 416 (source and drain) of the p-type transistor are formed in the n-type well 151.

Figure 76:
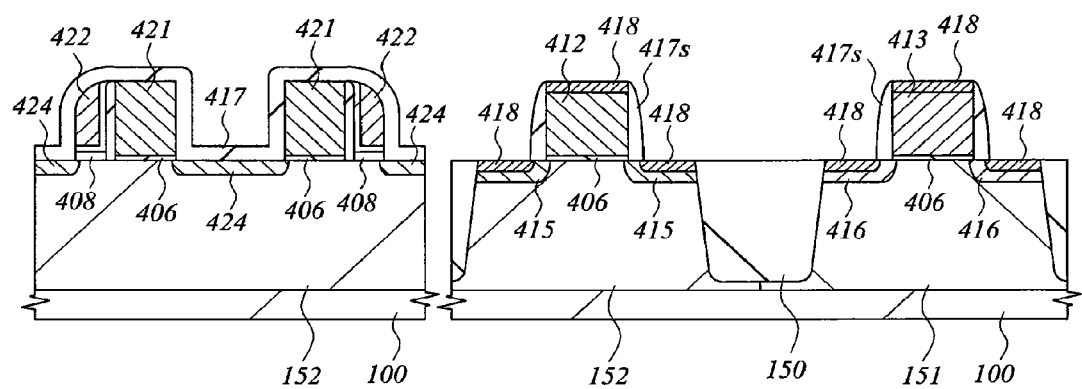
FIG. 76 is a sectional view showing a manufacturing method for the memory cell and the peripheral circuit continued from FIG. 75.

Next, as shown in FIG. 76, a silicon oxide film 417 with a film thickness of about 50 to 100 nm is deposited and side wall spacers 417s are then formed on side walls of the gate electrodes 412 and 413 by dry-etching the silicon oxide film 417 on the peripheral circuit region. Thereafter, silicide layers 418 made of Co silicide are formed on respective surfaces of the gate electrodes 412 and 413, the n-type diffusion layer 415, and the p-type diffusion layer 416 of the CMOS peripheral circuit.

Thus, the n-type diffusion layer 415 and the p-type diffusion layer 416 of the CMOS peripheral circuit are formed deeper than the n-type diffusion layer 424 of the memory cell, whereby the silicide layer 418 can be prevented from penetrating them. Therefore, a memory cell realizing a hole injection from a gate at a high efficiency and a CMOS peripheral circuit realizing a high-speed operation can be manufactured on the same silicon substrate 100.

Twelfth Embodiment

In the present embodiment, a manufacturing method of forming a split gate type memory cell and a CMOS peripheral circuit as shown in the eighth embodiment on the same silicon substrate will be explained.

Figure 77:
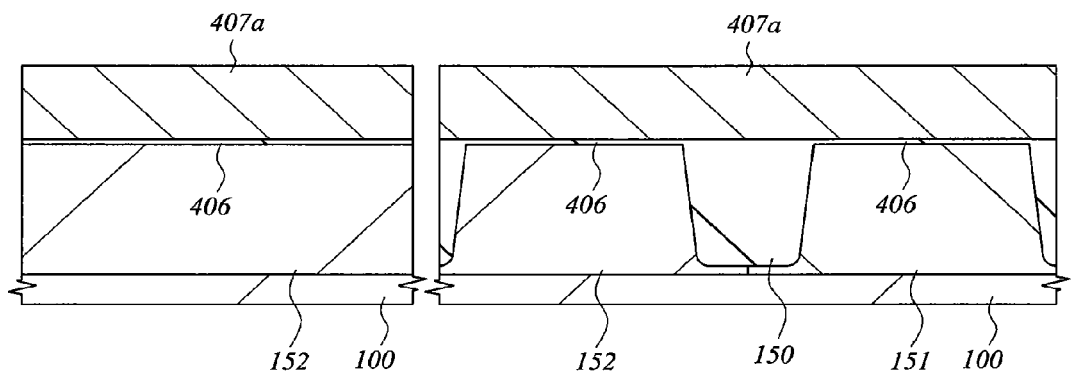
FIG. 77 is a sectional view showing a manufacturing method for a memory cell and a peripheral circuit of a twelfth embodiment.

As shown in FIG. 77, first, after a gate oxide film 406 with a film thickness of about 3 nm is formed on a surface of a silicon substrate 100 on which a device isolation region 150, an n-type well 151, and a p-type well 152 are formed, a non-doped polysilicon film 407a with a film thickness of about 150 nm is then deposited on the gate oxide film 406.

Figure 78:
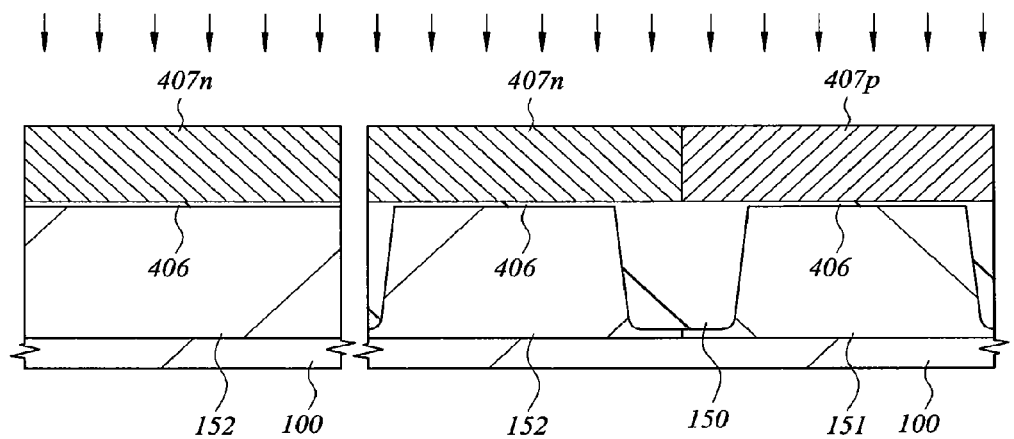
FIG. 78 is a sectional view showing a manufacturing method for the memory cell and the peripheral circuit continued from FIG. 77.

Next, as shown in FIG. 78, phosphorus is ion-implanted into the non-doped polysilicon film 407a on a memory cell region and the non-doped polysilicon film 407a on an n-MOS transistor formation region to form n-type polysilicon films 407n, and boron is ion-implanted into the non-doped polysilicon film 407a on a p-MOS formation region to form a p-type polysilicon film 407p. The implantation energy of phosphorus is set to about 10 KeV and the dose amount thereof is set to about $6\times10^{15}$/cm$^2$. The implantation energy of boron is set to about 5 KeV and the dose amount thereof is set to about $4\times10^{15}$/cm$^2$.

Figure 79:
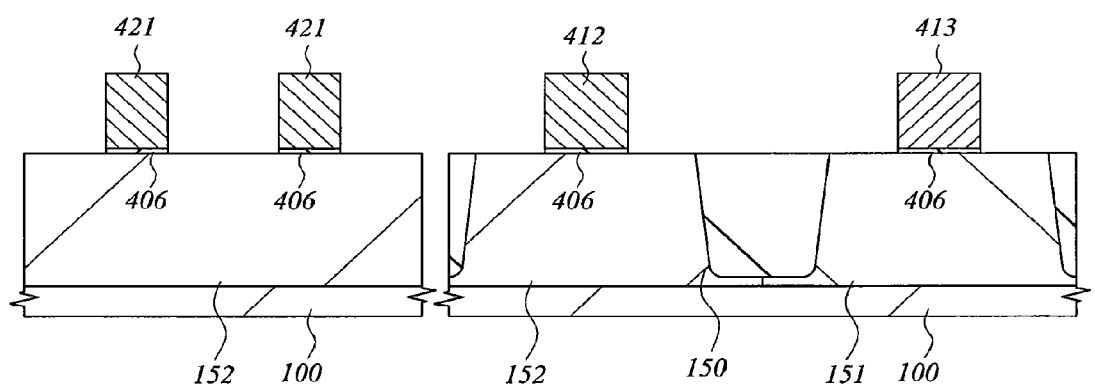
FIG. 79 is a sectional view showing a manufacturing method for the memory cell and the peripheral circuit continued from FIG. 78.

Next, as shown in FIG. 79, a selection gate 421 is formed by patterning the n-type polysilicon film 407n and the gate oxide film 406 on the memory cell region. Then, a gate electrode 412 of the n-MOS transistor and a gate electrode 413 of the p-MOS transistor are formed by patterning the n-type polysilicon film 407n, the p-type polysilicon film 407p, and the gate oxide film 406 on the peripheral circuit region.

Figure 80:
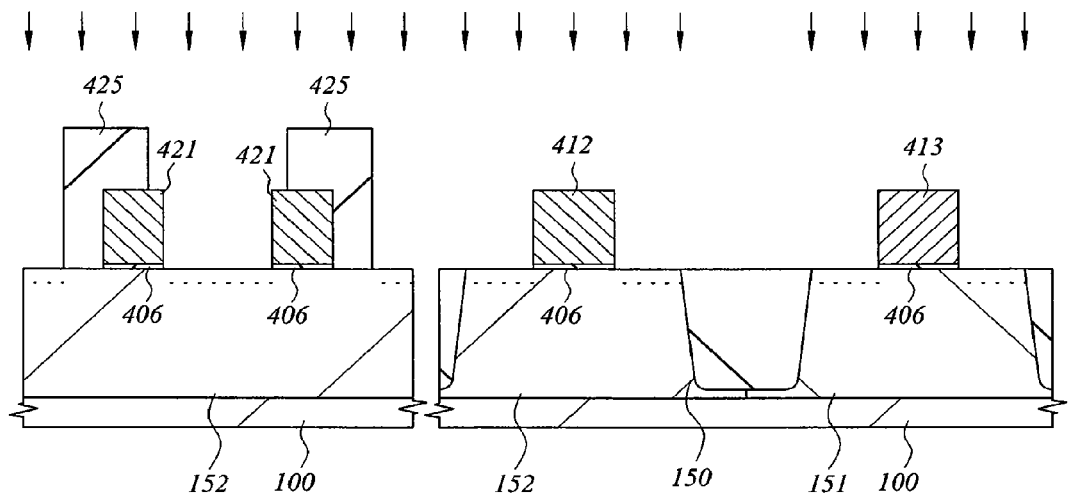
FIG. 80 is a sectional view showing a manufacturing method for the memory cell and the peripheral circuit continued from FIG. 79.

Next, as shown in FIG. 80, arsenic is ion-implanted into the p-type well 152 and boron is ion-implanted into the n-type well 151. The implantation energy of arsenic is set to about 40 KeV and the dose amount thereof is set to about $4\times10^{15}$/cm$^2$. The implantation energy of boron is set to about 10 KeV and the dose amount thereof is set to about $2\times10^{15}$/cm$^2$. At this time, a region where a memory gate is formed at a later step is covered with a photoresist film 425.

Figure 81:
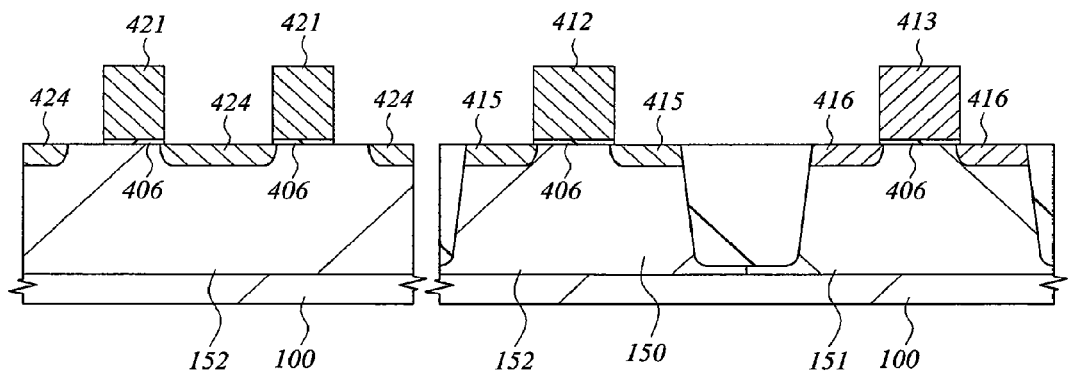
FIG. 81 is a sectional view showing a manufacturing method for the memory cell and the peripheral circuit continued from FIG. 80.

Next, activation treatment for the above-mentioned impurities is performed by RTA. Thereby, n-type diffusion layers 424 (source and drain) of the memory cell are formed in the p-type well 152 on the memory cell region, as shown in FIG. 81. Also, the n-type diffusion layers 415 (source and drain) of the n-MOS transistor are formed in the p-type well 152 on the peripheral circuit region, and p-type diffusion layers 416 (source and drain) of the p-MOS transistor are formed in the n-type well 151.

Figure 82:
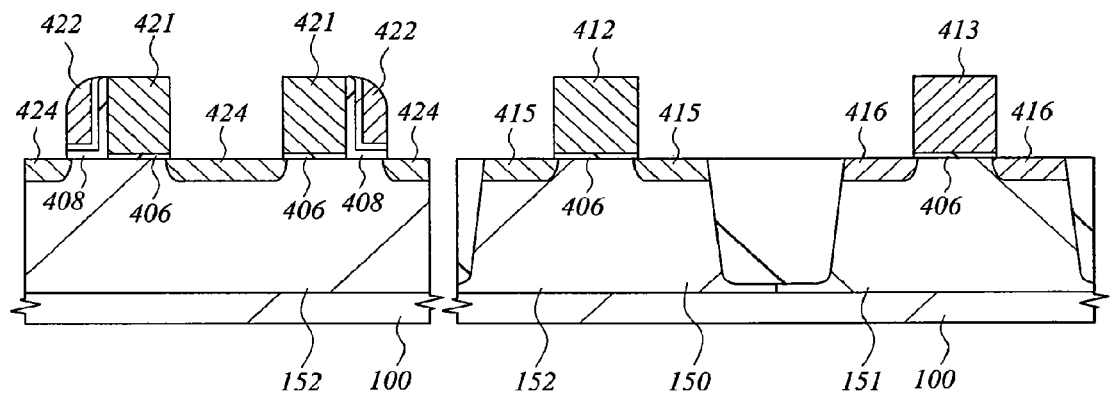
FIG. 82 is a sectional view showing a manufacturing method for the memory cell and the peripheral circuit continued from FIG. 81.
Figure 83:
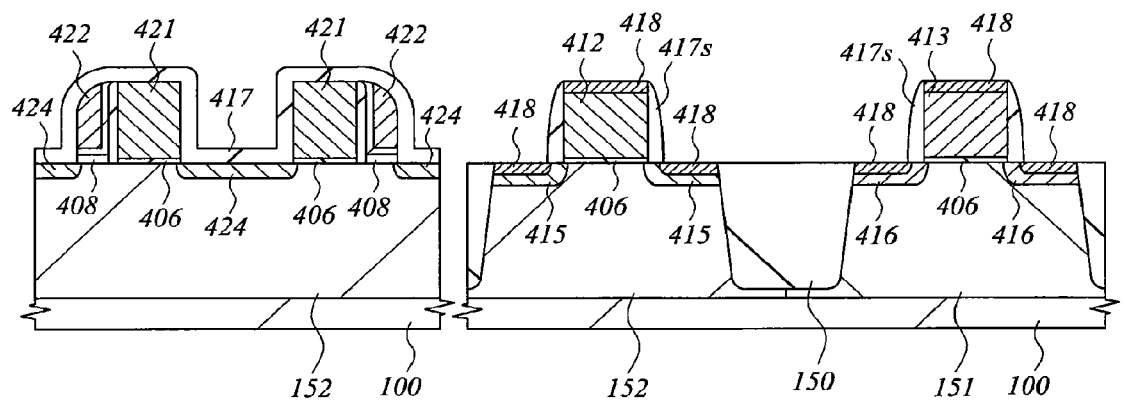
FIG. 83 is a sectional view showing a manufacturing method for the memory cell and the peripheral circuit continued from FIG. 82.

Next, as shown in FIG. 82, after a spacer-like memory gate 422 is formed by following the steps shown in FIG. 68 to FIG. 72 in the eleventh embodiment, as shown in FIG. 83, silicide layers 418 are formed on respective surfaces of the gate electrodes 412 and 413, the n-type diffusion layer 415, and the p-type diffusion layer 416 of the CMOS peripheral circuit by following the step shown in FIG. 76.

Thus, by forming the n-type diffusion layer 415 and the p-type diffusion layer 416 of the CMOS peripheral circuit deeply, the silicide layer 418 can be prevented from penetrating. Therefore, a memory cell realizing a hole injection from a gate at a high efficiency and a CMOS peripheral circuit realizing a high-speed operation can be manufactured on the same silicon substrate 100.

According to the present embodiment, since the n-type diffusion layer 424 of the memory cell is formed before the memory gate 422 is formed, even if the impurity concentration of the n-type diffusion layer 424 is made high, no pn junction is formed in the memory gate 422. Accordingly, it is also made possible to form a silicide layer 418 on the surface of the n-type diffusion layer 424.

Thirteenth Embodiment

In the tenth embodiment and the twelfth embodiment, impurities are introduced into the non-doped polysilicon film 407a for a gate electrode on the CMOS peripheral circuit prior to the step of forming the gate insulating film 408 including a charge accumulation layer and a barrier film.

In the step of forming the gate insulating film 408, there is a process of performing high temperature treatment such as anneal in NO atmosphere in order to improve reliability of films. However, when the high temperature treatment is performed, there is a possibility that n-type impurities and p-type impurities in the non-doped polysilicon film 407a are thermally diffused and locally mixed. In the present embodiment, therefore, a manufacturing method which can prevent such a drawback will be explained. Here, an example of a one-transistor type (NROM type) memory cell will be explained.

Figure 84:
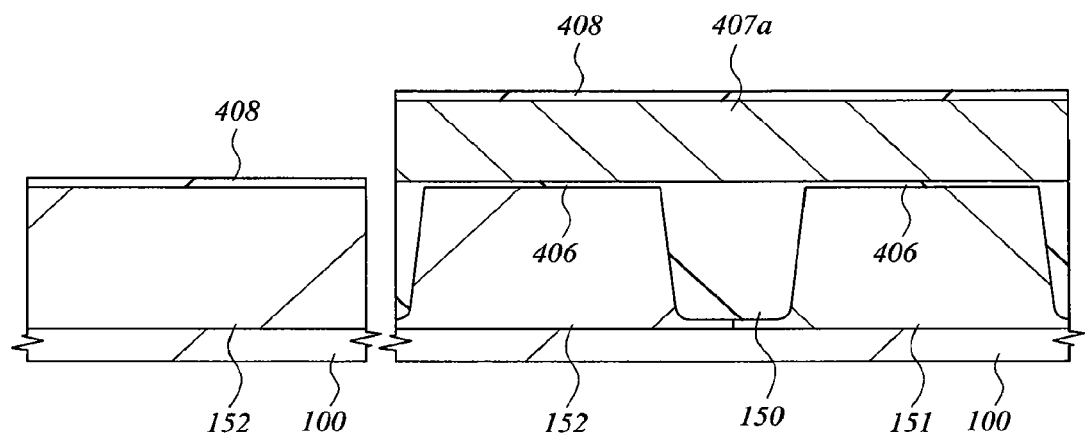
FIG. 84 is a sectional view showing a manufacturing method for a memory cell and a peripheral circuit of a thirteenth embodiment.

As shown in FIG. 84, first, a gate oxide film 406 with a film thickness of about 3 nm is formed on a surface of a silicon substrate 100 in which a device isolation region 150, an n-type well 151, and a p-type well 152 are formed. Then, a non-doped polysilicon film 407a with a film thickness of about 150 nm is deposited on the gate oxide film 406. After that, the non-doped polysilicon film 407a and the gate oxide film 406 on a memory cell region are removed. Next, a gate insulating film 408 is formed. The gate insulating film 408 is, for example, a laminated film comprising a silicon oxide film with a film thickness of 4 nm, a silicon oxide film with a film thickness of 5 nm, and a silicon oxynitride film with a film thickness of 5 nm. But it may be made of other materials such as shown in the ninth and tenth embodiments.

Figure 85:
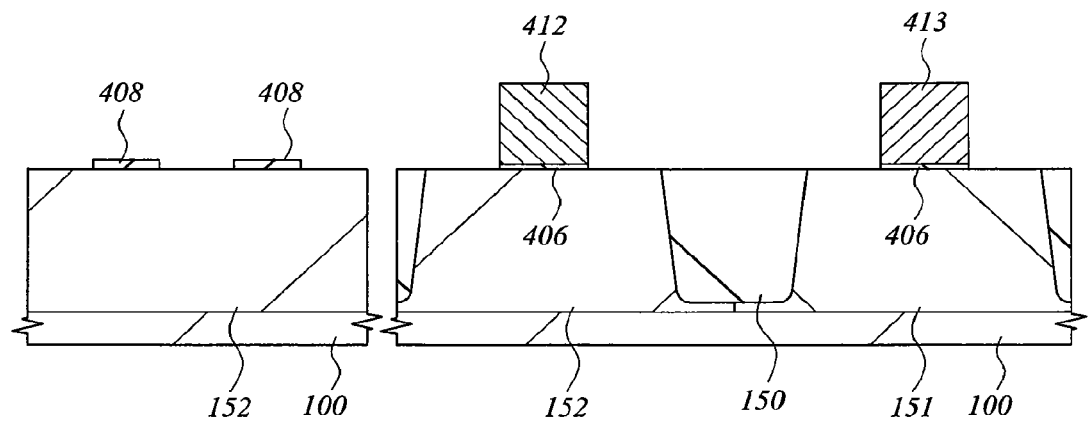
FIG. 85 is a sectional view showing a manufacturing method for the memory cell and the peripheral circuit continued from FIG. 84.

Next, as shown in FIG. 85, the gate insulating film 408 on the peripheral circuit region is removed and the gate insulating film 408 on the memory cell region is patterned so that the gate insulating film 408 is left on a region where a gate electrode (411) for the memory cell is formed at a later step. Subsequently, phosphorus is ion-implanted into the non-doped polysilicon film 407a on the n-MOS transistor formation region to form an n-type polysilicon film 407n and boron is ion-implanted into the non-doped polysilicon film 407a in the p-MOS transistor formation region to form a p-type polysilicon film 407p by following the steps shown in FIG. 54 and FIG. 55 in the ninth embodiment. The implantation energy of phosphorus is set to about 10 KeV and the dose amount thereof is set to about $6 \times 10^{15}/cm^2$. The implantation energy of boron is set to about 5 KeV and the dose amount thereof is set to about $4 \times 10^{15}/cm^2$.

Next, a gate electrode 412 of the n-MOS transistor and a gate electrode 413 of the p-MOS transistor are formed by patterning the n-type polysilicon film 407n, the p-type polysilicon film 407p, and the gate oxide film 406 by dry etching.

Figure 86:
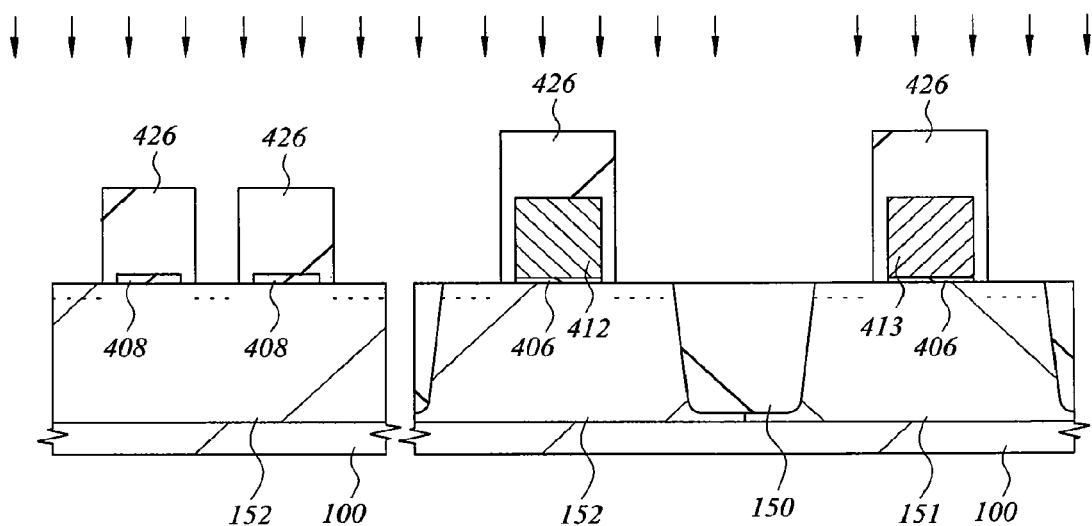
FIG. 86 is a sectional view showing a manufacturing method for the memory cell and the peripheral circuit continued from FIG. 85.

Next, as shown in FIG. 86, the gate insulating film 408, the gate electrodes 412 and 413, and their periphery are covered with photoresist films 426, respectively. Then, arsenic is ion-implanted into the p-type well 152, and boron is ion-implanted into the n-type well 151. The implantation energy of arsenic is set to about 40 KeV and the dose amount thereof is set to about $4 \times 10^{15}/cm^2$. The implantation energy of boron is set to about 10 KeV and the dose amount thereof is set to about $2 \times 10^{15}/cm^2$. A region to be ion-implanted with these impurities is a region where a silicide layer (18) is formed at a later step.

Figure 87:
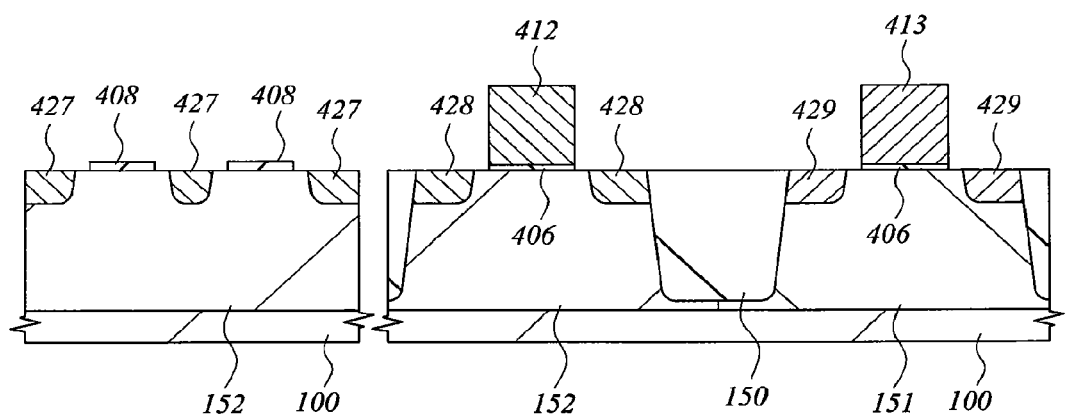
FIG. 87 is a sectional view showing a manufacturing method for the memory cell and the peripheral circuit continued from FIG. 86.

Next, as shown in FIG. 87, activation treatment of the impurities is performed by RTA. Thereby, deep n-type diffusion layers 427 (source and drain) are formed in the p-type well 152 on the memory region. Also, deep n-type diffusion layers 428 (source and drain) are formed in the p-type well 152 on the peripheral circuit region and deep p-type diffusion layers 429 (source and drain) are formed in the n-type well 151.

Figure 88:
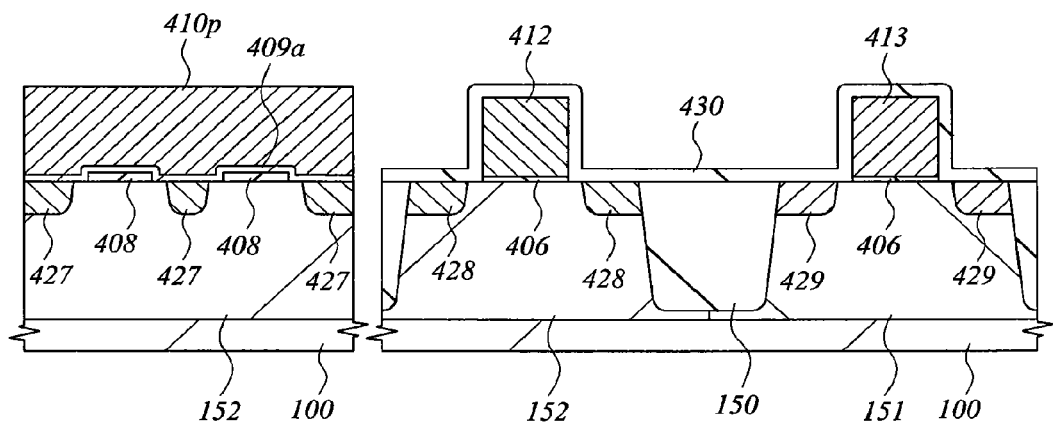
FIG. 88 is a sectional view showing a manufacturing method for the memory cell and the peripheral circuit continued from FIG. 87.

Next, as shown in FIG. 88, after an insulating film 430 with a film thickness of about 50 to 100 nm is deposited, the insulating film 430 on the memory region is removed. The insulating film 430 is a protective film for protecting the peripheral circuit region when the memory cell region is processed at the next step. The insulating film 430 comprises, for example, a silicon oxide film, a laminated film made of a silicon oxide film and a polysilicon film, or a laminated film made of a silicon oxide film and a silicon nitride film.

Next, a non-doped amorphous film 409a or an amorphous silicon film 409a with a low impurity concentration is deposited. Then, thermal treatment is performed at a temperature of 900° C. for about 30 minutes in $N_2$ atmosphere. Thereafter, a p-type polysilicon film 410p with a film thickness of 150 nm is deposited on the amorphous silicon film 409a. It is desirable that the impurity concentration of the amorphous silicon film 409a is one digit lower than that of the p-type polysilicon film 410p like the ninth embodiment. It is also desirable that the film thickness of the amorphous silicon film 409a is 6 nm or less. Next, the p-type polysilicon film 410p and the amorphous silicon film 409a on the peripheral circuit region are removed.

Figure 89:
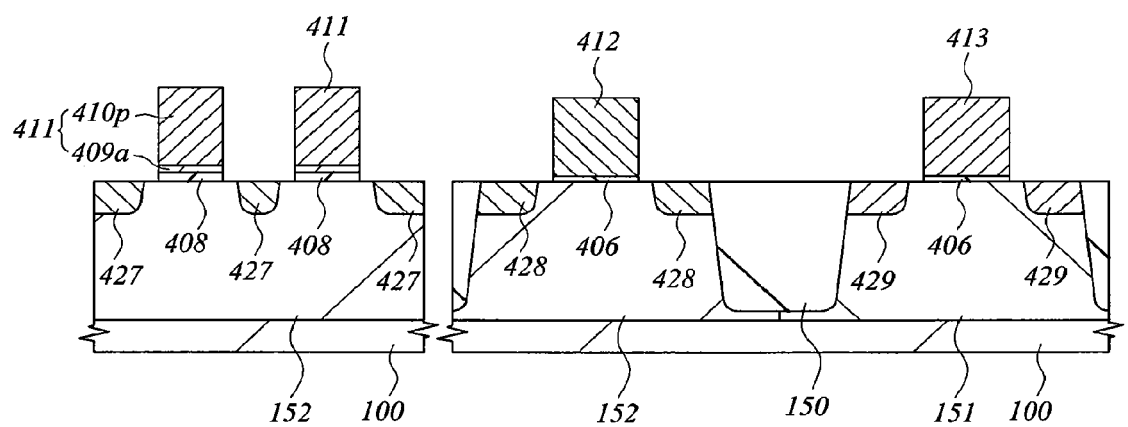
FIG. 89 is a sectional view showing a manufacturing method for the memory cell and the peripheral circuit continued from FIG. 88.

Next, as shown in FIG. 89, a gate electrode 411 for the memory cell comprising a laminated film made of an amorphous silicon film 409a and a p-type polysilicon film 410p is formed by patterning the p-type polysilicon film 410p and the amorphous silicon film 409a on the memory cell region. Subsequently, the insulating film 430 on the peripheral circuit region is removed.

Figure 90:
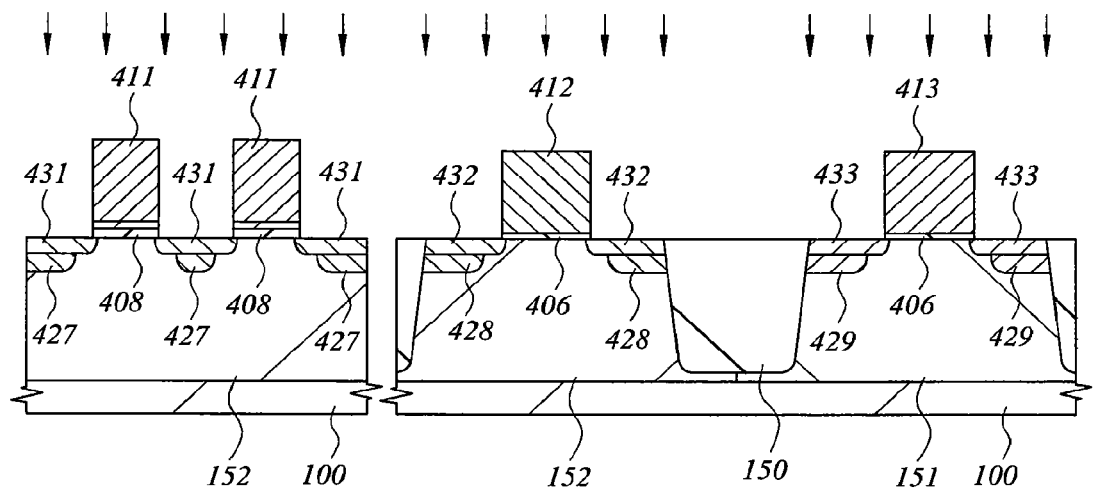
FIG. 90 is a sectional view showing a manufacturing method for the memory cell and the peripheral circuit continued from FIG. 89.

Next, as shown in FIG. 90, after arsenic is ion-implanted into a p-type well 152 on the memory cell region and p-type well 152 on the peripheral circuit region, and boron is ion-implanted into the n-type well 151 on the peripheral circuit region in order to form respective diffusion layers of the memory cell, the n-MOS transistor, and the p-MOS transistor, these impurities are activated, for example, by laser anneal at a temperature of 1200° C. for 800 µsec.

By doing this, an n-type diffusion layer 431 of the memory cell is formed in the p-type well 152 on the memory cell region. An n-type diffusion layer 432 of the n-MOS transistor is formed in the p-type well 152 on the peripheral circuit region and a p-type diffusion layer 433 of the p-MOS transistor is formed in the n-type well 151.

Figure 91:
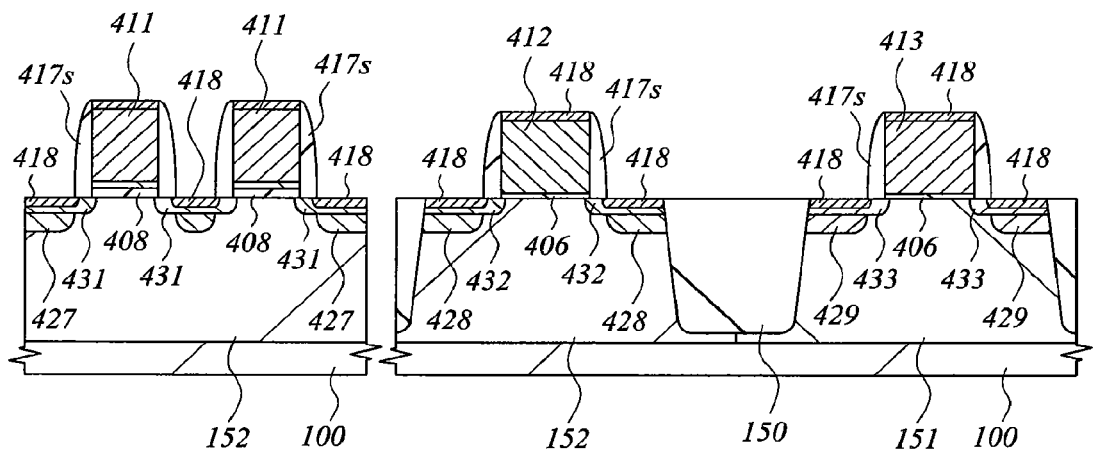
FIG. 91 is a sectional view showing a manufacturing method for the memory cell and the peripheral circuit continued from FIG. 90.

Next, as shown in FIG. 91, a silicon oxide film (not shown) with a film thickness of about 50 to 100 nm is deposited and side wall spacers 417s are then formed on respective side walls of the gate electrodes 411, 412, and 413 by dry-etching the silicon oxide film. Thereafter, silicide films 418 made of Co silicide are formed on respective surfaces of the gate electrodes 411, 412, and 413, the n-type diffusion layers 431 and 432, and the p-type diffusion layer 433.

Thus, according to the manufacturing method of the present embodiment, since impurities are introduced into the non-doped polysilicon film 407a for a gate electrode on the CMOS peripheral circuit after the gate insulating film 408 is formed, such a drawback can be prevented that n-type impurities and p-type impurities in the non-doped polysilicon film 407a are thermally diffused and mixed.

According to the manufacturing method of the present embodiment, by performing the activation process by laser anneal at the step shown in FIG. 90 after ion-implantation of impurities, shallow diffusion layers (431, 432, 433) functioning as extension layers of the source and the drain can be formed.

Fourteenth Embodiment

In the thirteenth embodiment, the example of a one-transistor type memory cell (NROM type) has been explained. Then, in the present embodiment, an example of a split gate type memory cell will be explained.

Figure 92:
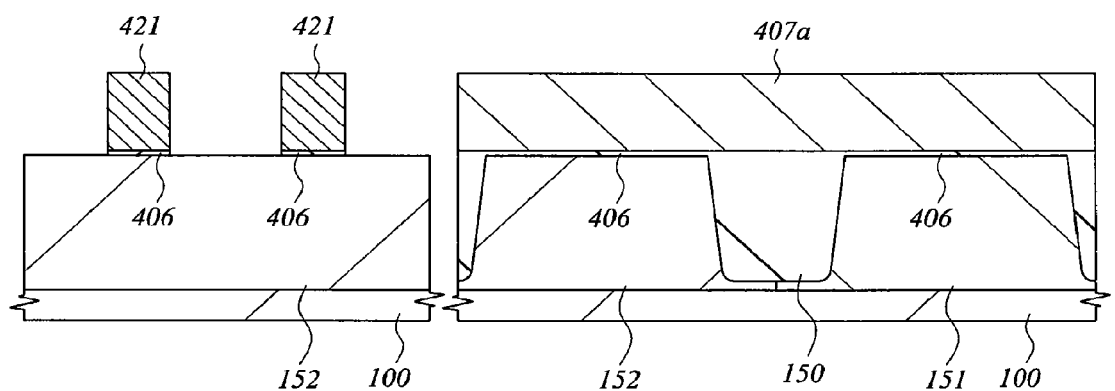
FIG. 92 is a sectional view showing a manufacturing method of a memory cell and a peripheral circuit of a fourteenth embodiment.

As shown in FIG. 92, first, a gate oxide film 406 with a film thickness of about 3 nm is formed on a surface of a silicon substrate 100 in which a device isolation region 150, an n-type well 151, and a p-type well 152 are formed. A non-doped polysilicon film 407a with a film thickness of about 150 nm is then deposited on the gate oxide film 406. Thereafter, phosphorus is ion-implanted into the non-doped polysilicon film 407a on the memory cell region to form an n-type polysilicon film 407n. The implantation energy of phosphorus is set to about 10 KeV and the dose amount thereof is set to about $6 \times 10^{15}/cm^2$.

Next, a selection gate 421 is formed by patterning the n-type polysilicon film 407n and the gate oxide film 406 on the memory region.

Figure 93:
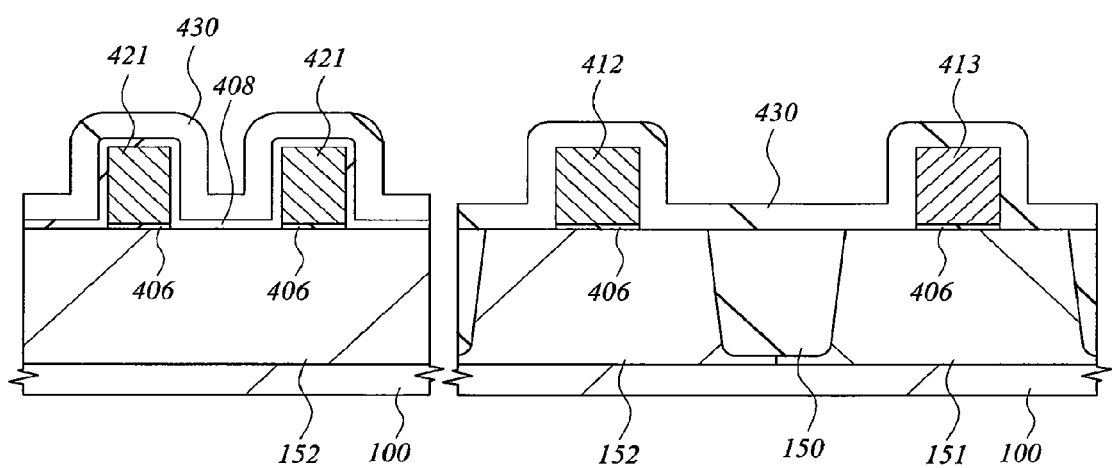
FIG. 93 is a sectional view showing a manufacturing method for the memory cell and the peripheral circuit continued from FIG. 92.

Next, as shown in FIG. 93, a gate insulating film 408 of the memory cell having a charge accumulation portion and a barrier film is deposited. The gate insulating film 408 is, for example, a laminated film comprising a silicon oxide film with a film thickness of 4 nm, a silicon oxide film with a film thickness of 5 nm, and a silicon oxynitride film with a film thickness of 5 nm. In addition, it may be made of other materials as shown in the ninth and tenth embodiments.

Next, after the gate insulating film 408 on the peripheral circuit region is removed, phosphorus is ion-implanted into the non-doped polysilicon film 407a on the n-MOS transistor formation region to form an n-type polysilicon film and boron is ion-implanted into the non-doped polysilicon film 407a on the p-MOS transistor formation region to form a p-type polysilicon film. The implantation energy of phosphorus is set to about 10 KeV and the dose amount thereof is set to about $6 \times 10^{15}/cm^2$. The implantation energy of boron is set to about 5 KeV and the dose amount thereof is set to about $4 \times 10^{15}/cm^2$.

Next, a gate electrode 412 of the n-MOS transistor and a gate electrode 413 of the p-MOS transistor are formed by patterning the n-type polysilicon film, the p-type polysilicon film, and the gate oxide film 406 by dry-etching. Next, an insulating film 430 with a film thickness of about 50 to 100 nm is deposited. The insulating film 430 comprises, for example, a silicon oxide film, a laminated film made of a silicon oxide film and a polysilicon film, and a laminated film made of a silicon oxide film and a silicon nitride film.

Figure 94:
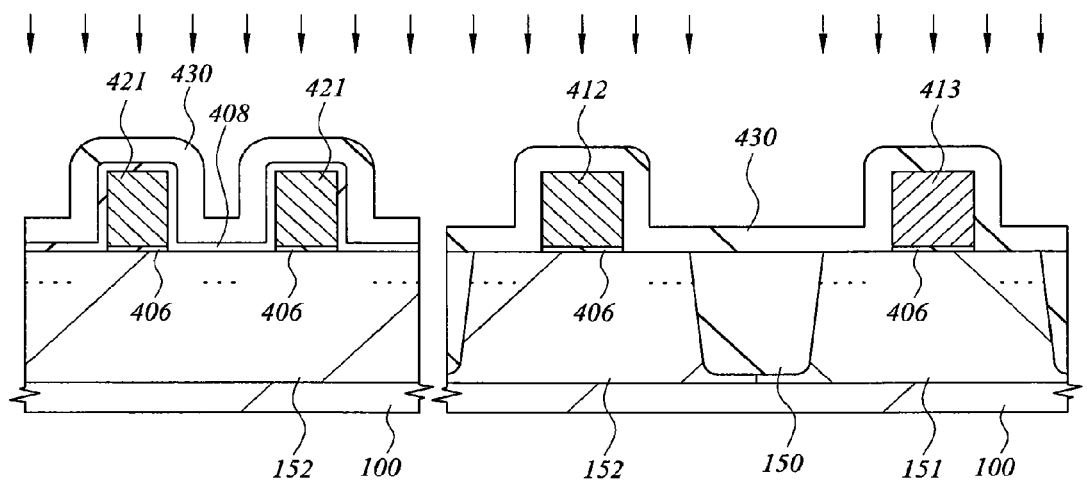
FIG. 94 is a sectional view showing a manufacturing method for the memory cell and the peripheral circuit continued from FIG. 93.

Next, as shown in FIG. 94, arsenic is ion-implanted into the p-type well 152 and boron is ion-implanted into the n-type well 151. Since impurities must be introduced into the wells through the insulating film 430, these ion-implantations are conducted with implantation energy higher than the implantation energy shown in the ninth to thirteenth embodiments. Ion-implantation may be performed after spacer-like insulating films 430 are left in a space-like shape on side walls of the gate electrodes (421, 412, 413) by etching the insulating films 430 in advance.

Figure 95:
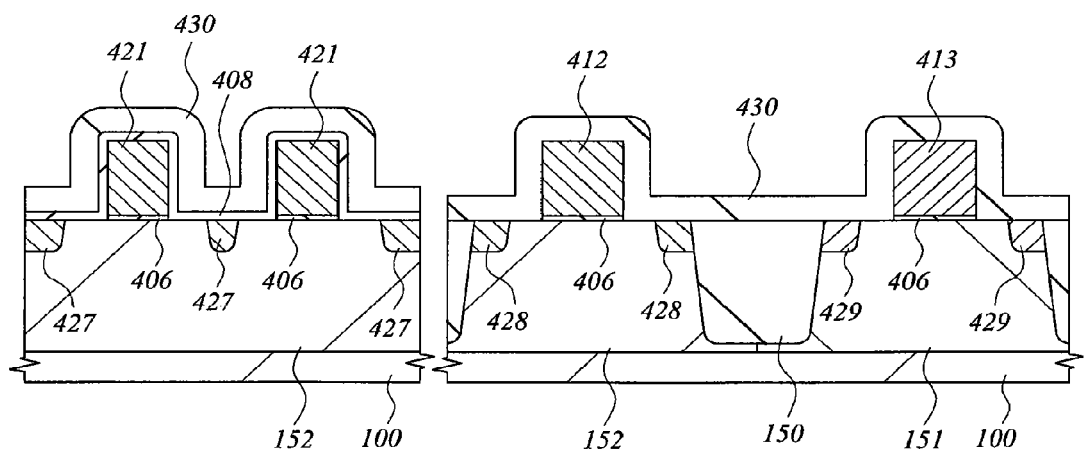
FIG. 95 is a sectional view showing a manufacturing method for the memory cell and the peripheral circuit continued from FIG. 94.

Next, an activation process of the impurities is performed by RTA, whereby, as shown in FIG. 95, deep n-type diffusion layers 427 (source and drain) are formed in the p-type wall 152 on the memory region. Also, deep n-type diffusion layers 428 (source and drain) are formed in the p-type well 152 on the peripheral circuit region and deep p-type diffusion layers 429 (source and drain) are formed in the n-type well 151.

Figure 96:
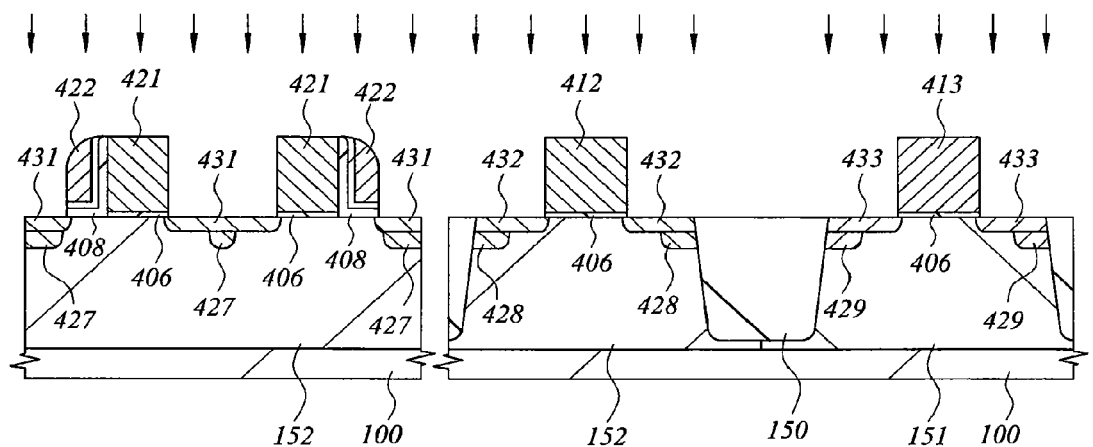
FIG. 96 is a sectional view showing a manufacturing method for the memory cell and the peripheral circuit continued from FIG. 95.

Next, after the insulating film 430 on the memory cell region is removed, as shown in FIG. 96, a spacer-like memory gate 422 is formed by following the steps shown in FIG. 68 to FIG. 72 regarding the eleventh embodiment. In these steps, a film deposited on the peripheral circuit region is removed by using a conventional cleaning process, as needed.

Next, in order to form respective diffusion layers of the memory cell, the n-MOS transistor, and the p-MOS transistor, arsenic is ion-implanted into a p-type well 152 on the memory cell region and a p-type well 152 on the peripheral circuit region and boron is ion-implanted into the n-type well 151 on the peripheral circuit region, and then, these impurities are activated, for example, by laser anneal at a temperature of 1200° C. for 800 μsec.

By doing this, an n-type diffusion layer 431 of the memory cell is formed in the p-type well 152 on the memory cell region. An n-type diffusion layer 432 of the n-MOS transistor is formed in the p-type well 152 on the peripheral circuit region and a p-type diffusion layer 433 of the p-MOS transistor is formed in the n-type well 151.

Figure 97:
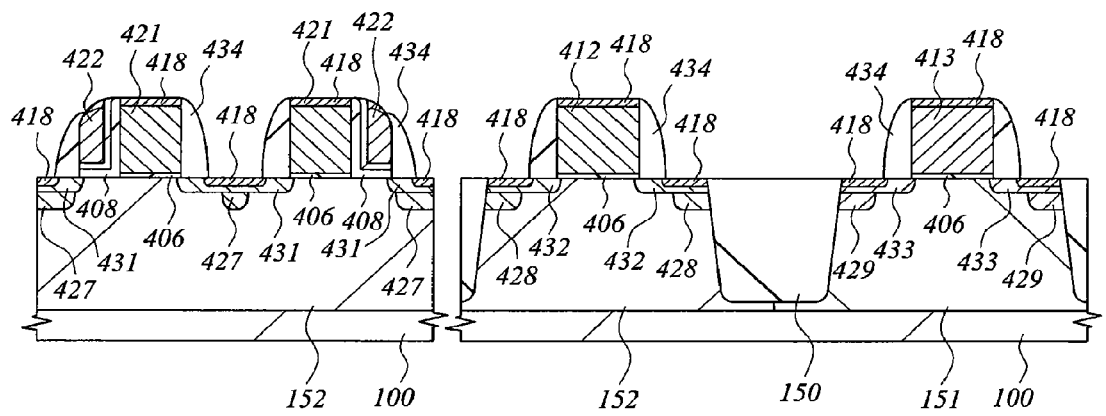
FIG. 97 is a sectional view showing a manufacturing method for the memory cell and the peripheral circuit continued from FIG. 96.

Next, as shown in FIG. 97, after a silicon oxide film (not shown) with a film thickness of about 50 to 100 nm is deposited and side wall spacers 434 are then formed on respective side walls of the gate electrodes (421, 422, 412, 413) by dry-etching the silicon oxide film, silicide films 418 made of Co silicide or other materials are formed on respective surfaces of the gate electrodes (421, 422, 412, 413), the n-type diffusion layers 431 and 432, and the p-type diffusion layers 433.

Thus, according to the manufacturing method in the embodiment, since impurities are introduced into the non-doped polysilicon film 407a for a gate electrode on the CMOS peripheral circuit after forming the gate insulating film 408, such a drawback can be prevented that n-type impurities and p-type impurities in the non-doped polysilicon film 407a are thermally diffused and mixed.

According to the manufacturing method of the embodiment, since the activation process is performed by laser anneal after the ion-implantation of impurities, shallow diffusion layers (431, 432, 433) serving as extension layers for the source and the drain can be formed.

On the peripheral circuit region, impurities for formation of a diffusion layer may be ion-implanted before the gate insulating film 408 is deposited. At this time, an extension can be formed on the peripheral circuit region by a multi-stage implantation in which after impurities are once ion-implanted, other impurities are ion-implanted once again after a side wall is formed.

Fifteenth Embodiment

The embodiments described above have realized memory cells having a laminated structure comprising a p-type polysilicon film and a non-doped polysilicon film or comprising a p-type polysilicon film and a polysilicon film with a lower impurity concentration than that of the p-type polysilicon film in order to inject holes from a gate at a high efficiency.

As described above, there are advantages, that is, a hole injection causes less damage to an interface between a substrate and an insulating film compared to a hot hole junction from a substrate; suppression of fluctuation in threshold can be achieved because of non-local injection, in which the fluctuation is caused by redistribution of charges in a charge accumulation layer after injecting the charges; a wider difference in threshold between a writing state and an erasing state can be realized by a bipolar operation system injecting electrons from a gate and also holes from a substrate compared to, for example, a unipolar operation system injecting only electrons into a charge accumulation layer and withdrawing them therefrom. Especially, since holes are largely injected and a threshold is reduced at an erasing time, a large read current can be obtained at a read time, whereby a whole module including a memory can operate at a high speed.

Naturally, a writing and erasing operation system by unipolar carriers, using only electrons, may be adopted depending on applications. The laminated gate electrode according to the present invention is useful for this operation system. In this case, as the laminated structure, a laminated structure made of a non-doped polysilicon film and n+ type polysilicon film, or made of a non-doped polysilicon film and a polysilicon film with a low impurity concentration is adopted.

It is desirable that the film thickness of the non-doped polysilicon film or the polysilicon film with a low impurity concentration is 6 nm or less like the embodiments previously described. Even if the film thickness is more than 6 nm, an effect can be obtained, but when the film thickness is excessively thick, depletion of a gate at a read time is grown, so that read characteristics is degraded. It is also desirable that the polysilicon film with a low impurity concentration is one or more orders of magnitude lower than the n-type polysilicon film laminated thereon. Besides, the manufacturing method for a single body of a memory cell and a manufacturing in consideration of matching a peripheral circuit are as described in the above-mentioned embodiment. At this time, a advantage in the present structure lies in that, for example, when n-type impurities are ion-implanted into a diffusion layer on a memory cell portion, such a problem that a gate portion becomes a pn junction, which is described as a problem in the above-mentioned embodiments, does not occur because a gate electrode is also an n-type polysilicon film.

Since a potential barrier of an insulating film to electrons is lower than that to holes, writing and erasing operations that electrons are injected into a charge accumulation layer from a gate by applying a negative voltage to the gate and electrons are withdrawn to the gate by applying a positive voltage to the gate can be performed in this structure at a high efficiency. Especially, when electrons are injected from the gate, since a voltage is applied to a non-doped polysilicon film or a polysilicon film with a low impurity concentration in a gate like the case that holes are injected in the above-mentioned embodiments, a potential barrier of an insulating film viewed from electrons in the gate becomes lower effectively, so that electrons can be injected at a high efficiency. Since the present operation is not a charge injection system using hot electrons and hot holes from a substrate, damage to an insulating film on a substrate side can be suppressed, so that excellent characteristic can be obtained at a read time and a charge retention time. When further speed-up at a write time is required, an operation that a hot electron injection from a substrate is performed and electrons are withdrawn to a gate can be performed in the present structure.

The invention invented by the present inventors has been concretely explained according to the embodiments, but the present invention is not limited to the above-mentioned embodiments, and needless to say, it can be variously modified without departing from the gist of the present invention.

The present invention can be applied to a semiconductor storage device having a non-volatile memory.

What is claimed is:

1. A semiconductor device comprising:
   (a) a semiconductor substrate;
   (b) a first gate insulating film formed over the semiconductor substrate;
   (c) a first gate electrode formed over the first gate insulating film;
   (d) a second gate insulating film formed over the semiconductor substrate and over a side wall of the first gate electrode, the second gate insulating film including a charge accumulation portion;
   (e) a second gate electrode formed over the second gate insulating film adjacent to the first gate electrode through the second gate insulating film;
   (f) a well region formed in the semiconductor substrate, the well region including p-type impurities;
   (g) a first semiconductor region formed in the well region under one side of the first gate electrode, the first semiconductor region including n-type impurities; and
   (h) a second semiconductor region formed in the well region under one side of the second gate electrode, the second semiconductor region including n-type impurities,
   wherein the first gate electrode includes n-type impurities,
   wherein the second gate electrode is formed of a first silicon film having p-type impurities,
   wherein the first silicon film includes an upper portion and a lower portion located between the upper portion and the second gate insulating film,
   wherein a first p-type impurity concentration of the upper portion of the first silicon film is higher than a second p-type impurity concentration of the lower portion of the first silicon film, and
   wherein holes are injected into the charge accumulation portion from the second gate electrode.

2. A semiconductor device comprising:
   (a) a semiconductor substrate;
   (b) a first gate insulating film formed over the semiconductor substrate, the first gate insulating film including a charge accumulation portion;
   (c) a first gate electrode formed over the first gate insulating film;
   (d) a well region formed in the semiconductor substrate, the well region including p-type impurities; and
   (e) a first semiconductor region formed in the well region under one side of the first gate electrode, the first semiconductor region including n-type impurities,
   wherein the first gate electrode is formed of a first silicon film having p-type impurities,
   wherein the first silicon film includes an upper portion and a lower portion located between the upper portion and the first gate insulating film,
   wherein a first p-type impurity concentration of the upper portion of the first silicon film is higher than a second p-type impurity concentration of the lower portion of the first silicon film,
   wherein holes are injected into the charge accumulation portion from the first gate electrode.

3. The semiconductor device according to claim 1, wherein electrons are injected into the charge accumulation portion from the well region formed in the semiconductor substrate.

4. The semiconductor device according to claim 2, wherein electrons are injected into the charge accumulation portion from the well region formed in the semiconductor substrate.

5. A semiconductor device comprising:
   (a) a semiconductor substrate;
   (b) a first gate insulating film formed over the semiconductor substrate;
   (c) a first gate electrode formed over the first gate insulating film;
   (d) a second gate insulating film formed over the semiconductor substrate and over a side wall of the first gate electrode, the second gate insulating film including a charge accumulation portion;
   (e) a second gate electrode formed over the second gate insulating film adjacent to the first gate electrode through the second gate insulating film;
   (f) a well region formed in the semiconductor substrate, the well region including p-type impurities;

(g) a first semiconductor region formed in the well region under one side of the first gate electrode, the first semiconductor region including n-type impurities; and (h) a second semiconductor region formed in the well region under one side of the second gate electrode, the second semiconductor region including n-type impurities, wherein the first gate electrode includes n-type impurities, wherein the second gate electrode comprises a first silicon film having p-type impurities formed over the second insulating film and a second silicon film having p-type impurities formed over the first silicon film, wherein the p-type impurity concentration of the second silicon film is higher than the p-type impurity concentration of the first silicon film, and wherein holes are injected into the charge accumulation portion from the second gate electrode.

6. A semiconductor device comprising:

(a) a semiconductor substrate;

(b) a first gate insulating film formed over the semiconductor substrate, the first gate insulating film including a charge accumulation portion;

(c) a first gate electrode formed over the first gate insulating film;

(d) a well region formed in the semiconductor substrate, the well region including p-type impurities; and (e) a first semiconductor region formed in the well region under one side of the first gate electrode, the first semiconductor region including n-type impurities, wherein the first gate electrode comprises a first silicon film having p-type impurities formed over the first insulating film and a second silicon film having p-type impurities formed over the first silicon film, wherein the p-type impurity concentration of the second silicon film is higher than the p-type impurity concentration of the first silicon film, and wherein holes are injected into the charge accumulation portion from the first gate electrode.

7. The semiconductor device according to claim 5, wherein an insulating film is formed between the first silicon film and the second silicon film.

8. The semiconductor device according to claim 6, wherein an insulating film is formed between the first silicon film and the second silicon film.

9. The semiconductor device according to claim 1, wherein the lower portion of the first silicon film comprises a non-doped polysilicon.

10. The semiconductor device according to claim 2, wherein the lower portion of the first silicon film comprises a non-doped polysilicon.

11. The semiconductor device according to claim 1, wherein the charge accumulation portion includes a silicon nitride film.

12. The semiconductor device according to claim 2, wherein the charge accumulation portion includes a silicon nitride film.

13. The semiconductor device according to claim 11, wherein the second gate insulating film includes a first insulating film formed over the semiconductor substrate, the silicon nitride film formed over the first insulating film and a second insulating film formed over the silicon nitride film.

14. The semiconductor device according to claim 12, wherein the first gate insulating film includes a first insulating film formed over the semiconductor substrate, the silicon nitride film formed over the first insulating film and a second insulating film formed over the silicon nitride film.

15. The semiconductor device according to claim 1, wherein the second p-type impurity concentration is one or more orders of magnitude lower than the first p-type impurity concentration.

16. The semiconductor device according to claim 2, wherein the second p-type impurity concentration is one or more orders of magnitude lower than the first p-type impurity concentration.

17. The semiconductor device according to claim 5, wherein the second silicon film is thicker than the first silicon film.

18. The semiconductor device according to claim 6, wherein the second silicon film is thicker than the first silicon film.

19. The semiconductor device according to claim 1, wherein the second electrode is in a form of a side wall.

20. The semiconductor device according to claim 5, wherein the charge accumulation portion includes a silicon nitride film, and wherein the second gate insulating film includes a first insulating film formed over the semiconductor substrate, the silicon nitride film formed over the first insulating film and a second insulating film formed over the silicon nitride film.

21. The semiconductor device according to claim 6, wherein the charge accumulation portion includes a silicon nitride film, and wherein the first gate insulating film includes a first insulating film formed over the semiconductor substrate, the silicon nitride film formed over the first insulating film and a second insulating film formed over the silicon nitride film.

22. The semiconductor device according to claim 1, wherein the charge accumulation portion includes a silicon nitride layer, and wherein the second gate insulating film further includes:
 a silicon oxide layer formed between the first silicon film and the silicon nitride layer, and
 a silicon oxynitride layer formed between the silicon oxide layer and the silicon nitride layer.

23. The semiconductor device according to claim 2, wherein the charge accumulation portion includes a silicon nitride layer, and wherein the first gate insulating film further includes:
 a silicon oxide layer formed between the upper portion of the first silicon film and the silicon nitride layer, and
 a silicon oxynitride layer formed between the silicon oxide layer and the silicon nitride layer.

24. The semiconductor device according to claim 5, wherein the charge accumulation portion includes a silicon nitride layer, and wherein the second gate insulating film includes:
 a silicon oxide layer formed between the second silicon film and the silicon nitride layer, and
 a silicon oxynitride layer formed between the silicon oxide layer and the silicon nitride layer.

25. The semiconductor device according to claim 6, wherein the charge accumulation portion includes a silicon nitride layer, and wherein the first gate insulating film includes:
 a silicon oxide layer formed between the second silicon film and the silicon nitride layer, and a silicon oxynitride layer formed between the silicon oxide layer and the silicon nitride layer.

* * * * *